US 8,724,079 B2

(12) United States Patent
Shibazaki

(10) Patent No.: US 8,724,079 B2
(45) Date of Patent: May 13, 2014

(54) STAGE DRIVE METHOD AND STAGE UNIT, EXPOSURE APPARATUS, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 824 days.

(21) Appl. No.: 12/923,783

(22) Filed: Oct. 7, 2010

(65) Prior Publication Data
US 2011/0058149 A1 Mar. 10, 2011

Related U.S. Application Data

(62) Division of application No. 11/785,860, filed on Apr. 20, 2007, now Pat. No. 8,045,136, which is a division of application No. 10/588,029, filed as application No. PCT/JP2005/001076 on Jan. 27, 2005, now Pat. No. 7,589,822.

(30) Foreign Application Priority Data

Feb. 2, 2004 (JP) .................................. 2004-025837
Oct. 14, 2004 (JP) .................................. 2004-300566

(51) Int. Cl.
| G03B 27/42 | (2006.01) |
| G03B 27/52 | (2006.01) |
| G03F 7/20 | (2006.01) |

(52) U.S. Cl.
CPC .................................. G03F 7/70341 (2013.01)
USPC .............................................. 355/53; 355/30

(58) Field of Classification Search
CPC ............ G03F 7/70341; G03F 7/70725; G03F 7/70733
USPC ...................... 355/30, 53, 55, 67, 72; 250/548
See application file for complete search history.

(56) References Cited

U.S. PATENT DOCUMENTS

| 3,648,587 A | 3/1972 | Stevens |
| 4,026,653 A | 5/1977 | Appelbaum et al. |

(Continued)

FOREIGN PATENT DOCUMENTS

| DE | 221 563 A1 | 9/1983 |
| DE | 224 448 A1 | 7/1985 |

(Continued)

OTHER PUBLICATIONS

Mar. 19, 2013 Office Action issued in Taiwanese Patent Application No. 098146230 (with translation).

(Continued)

*Primary Examiner* — Hung Henry Nguyen
(74) *Attorney, Agent, or Firm* — Oliff PLC

(57) ABSTRACT

When a transition from a first state where one stage is positioned at a first area directly below projection optical system to which liquid is supplied to a state where the other stage-is positioned at the first area, both stages are simultaneously driven while a state where both stages are close together in the X-axis direction is maintained. Therefore, it becomes possible to make a transition from the first state to the second state in a state where liquid is supplied in the space between the projection optical system and the specific stage directly under the projection optical system. Accordingly, the time from the completion of exposure operation on one stage side until the exposure operation begins on the other stage side can be reduced, which allows processing with high throughput. Further, because the liquid can constantly exist on the image plane side of the projection optical system, generation of water marks on optical members of the projection optical system on the image plane side is prevented.

81 Claims, 25 Drawing Sheets

(56) References Cited

U.S. PATENT DOCUMENTS

| | | |
|---|---|---|
| 4,341,164 A | 7/1982 | Johnson |
| 4,346,164 A | 8/1982 | Tabarelli et al. |
| 4,465,368 A | 8/1984 | Matsuura et al. |
| 4,480,910 A | 11/1984 | Takanashi et al. |
| 4,509,852 A | 4/1985 | Tabarelli et al. |
| 4,650,983 A | 3/1987 | Suwa |
| 4,780,617 A | 10/1988 | Umatate et al. |
| RE32,795 E | 12/1988 | Matsuura et al. |
| 5,121,256 A | 6/1992 | Corle et al. |
| 5,243,195 A | 9/1993 | Nishi |
| 5,448,332 A | 9/1995 | Sakakibara et al. |
| 5,528,100 A | 6/1996 | Igeta et al. |
| 5,528,118 A | 6/1996 | Lee |
| 5,534,970 A | 7/1996 | Nakashima et al. |
| 5,591,958 A | 1/1997 | Nishi et al. |
| 5,610,683 A | 3/1997 | Takahashi |
| 5,611,452 A | 3/1997 | Bonora et al. |
| 5,623,853 A | 4/1997 | Novak et al. |
| 5,636,066 A | 6/1997 | Takahashi |
| 5,646,413 A | 7/1997 | Nishi |
| 5,650,840 A * | 7/1997 | Taniguchi ............... 355/55 |
| 5,668,672 A | 9/1997 | Oomura |
| 5,677,758 A | 10/1997 | McEachern et al. |
| 5,689,377 A | 11/1997 | Takahashi |
| 5,691,802 A | 11/1997 | Takahashi |
| 5,693,439 A | 12/1997 | Tanaka et al. |
| 5,715,039 A | 2/1998 | Fukuda et al. |
| 5,744,924 A | 4/1998 | Lee |
| 5,805,334 A | 9/1998 | Takahashi |
| 5,815,246 A | 9/1998 | Sperling et al. |
| 5,825,043 A | 10/1998 | Suwa |
| 5,835,275 A | 11/1998 | Takahashi et al. |
| 5,844,247 A | 12/1998 | Nishi |
| 5,861,997 A | 1/1999 | Takahashi |
| 5,874,820 A | 2/1999 | Lee |
| 5,900,354 A | 5/1999 | Batchelder |
| 5,942,871 A | 8/1999 | Lee |
| 5,964,441 A | 10/1999 | Gauger et al. |
| 5,969,441 A | 10/1999 | Loopstra et al. |
| 5,982,128 A | 11/1999 | Lee |
| 5,999,333 A | 12/1999 | Takahashi |
| 6,008,500 A | 12/1999 | Lee |
| 6,020,710 A | 2/2000 | Lee |
| 6,049,186 A | 4/2000 | Lee |
| 6,051,843 A | 4/2000 | Nishi |
| RE36,730 E | 6/2000 | Nishi |
| 6,087,797 A | 7/2000 | Lee |
| 6,137,561 A | 10/2000 | Imai |
| 6,150,787 A | 11/2000 | Lee |
| 6,151,105 A | 11/2000 | Lee |
| 6,175,404 B1 | 1/2001 | Lee |
| 6,188,195 B1 | 2/2001 | Lee |
| 6,208,407 B1 | 3/2001 | Loopstra |
| 6,246,202 B1 | 6/2001 | Lee |
| 6,262,796 B1 | 7/2001 | Loopstra et al. |
| RE37,309 E | 8/2001 | Nakashima et al. |
| 6,271,640 B1 | 8/2001 | Lee |
| 6,279,881 B1 | 8/2001 | Nishi |
| 6,281,654 B1 | 8/2001 | Lee |
| 6,316,901 B2 | 11/2001 | Lee |
| 6,331,885 B1 | 12/2001 | Nishi |
| 6,341,007 B1 | 1/2002 | Nishi et al. |
| 6,400,441 B1 | 6/2002 | Nishi et al. |
| 6,417,914 B1 | 7/2002 | Li |
| 6,426,790 B1 | 7/2002 | Hayashi |
| 6,433,872 B1 | 8/2002 | Nishi et al. |
| 6,445,441 B1 | 9/2002 | Mouri |
| 6,449,030 B1 | 9/2002 | Kwan |
| 6,496,257 B1 | 12/2002 | Taniguchi et al. |
| 6,498,352 B1 | 12/2002 | Nishi |
| 6,549,269 B1 | 4/2003 | Nishi et al. |
| 6,590,634 B1 | 7/2003 | Nishi et al. |
| 6,590,636 B2 * | 7/2003 | Nishi ............... 355/53 |
| 6,608,681 B2 | 8/2003 | Tanaka et al. |
| 6,665,054 B2 | 12/2003 | Inoue |
| 6,680,774 B1 | 1/2004 | Heinle |
| 6,683,433 B2 | 1/2004 | Lee |
| RE38,421 E | 2/2004 | Takahashi |
| RE38,438 E | 2/2004 | Takahashi |
| 6,747,732 B1 | 6/2004 | Lee |
| 6,771,350 B2 | 8/2004 | Nishinaga |
| 6,778,257 B2 | 8/2004 | Bleeker et al. |
| 6,788,385 B2 | 9/2004 | Tanaka et al. |
| 6,788,477 B2 | 9/2004 | Lin |
| 6,798,491 B2 | 9/2004 | Nishi et al. |
| 6,841,965 B2 | 1/2005 | Lee |
| 6,842,221 B1 | 1/2005 | Shiraishi |
| 6,853,443 B2 | 2/2005 | Nishi |
| 6,867,844 B2 | 3/2005 | Vogel et al. |
| 6,878,916 B2 | 4/2005 | Schuster |
| 6,891,596 B2 | 5/2005 | Rostalski et al. |
| 6,891,683 B2 | 5/2005 | Schuster |
| 6,897,963 B1 | 5/2005 | Taniguchi et al. |
| 6,906,782 B2 | 6/2005 | Nishi |
| 6,927,836 B2 | 8/2005 | Nishinaga |
| 6,927,840 B2 | 8/2005 | Lee |
| 6,952,253 B2 | 10/2005 | Lof et al. |
| 6,954,256 B2 | 10/2005 | Flagello et al. |
| 6,989,647 B1 | 1/2006 | Lee |
| RE39,024 E | 3/2006 | Takahashi |
| 7,009,682 B2 | 3/2006 | Bleeker |
| 7,038,760 B2 | 5/2006 | Mulkens et al. |
| 7,057,702 B2 | 6/2006 | Lof et al. |
| 7,075,616 B2 | 7/2006 | Derksen et al. |
| 7,081,943 B2 | 7/2006 | Lof et al. |
| 7,092,069 B2 | 8/2006 | Schuster |
| 7,098,991 B2 | 8/2006 | Nagasaka et al. |
| RE39,296 E | 9/2006 | Takahashi |
| 7,110,081 B2 | 9/2006 | Hoogendam et al. |
| 7,119,874 B2 | 10/2006 | Cox et al. |
| 7,119,876 B2 | 10/2006 | Van Der Toorn et al. |
| 7,119,881 B2 | 10/2006 | Bleeker |
| 7,154,676 B2 | 12/2006 | Schuster |
| 7,161,659 B2 | 1/2007 | Van Den Brink et al. |
| 7,177,008 B2 | 2/2007 | Nishi et al. |
| 7,190,527 B2 | 3/2007 | Rostalski et al. |
| 7,193,232 B2 | 3/2007 | Lof et al. |
| 7,199,858 B2 | 4/2007 | Lof et al. |
| 7,203,008 B2 | 4/2007 | Schuster |
| 7,213,963 B2 | 5/2007 | Lof et al. |
| 7,224,436 B2 | 5/2007 | Derksen et al. |
| 7,256,869 B2 | 8/2007 | Nishi |
| 7,312,847 B2 | 12/2007 | Rostalski et al. |
| 7,321,419 B2 | 1/2008 | Ebihara |
| RE40,043 E | 2/2008 | Kwan et al. |
| 7,327,435 B2 | 2/2008 | Binnard |
| 7,339,743 B2 | 3/2008 | Schuster |
| 7,352,434 B2 | 4/2008 | Streefkerk et al. |
| 7,365,513 B1 | 4/2008 | Lee |
| 7,372,538 B2 | 5/2008 | Binnard |
| 7,372,541 B2 | 5/2008 | Lof et al. |
| 7,379,158 B2 | 5/2008 | Mizutani et al. |
| 7,382,540 B2 | 6/2008 | Rostalski et al. |
| 7,388,648 B2 | 6/2008 | Lof et al. |
| 7,394,521 B2 | 7/2008 | Van Santen et al. |
| 7,399,978 B2 | 7/2008 | Van Santen et al. |
| 7,436,486 B2 | 10/2008 | Hirukawa |
| 7,436,487 B2 | 10/2008 | Mizutani et al. |
| 7,442,908 B2 | 10/2008 | Schuster |
| 7,446,851 B2 | 11/2008 | Hirukawa |
| 7,456,929 B2 | 11/2008 | Shinuta |
| 7,460,207 B2 | 12/2008 | Mizutani et al. |
| 7,482,611 B2 | 1/2009 | Lof et al. |
| 7,486,385 B2 | 2/2009 | Ebihara |
| 7,495,840 B2 | 2/2009 | Schuster |
| 7,505,111 B2 | 3/2009 | Hirukawa et al. |
| 7,514,699 B2 | 4/2009 | Neijzen et al. |
| 7,528,931 B2 | 5/2009 | Modderman |
| 7,545,479 B2 | 6/2009 | Binnard |
| 7,589,821 B2 | 9/2009 | Hirukawa |
| 7,589,822 B2 | 9/2009 | Shibazaki |
| 7,593,092 B2 | 9/2009 | Lof et al. |
| 7,593,093 B2 | 9/2009 | Lof et al. |
| 7,639,343 B2 | 12/2009 | Hirukawa |

(56) References Cited

U.S. PATENT DOCUMENTS

| | | |
|---|---|---|
| 8,027,027 B2 | 9/2011 | Ebihara |
| 8,045,136 B2 | 10/2011 | Shibazaki |
| 8,233,137 B2 | 7/2012 | Modderman |
| 2001/0004105 A1 | 6/2001 | Kwan et al. |
| 2001/0019250 A1 | 9/2001 | Lee |
| 2001/0030522 A1 | 10/2001 | Lee |
| 2002/0017889 A1 | 2/2002 | Lee |
| 2002/0018192 A1 | 2/2002 | Nishi |
| 2002/0020821 A1 | 2/2002 | Van Santen et al. |
| 2002/0041377 A1 | 4/2002 | Hagiwara et al. |
| 2002/0061469 A1 | 5/2002 | Tanaka |
| 2002/0163629 A1 | 11/2002 | Switkes et al. |
| 2002/0176082 A1 | 11/2002 | Sakakibara et al. |
| 2002/0196421 A1 | 12/2002 | Tanaka et al. |
| 2003/0025890 A1 | 2/2003 | Nishinaga |
| 2003/0030916 A1 | 2/2003 | Suenaga |
| 2003/0075871 A1 | 4/2003 | Shinozaki |
| 2003/0076482 A1 | 4/2003 | Inoue |
| 2003/0117596 A1 | 6/2003 | Nishi |
| 2003/0128348 A1 | 7/2003 | Nishi |
| 2003/0174408 A1 | 9/2003 | Rostalski et al. |
| 2004/0000627 A1 | 1/2004 | Schuster |
| 2004/0004757 A1 | 1/2004 | Schuster |
| 2004/0032575 A1 | 2/2004 | Nishi et al. |
| 2004/0039486 A1 | 2/2004 | Bacchi et al. |
| 2004/0075895 A1 | 4/2004 | Lin |
| 2004/0095085 A1 | 5/2004 | Lee |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0120051 A1 | 6/2004 | Schuster |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0233407 A1 | 11/2004 | Nishi et al. |
| 2004/0239904 A1 | 12/2004 | Nishinaga |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0002009 A1 | 1/2005 | Lee |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstrs et al. |
| 2005/0094125 A1 | 5/2005 | Arai |
| 2005/0100745 A1 | 5/2005 | Lin et al. |
| 2005/0106512 A1 | 5/2005 | Endo et al. |
| 2005/0110973 A1 | 5/2005 | Streefkerk et al. |
| 2005/0111108 A1 | 5/2005 | Schuster |
| 2005/0117134 A1 | 6/2005 | Nagasaka et al. |
| 2005/0117135 A1 | 6/2005 | Verhoeven et al. |
| 2005/0117224 A1 | 6/2005 | Shafer et al. |
| 2005/0122497 A1 | 6/2005 | Lyons et al. |
| 2005/0122505 A1 | 6/2005 | Miyajima |
| 2005/0128445 A1 | 6/2005 | Hoogendam et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0136361 A1 | 6/2005 | Endo et al. |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146693 A1 | 7/2005 | Ohsaki |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0174550 A1 | 8/2005 | Streefkerk et al. |
| 2005/0175776 A1 | 8/2005 | Streefkerk et al. |
| 2005/0175940 A1 | 8/2005 | Dierichs |
| 2005/0178944 A1 | 8/2005 | Schuster |
| 2005/0179877 A1 | 8/2005 | Mulkens et al. |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0231813 A1 | 10/2005 | Rostalski et al. |
| 2005/0231814 A1 | 10/2005 | Rostalski et al. |
| 2005/0233081 A1 | 10/2005 | Tokita |
| 2005/0237501 A1 | 10/2005 | Furukawa et al. |
| 2005/0243292 A1 | 11/2005 | Baselmans et al. |
| 2005/0245005 A1 | 11/2005 | Benson |
| 2005/0248856 A1 | 11/2005 | Omura et al. |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259234 A1 | 11/2005 | Hirukawa et al. |
| 2005/0259236 A1 | 11/2005 | Straaijer |
| 2005/0263068 A1 | 12/2005 | Hoogendam et al. |
| 2005/0264774 A1 | 12/2005 | Mizutani et al. |
| 2005/0264778 A1 | 12/2005 | Lof et al. |
| 2005/0270505 A1 | 12/2005 | Smith |
| 2006/0007419 A1 | 1/2006 | Streefkerk et al. |
| 2006/0023184 A1 | 2/2006 | Coon et al. |
| 2006/0023186 A1 | 2/2006 | Binnard |
| 2006/0023188 A1 | 2/2006 | Hara |
| 2006/0023189 A1 | 2/2006 | Lof et al. |

(56) References Cited

U.S. PATENT DOCUMENTS

| | | |
|---|---|---|
| 2006/0028632 A1 | 2/2006 | Hazelton et al. |
| 2006/0033899 A1 | 2/2006 | Hazelton et al. |
| 2006/0077367 A1 | 4/2006 | Kobayashi et al. |
| 2006/0082741 A1 | 4/2006 | Van Der Toorn et al. |
| 2006/0098180 A1 | 5/2006 | Bleeker |
| 2006/0103820 A1 | 5/2006 | Donders et al. |
| 2006/0114445 A1 | 6/2006 | Ebihara |
| 2006/0119820 A1 | 6/2006 | Hirukawa |
| 2006/0126037 A1 | 6/2006 | Jansen et al. |
| 2006/0126043 A1 | 6/2006 | Mizutani et al. |
| 2006/0126044 A1 | 6/2006 | Mizutani et al. |
| 2006/0132733 A1 | 6/2006 | Modderman |
| 2006/0132737 A1 | 6/2006 | Magome et al. |
| 2006/0132738 A1 | 6/2006 | Hirukawa |
| 2006/0132739 A1 | 6/2006 | Ebihara |
| 2006/0132740 A1 | 6/2006 | Ebihara |
| 2006/0152697 A1 | 7/2006 | Poon et al. |
| 2006/0158628 A1 | 7/2006 | Maria Liebregts et al. |
| 2006/0164615 A1 | 7/2006 | Hirukawa |
| 2006/0176458 A1 | 8/2006 | Maria Derksen et al. |
| 2006/0209414 A1 | 9/2006 | Van Santen et al. |
| 2006/0227308 A1 | 10/2006 | Brink et al. |
| 2006/0232756 A1 | 10/2006 | Lof et al. |
| 2006/0261288 A1 | 11/2006 | Van Santen |
| 2006/0268250 A1 | 11/2006 | Maria Derksen et al. |
| 2007/0019301 A1 | 1/2007 | Schuster |
| 2007/0040133 A1 | 2/2007 | Lof et al. |
| 2007/0064214 A1 | 3/2007 | Ebihara |
| 2007/0109515 A1 | 5/2007 | Nishi |
| 2007/0115447 A1 | 5/2007 | Hirukawa et al. |
| 2007/0115448 A1 | 5/2007 | Hirukawa et al. |
| 2007/0132970 A1 | 6/2007 | Lof et al. |
| 2007/0132971 A1 | 6/2007 | Sengers et al. |
| 2007/0132979 A1 | 6/2007 | Lof et al. |
| 2007/0188880 A1 | 8/2007 | Schuster |
| 2007/0195300 A1 | 8/2007 | Binnard |
| 2007/0211234 A1 | 9/2007 | Ebihara |
| 2007/0211235 A1 | 9/2007 | Shibazaki |
| 2007/0247722 A1 | 10/2007 | Rostalski et al. |
| 2007/0258064 A1 | 11/2007 | Hirukawa |
| 2007/0263196 A1 | 11/2007 | Hirukawa et al. |
| 2007/0268471 A1 | 11/2007 | Lof et al. |
| 2008/0002166 A1 | 1/2008 | Ebihara |
| 2008/0151203 A1 | 6/2008 | Hirukawa et al. |
| 2008/0180053 A1 | 7/2008 | Lee |
| 2008/0218717 A1 | 9/2008 | Streefkerk et al. |
| 2008/0218726 A1 | 9/2008 | Lof et al. |
| 2009/0002652 A1 | 1/2009 | Lof et al. |
| 2009/0015807 A1 | 1/2009 | Hirukawa et al. |
| 2009/0109413 A1 | 4/2009 | Shibazaki et al. |
| 2009/0184270 A1 | 7/2009 | Lof et al. |
| 2009/0190112 A1 | 7/2009 | Ebihara |
| 2009/0290135 A1 | 11/2009 | Lof et al. |
| 2011/0051104 A1 | 3/2011 | Shibazaki |
| 2011/0058149 A1 | 3/2011 | Shibazaki |
| 2013/0215403 A1 | 8/2013 | Ebihara |
| 2013/0229637 A1 | 9/2013 | Ebihara |
| 2013/0250257 A1 | 9/2013 | Ebihara |

FOREIGN PATENT DOCUMENTS

| | | |
|---|---|---|
| EP | 0 605 103 A1 | 7/1994 |
| EP | 0 834 773 A2 | 4/1998 |
| EP | 0 951 054 A1 | 10/1999 |
| EP | 1 041 357 A1 | 10/2000 |
| EP | 1 111 471 A2 | 6/2001 |
| EP | 1 126 510 A1 | 8/2001 |
| EP | 1 306 592 A2 | 5/2003 |
| EP | 1 420 299 A2 | 5/2004 |
| EP | 1 420 300 A2 | 5/2004 |
| EP | 1 494 267 A1 | 1/2005 |
| EP | 1 571 697 A1 | 9/2005 |
| EP | A 1 635 382 A1 | 3/2006 |
| EP | 1 713 113 A1 | 10/2006 |
| EP | 1 713 114 A1 | 10/2006 |
| JP | A-57-117238 | 7/1982 |
| JP | A 57-153433 | 9/1982 |
| JP | A 58-202448 | 11/1983 |
| JP | A 59-19912 | 2/1984 |
| JP | A-61-44429 | 3/1986 |
| JP | A 62-65326 | 3/1987 |
| JP | A-62-121417 | 6/1987 |
| JP | A 63-157419 | 6/1988 |
| JP | A-2-166717 | 6/1990 |
| JP | A 4-65603 | 3/1992 |
| JP | A 4-305915 | 10/1992 |
| JP | A 4-305917 | 10/1992 |
| JP | A-5-21314 | 1/1993 |
| JP | A 5-62877 | 3/1993 |
| JP | A-05-175098 | 7/1993 |
| JP | A-5-304072 | 11/1993 |
| JP | A 6-124873 | 5/1994 |
| JP | A-6-168866 | 6/1994 |
| JP | A-6-208058 | 7/1994 |
| JP | A-6-283403 | 10/1994 |
| JP | A-6-349701 | 12/1994 |
| JP | A-7-176468 | 7/1995 |
| JP | A 7-220990 | 8/1995 |
| JP | A-7-335748 | 12/1995 |
| JP | A 8-37149 | 2/1996 |
| JP | A-8-136475 | 5/1996 |
| JP | A-8-166475 | 6/1996 |
| JP | A-8-171054 | 7/1996 |
| JP | A-8-316125 | 11/1996 |
| JP | A-8-330224 | 12/1996 |
| JP | A-8-334695 | 12/1996 |
| JP | A-9-50954 | 2/1997 |
| JP | A-9-232213 | 9/1997 |
| JP | A-10-3039 | 1/1998 |
| JP | A-10-20195 | 1/1998 |
| JP | A-10-154659 | 6/1998 |
| JP | A-10-163098 | 6/1998 |
| JP | A-10-163099 | 6/1998 |
| JP | A-10-214783 | 8/1998 |
| JP | A-10-228661 | 8/1998 |
| JP | A-10-255319 | 9/1998 |
| JP | A 10-303114 | 11/1998 |
| JP | A 10-340846 | 12/1998 |
| JP | A-11-16816 | 1/1999 |
| JP | A-11-135400 | 5/1999 |
| JP | A 11-176727 | 7/1999 |
| JP | A 2000-58436 | 2/2000 |
| JP | A-2000-106340 | 4/2000 |
| JP | A-2000-505958 | 5/2000 |
| JP | A-2000-164504 | 6/2000 |
| JP | A 2000-164504 | 6/2000 |
| JP | A 2000-511704 | 9/2000 |
| JP | A-2001-91849 | 4/2001 |
| JP | A-2001-118773 | 4/2001 |
| JP | A-2001-223159 | 8/2001 |
| JP | B-3203719 | 8/2001 |
| JP | A-2001-241439 | 9/2001 |
| JP | A 2001-267239 | 9/2001 |
| JP | A-2001-313250 | 11/2001 |
| JP | A-2002-14005 | 1/2002 |
| JP | A-2002-134390 | 5/2002 |
| JP | A-2002-305140 | 10/2002 |
| JP | A-2003-17404 | 1/2003 |
| JP | A-2003-249443 | 9/2003 |
| JP | A-2004-165666 | 6/2004 |
| JP | A-2004-172621 | 6/2004 |
| JP | A-2004-193252 | 7/2004 |
| JP | A-2004-207696 | 7/2004 |
| JP | A-2004-289126 | 10/2004 |
| JP | A 2004-289128 | 10/2004 |
| JP | A-2004-349645 | 12/2004 |
| JP | A 2005-236087 | 9/2005 |
| JP | A 2005-259789 | 9/2005 |
| JP | A 2005-268700 | 9/2005 |
| JP | A 2005-268742 | 9/2005 |
| JP | A-2005-536775 | 12/2005 |
| JP | A-2006-509357 | 3/2006 |
| JP | B2-4315198 | 8/2009 |

(56) References Cited

FOREIGN PATENT DOCUMENTS

| WO | WO 98/24115 | 6/1998 |
| --- | --- | --- |
| WO | WO 98/28665 | 7/1998 |
| WO | WO 98/40791 | 9/1998 |
| WO | WO 98/59364 | 12/1998 |
| WO | WO 99/01797 | 1/1999 |
| WO | WO 99/23692 | 5/1999 |
| WO | WO 99/49504 | 9/1999 |
| WO | WO 01/35168 A1 | 5/2001 |
| WO | WO 01/84241 A1 | 11/2001 |
| WO | WO 02/084720 A2 | 10/2002 |
| WO | WO 02/091078 A1 | 11/2002 |
| WO | WO 03/077036 A1 | 9/2003 |
| WO | WO 03/077037 A1 | 9/2003 |
| WO | WO 03/085708 A1 | 10/2003 |
| WO | WO 2004/019128 A2 | 3/2004 |
| WO | WO 2004/053955 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/090956 A1 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/105107 A1 | 12/2004 |
| WO | WO 2004/114380 A1 | 12/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010611 A2 | 2/2005 |
| WO | WO 2005/010962 A1 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/048328 A1 | 5/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/062351 A1 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074014 A1 | 8/2005 |
| WO | WO 2005/074606 A2 | 8/2005 |
| WO | WO 2005/076084 A1 | 8/2005 |
| WO | WO 2005/076321 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Apr. 11, 2013 Office Action issued in U.S. Appl. No. 13/435,780.
Apr. 23, 2013 Office Action issued in Japanese Patent Application No. 2011-112549 (with translation).
Lin, B.J. "Semiconductor Foundry, Lithography, and Partners." Proceedings of SPIE, vol. 4688, pp. 11-24, 2002.
Switkes, M., et al. "Resolution Enhancement of 157nm Lithography by Liquid Immersion." Proceedings of SPIE, vol. 4691, pp. 459-465, 2002.
Switkes, M., et al. "Resolution Enhancement of 157nm Lithography by Liquid Immersion." J. Microlith., Microfab., Microsyst., vol. 1, No. 3, pp. 1-4, 2002.
Owa, Soichi, et al. "Nikon F2 Exposure Tool," slides 1-25, $3^{rd}$ 157nm Symposium, Sep. 4, 2002.
Owa, Soichi. "Immersion Lithography," slides 1-24, Immersion Lithography Workshop, Dec. 11, 2002.
Owa, Soichi, et al. "Immersion Lithography; its Potential Performance and Issues." Proceedings of SPIE, vol. 5040, pp. 724-733, 2003.
Owa, Soichi, et al. "Potential Performance and Feasibility of Immersion Lithography," slides 1-33, NGL Workshop 2003, Jul. 2003.
Owa, Soichi, et al. "Update on 193nm Immersion Exposure Tool," slides 1-38, Immersion Workshop 2004, Jan. 27, 2004.
Owa, Soichi, et al. "Update on 193nm Immersion Exposure Tool," slides 1-51, Litho Forum, Jan. 28, 2004.
Jun. 18, 2010 Notice of Allowance in U.S. Appl. No. 11/785,716.
Sep. 1, 2010 Notice of Allowance in U.S. Appl. No. 11/339,683.
Apr. 14, 2010 Office Action in Chinese Application No. 200810184648.3, with translation.
Aug. 10, 2010 Communication under Rule 71(3) EPC in European Application No. 05704182.4.
Mar. 24, 2010 U.S. Appl. No. 12/659,894.
"Ductile Mode Cutting of Optical Glass Using a Flying Tool by the Action of Hydrostatic Bearing", Apr. 14, 2003, http://martini.iis.u-tokyo.ac.jp/lab/ductile-j.html. (With Translation).
Mar. 20, 2006 Office Action in U.S. Appl. No. 11/237,721.
Jun. 14, 2007 Office Action in U.S. Appl. No. 11/237,721.
Dec. 20, 2007 Notice of Allowance in U.S. Appl. No. 11/237,721.
Mar. 20, 2006 Office Action in U.S. Appl. No. 11/259,061.
Nov. 24, 2006 Office Action in U.S. Appl. No. 11/259,061.
Jun. 11, 2007 Notice of Allowance in U.S. Appl. No. 11/259,061.
Sep. 6, 2007 Notice of Allowance in U.S. Appl. No. 11/259,061.
Jan. 9, 2009 Office Action in U.S. Appl. No. 11/882,837.
Aug. 18, 2008 Office Action in U.S. Appl. No. 11/785,539.
May 13, 2009 Office Action in U.S. Appl. No. 11/785,539.
May 27, 2009 Office Action in U.S. Appl. No. 11/812,925.
May 29, 2008 Office Action in U.S. Appl. No. 11/798,262.
Oct. 1, 2008 Notice of Allowance in U.S. Appl. No. 11/798,262.
Feb. 6, 2009 Notice of Allowance in U.S. Appl. No. 11/798,262.
Feb. 10, 2009 Office Action in U.S. Appl. No. 11/822,804.
Oct. 14, 2009 Office Action in U.S. Appl. No. 11/984,980.
Dec. 2, 2009 Office Action in U.S. Appl. No. 11/822,804.
Jan. 15, 2010 Notice of Allowance in U.S. Appl. No. 11/785,716.
Sep. 10, 2009 Notice of Allowance in U.S. Appl. No. 11/785,716.
Dec. 3, 2008 Office Action in U.S. Appl. No. 11/785,716.
Dec. 20, 2006 Office Action in U.S. Appl. No. 11/258,846.
Aug. 31, 2007 Notice of Allowance in U.S. Appl. No. 11/258,846.
Sep. 9, 2008 Office Action in U.S. Appl. No. 11/340,680.
Jun. 1, 2009 Office Action in U.S. Appl. No. 11/340,680.
Oct. 23, 2009 Office Action in U.S. Appl. No. 11/340,680.
Mar. 8, 2007 Office Action in U.S. Appl. No. 11/339,683.
Nov. 16, 2007 Office Action in U.S. Appl. No. 11/339,683.
Sep. 19, 2008 Office Action in U.S. Appl. No. 11/339,683.
May 27, 2009 Office Action in U.S. Appl. No. 11/339,683.
Nov. 6, 2009 Notice of Allowance in U.S. Appl. No. 11/339,683.
Sep. 25, 2008 Notice of Allowance in U.S. Appl. No. 11/602,371.
Nov. 18, 2008 Office Action in U.S. Appl. No. 11/889,733.
Aug. 28, 2009 Office Action in U.S. Appl. No. 11/889,733.

(56) References Cited

OTHER PUBLICATIONS

May 6, 2009 Office Action in U.S. Appl. No. 11/785,860.
Oct. 7, 2008 Office Action in U.S. Appl. No. 11/785,860.
Sep. 3, 2008 Office Action in U.S. Appl. No. 10/588,029.
May 5, 2009 Notice of Allowance in U.S. Appl. No. 10/588,029.
Dec. 7, 2009 Notice of Allowance in U.S. Appl. No. 11/785,860.
Sep. 9, 2009 Office Action in U.S. Appl. No. 11/812,919.
Dec. 9, 2009 Office Action in Japanese Application No. 2009-044470 and English Translation.
Apr. 25, 2008 Communication Pursuant to Art. 94(3) EPC in European Application No. 04 746 097.7.
Nov. 18, 2008 Communication Pursuant to Art. 94(3) EPC in European Application No. 04 746 097.7.
Sep. 7, 2007 Office Action in Chinese Application No. 200480015978 and English Translation.
Aug. 2, 2007 Communication Pursuant to Art. 94(3) EPC in European Application No. 05 704 182.4.
Sep. 12, 2008 Communication Pursuant to Art. 94(3) EPC in European Application No. 05 704 182.4.
Feb. 29, 2008 Written Opinion in Singapore Application No. 200605084-3.
Oct. 29, 2008 Office Action in Singapore Application No. 200605084-3.
Feb. 27, 2009 Office Action in Chinese Application No. 200480015978 and English Translation.
Sep. 1, 2008 Supplementary European Search Report for European Patent Application No. 04721260.0.
Dec. 19, 2007 Office Action in Indonesian Application No. W-00200502693 and English Translation.
May 10, 2009 Office Action in Israeli Patent Application No. 170735 and English Translation.
May 29, 2008 Search and Examination Report in Singapore Patent Application No. 200717576-3.
May 27, 2008 Search and Examination Report in Singapore Patent Application No. 200717561.5.
Sep. 5, 2008 Search and Examination Report in Singapore Patent Application No. 200717564-9.
Nov. 21, 2008 Invitation to Respond to Written Opinion in Singapore Patent Application No. 200717562-3.
Jan. 27, 2009 Office Action in Japanese Application No. 2006-506525 and English Translation.
Apr. 29, 2008 Office Action in Chinese Application No. 200580002269.2 and English Translation.
Feb. 26, 2009 Office Action in Chinese Application No. 200580002269.2 and English Translation.
Apr. 23, 2010 Notice of Allowance in U.S. Appl. No. 11/340,680.
Mar. 30, 2010 Notice of Allowance in U.S. Appl. No. 11/339,683.
Apr. 23, 2010 Office Action in U.S. Appl. No. 11/812,919.
Jan. 27, 2010 Office Action in U.S. Appl. No. 11/882,837.
Feb. 4, 2010 Office Action in U.S. Appl. No. 11/785,539.
Mar. 29, 2010 Office Action in U.S. Appl. No. 11/812,925.
May 14, 2010 Notice of Allowance in U.S. Appl. No. 11/984,980.
Feb. 20, 2007 Office Action in U.S. Appl. No. 11/147,285.
Nov. 16, 2007 Office Action in U.S. Appl. No. 11/147,285.
Aug. 7, 2008 Office Action in U.S. Appl. No. 11/147,285.
Jan. 22, 2009 Office Action in U.S. Appl. No. 11/147,285.
Nov. 3, 2009 Notice of Allowance in U.S. Appl. No. 11/147,285.
Feb. 24, 2010 Notice of Allowance in U.S. Appl. No. 11/147,285.
Aug. 2, 2007 Office Action in U.S. Appl. No. 11/356,000.
Apr. 29, 2008 Office Action in U.S. Appl. No. 11/655,083.
Jan. 15, 2009 Office Action in U.S. Appl. No. 11/655,083.
Aug. 7, 2009 Notice of Allowance in U.S. Appl. No. 11/655,083.
Oct. 1, 2008 Office Action in U.S. Appl. No. 11/822,807.
Jul. 28, 2009 Office Action in U.S. Appl. No. 11/822,807.
Mar. 3, 2010 Office Action in U.S. Appl. No. 11/822,807.
Apr. 28, 2009 Office Action in U.S. Appl. No. 12/010,824.
Dec. 14, 2009 Notice of Allowance in U.S. Appl. No. 12/010,824.
Mar. 23, 2010 Notice of Allowance in U.S. Appl. No. 12/010,824.
Oct. 10, 2006 Office Action in U.S. Appl. No. 11/338,826.
Jul. 5, 2007 Office Action in U.S. Appl. No. 11/338,826.
Nov. 16, 2007 Office Action in U.S. Appl. No. 11/338,826.
Jun. 27, 2008 Notice of Allowance in U.S. Appl. No. 11/338,826.
Feb. 20, 2007 Office Action in U.S. Appl. No. 11/339,505.
Nov. 5, 2007 Office Action in U.S. Appl. No. 11/339,505.
Jun. 9, 2008 Notice of Allowance in U.S. Appl. No. 11/339,505.
Jul. 19, 2007 Office Action in U.S. Appl. No. 11/656,550.
Apr. 17, 2008 Office Action in U.S. Appl. No. 11/656,550.
Nov. 12, 2008 Notice of Allowance in U.S. Appl. No. 11/656,550.
Aug. 29, 2008 Office Action in U.S. Appl. No. 11/878,076.
May 8, 2009 Notice of Allowance in U.S. Appl. No. 11/878,076.
May 14, 2008 Office Action in U.S. Appl. No. 11/665,273.
Jul. 25, 2008 Notice of Allowance in U.S. Appl. No. 11/665,273.
Mar. 2, 2010 Notice of Allowance in U.S. Appl. No. 11/785,716.
Jan. 28, 2010 Office Action in U.S. Appl. No. 11/889,733.
Mar. 11, 2010 Supplemental Notice of Allowance in U.S. Appl. No. 11/785,716.
Feb. 17, 2010 Supplemental Notice of Allowance in U.S. Appl. No. 11/785,716.
Dec. 9, 2009 Notice of Allowance in Japanese Application No. 2005-507235, with translation.
Mar. 30, 2010 Notice of Allowance in Japanese Application No. 2009-044470, with translation.
Oct. 5, 2004 International Search Report and Written Opinion in Application No. PCT/JP2004/008595, with translation.
Jul. 6, 2009 Communication Under Rule 71(3) in European Application No. 04746097.7.
Sep. 26, 2008 Notice of Allowance in Chinese Application No. 200480015978.X, with translation.
May 17, 2005 International Search Report and Written Opinion in Application No. PCT/JP2005/001076, with translation.
Mar. 29, 2007 Search Report in European Application No. 05704182.4.
Jun. 19, 2009 Notice of Allowance in Chinese Application No. 200580002269.2, with translation.
Dec. 13, 2009 Office Action in Israeli Application No. 177221, with translation.
Apr. 28, 2009 Notice of Allowance in Japanese Application No. 2006-506525, with translation.
Mar. 1, 2005 International Search Report and Written Opinion in Application No. PCT/IB04/01259.
Aug. 4, 2009 Austrian Examination Report in Singapore Application No. 200717562-3.
Jan. 5, 2007 Austrian Examination Report in Singapore Application No. 200505829-2.
Feb. 9, 2009 Office Action in Japanese Application No. 2004-558437, with translation.
Jul. 27, 2009 Notice of Allowance in Japanese Application No. 2004-558437, with translation.
Feb. 12, 2010 Office Action in Chinese Application No. 2008101751375, with translation.
Jan. 14, 2010 Office Action in Taiwanese Application No. 09920027510, with translation.
Jun. 5, 2007 Search Report in European Application No. 03777352.0.
Apr. 17, 2009 Office Action in European Application No. 03777352.0.
Mar. 2, 2007 Office Action in Chinese Application No. 200380105467.2, with translation.
Feb. 1, 2008 Office Action in Chinese Application No. 200380105467.2, with translation.
Aug. 15, 2008 Notice of Allowance in Chinese Application No. 200380105467.2, with translation.
Dec. 10, 2007 Austrian Invitation to Respond to Written Opinion in Singapore Application No. 200503619-9.
Oct. 9, 2008 Austrian Notice of Allowance in Singapore Application No. 200503619-9.
Oct. 15, 2008 Austrian Search and Examination Report in Singapore Application No. 200717564-9.
Dec. 18, 2008 Austrian Invitation to Respond to Written Opinion in Singapore Application No. 200717562-3.
Jul. 4, 2008 Australian Search and Examination Report in Singapore Application No. 200717561-5.
Jul. 2, 2008 Australian Search and Examination Report in Singapore Application No. 200717576-3.

(56) References Cited

OTHER PUBLICATIONS

Feb. 27, 2009 Office Action in Chinese Application No. 200480009702.0, with translation.
Jan. 4, 2008 Search Report in European Application No. 04746097.7.
Mar. 31, 2008 Australian Invitation to Respond to Written Opinion in Singapore Application No. 200605084-3.
Nov. 25, 2008 Australian Examination Report (Allowance) in Singapore Application No. 200605084-3.
May 16, 2008 Office Action in Chinese Application No. 200580002269.2, with translation.
Mar. 13, 2009 Office Action in Chinese Application No. 200580002269.2, with translation.
Apr. 6, 2004 International Search Report issued in International Application No. PCT/JP03/15675, with translation.
Aug. 3, 2010 Notice of Allowance in U.S. Appl. No. 11/147,285.
Jul. 7, 2010 Notice of Allowance in U.S. Appl. No. 11/785,860.
Oct. 7, 2010 Notice of Allowance in U.S. Appl. No. 11/984,980.
Oct. 4, 2010 Notice of Allowance in U.S. Appl. No. 11/785,860.
Sep. 9, 2010 Notice of Allowance in U.S. Appl. No. 11/340,680.
Oct. 21, 2010 Notice of Allowance in U.S. Appl. No. 11/785,716.
Mar. 10, 2010 Notice of Allowance in U.S. Appl. No. 11/785,860.
Oct. 14, 2011 Office Action in U.S. Appl. No. 12/382,807.
Oct. 21, 2011 Office Action in U.S. Appl. No. 11/889,733.
Oct. 21, 2011 Office Action in U.S. Appl. No. 11/882,837.
Oct. 26, 2011 Office Action in U.S. Appl. No. 11/785,539.
Mar. 1, 2011 Office Action in U.S. Appl. No. 11/812,919.
Jan. 24, 2012 European Office Action issued in EP 10 185 953.6.
Mar. 6, 2012 Office Action in U.S. Appl. No. 12/461,244.
Dec. 21, 2010 Notice of Allowance in U.S. Appl. No. 11/984,980.
Jan. 5, 2011 Office Action in U.S. Appl. No. 11/812,925.
Dec. 20, 2010 Office Action in Korean Application No. 2005-7019366, with translation.
Jan. 7, 2011 Office Action in Korean Application No. 2005-7023089, with translation.
Aug. 10, 2012 Office Action issued in U.S. Appl. No. 13/435,780.
Sep. 25, 2012 Office Action issued in U.S. Appl. No. 12/461,246.
Sep. 7, 2012 Office Action issued in Taiwanese Patent Application No. 94103146 (with translation).
Oct. 2, 2012 Search Report issued in European Patent Application No. 10186134.2.
Oct. 4, 2012 Search Report issued in European Patent Application No. 10186140.9.
Oct. 8, 2012 Search Report issued in European Patent Application No. 10186153.2.
Oct. 10, 2012 Search Report issued in European Patent Application No. 10186147.4.
Nov. 5, 2012 Office Action issued in U.S. Appl. No. 12/461,244.
Nov. 1, 2010 Office Action in U.S. Appl. No. 11/785,539.
Oct. 13, 2010 European Search Report in European Application No. 09015888.2.
Jan. 24, 2013 Office Action issued in U.S. Appl. No. 11/785,539.
Jan. 28, 2013 Office Action issued in U.S. Appl. No. 12/453,386.
Jan. 31, 2013 Office Action issued in U.S. Appl. No. 12/923,823.
Jan. 31, 2013 Office Action issued in U.S. Appl. No. 12/659,894.
Feb. 4, 2013 Office Action issued in U.S. Appl. No. 11/812,925.
Feb. 5, 2013 Office Action issued in U.S. Appl. No. 11/812,919.
Feb. 27, 2013 Office Action issued in Taiwanese Application No. 098146233 (with English translation).
May 7, 2012 Office Action issued in U.S. Appl. No. 11/889,733.
May 31, 2011 Notice of Allowance issued in Japanese Patent Application No. 2008-111219 (w/English-language Translation).
Apr. 29, 2011 Office Action issued in Korean Patent Application No. 10-2006-7012095 (w/English-language Translation).
Apr. 29, 2011 Office Action issued in Korean Patent Application No. 10-2011-7003587 (w/English-language Translation).
Apr. 29, 2011 Office Action issued in Korean Patent Application No. 10-2011-7003625 (w/English-language Translation).
Apr. 29, 2011 Office Action issued in Korean Patent Application No. 10-2011-7003626 (w/English-language Translation).
May 4, 2011 Office Action issued in Korean Patent Application No. 10-2011-7003627 (w/English-language Translation).
May 4, 2011 Office Action issued in Korean Patent Application No. 10-2011-7003628 (w/English-language Translation).
Jun. 14, 2012 Office Action issued in U.S. Appl. No. 12/659,894.
Jun. 14, 2012 Office Action issued in U.S. Appl. No. 11/812,925.
Jun. 15, 2012 Office Action issued in U.S. Appl. No. 11/812,919.
Jun. 15, 2012 Office Action issued in U.S. Appl. No. 12/923,823.
Jun. 20, 2012 Office Action issued in U.S. Appl. No. 11/785,539.
Jun. 21, 2012 Office Action issued in U.S. Appl. No. 12/453,386.
Jul. 12, 2012 Office Action issued in U.S. Appl. No. 12/923,718.
Jun. 19, 2012 Office Action issued in Korean Application No. 2012-7006824 (with English translation).
May 30, 2012 Office Action issued in Korean Application No. 2011-7014236 (with English translation).
Jun. 28, 2013 Office Action issued in Taiwanese Patent Application No. 099136459 (with translation).
Sep. 1, 2011 Office Action in U.S. Appl. No. 11/812,925.
Sep. 6, 2011 Office Action in U.S. Appl. No. 12/659,894.
Sep. 1, 2011 Office Action in U.S. Appl. No. 11/812,919.
Sep. 29, 2011 Office Action issued in U.S. Appl. No. 12/453,386.
Mar. 23, 2011 Office Action in Korean Application No. 2009-7023978, with translation.
Mar. 23, 2011 Office Action in Korean Application No. 2010-7000875, with translation.
Mar. 23, 2011 Office Action in Korean Application No. 2010-7023716, with translation.
Mar. 23, 2011 Office Action in Korean Application No. 2010-7023718, with translation.
Apr. 12, 2011 Office Action in Japanese Application No. 2005-517477, with translation.
Mar. 3, 2011 Office Action in European Application No. 04721260.0.
Mar. 28, 2011 Search Report in European Application No. 10185953.6.
Mar. 28, 2011 Search Report in European Application No. 10185992.4.
Jan. 17, 2012 Office Action in U.S. Appl. No. 12/461,246.
Dec. 9, 2011 Office Action in U.S. Appl. No. 11/822,807.
Sep. 30, 2013 Office Action issued in U.S. Appl. No. 12/923,717.
Oct. 2, 2013 Office Action issued in U.S. Appl. No. 12/923,784.
Oct. 2, 2013 Office Action issued in U.S. Appl. No. 12/923,785.
Oct. 2, 2013 Office Action issued in U.S. Appl. No. 13/449,430.
Oct. 10, 2013 Office Action issued in U.S. Appl. No. 13/137,753.
Oct. 11, 2013 Office Action issued in U.S. Appl. No. 12/923,786.
Oct. 11, 2013 Office Action issued in U.S. Appl. No. 13/852,807.
Oct. 16, 2013 Office Action issued in U.S. Appl. No. 13/853,643.
Oct. 21, 2013 Office Action issued in U.S. Appl. No. 13/853,319.
Jan. 16, 2014 Office Action issued in U.S. Appl. No. 11/812,919.
Jan. 16, 2014 Office Action issued in U.S. Appl. No. 13/435,780.
Jan. 9, 2014 Office Action issued in U.S. Appl. No. 13/946,317.
Jan. 16, 2014 Office Action issued in U.S. Appl. No. 11/812,925.
Jan. 17, 2014 Office Action issued in U.S. Appl. No. 11/785,539.
Jul. 9, 2013 Office Action issued in Taiwanese Patent Application No. 098115103 (with Translation).
Aug. 1, 2013 Office Action issued in U.S. Appl. No. 12/453,386.
Aug. 6, 2013 Office Action issued in U.S. Appl. No. 11/785,539.
Aug. 6, 2013 Office Action issued in U.S. Appl. No. 11/812,925.
Aug. 21, 2013 Office Action issued in U.S. Appl. No. 12/923,823.
Aug. 21, 2013 Advisory Action issued in U.S. Appl. No. 13/435,780.
Feb. 5, 2014 Office Action issued in U.S. Appl. No. 12/659,894.
Feb. 4, 2014 Office Action issued in Japanese Patent Application No. 2013-080847 (with translation).

\* cited by examiner

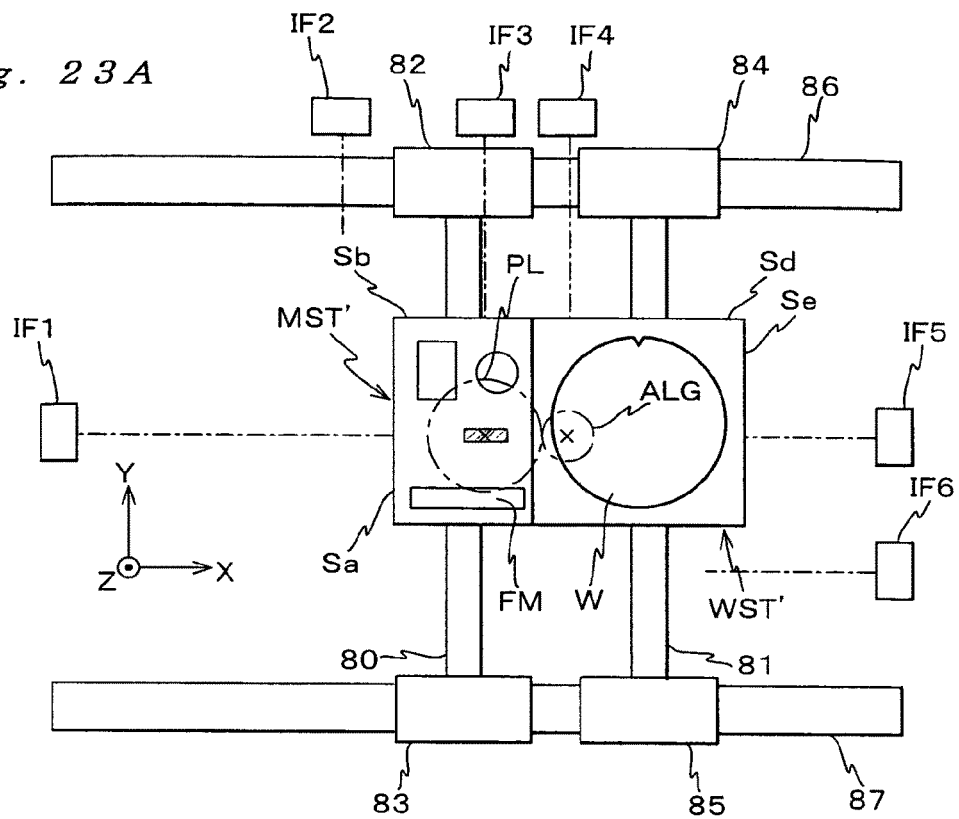
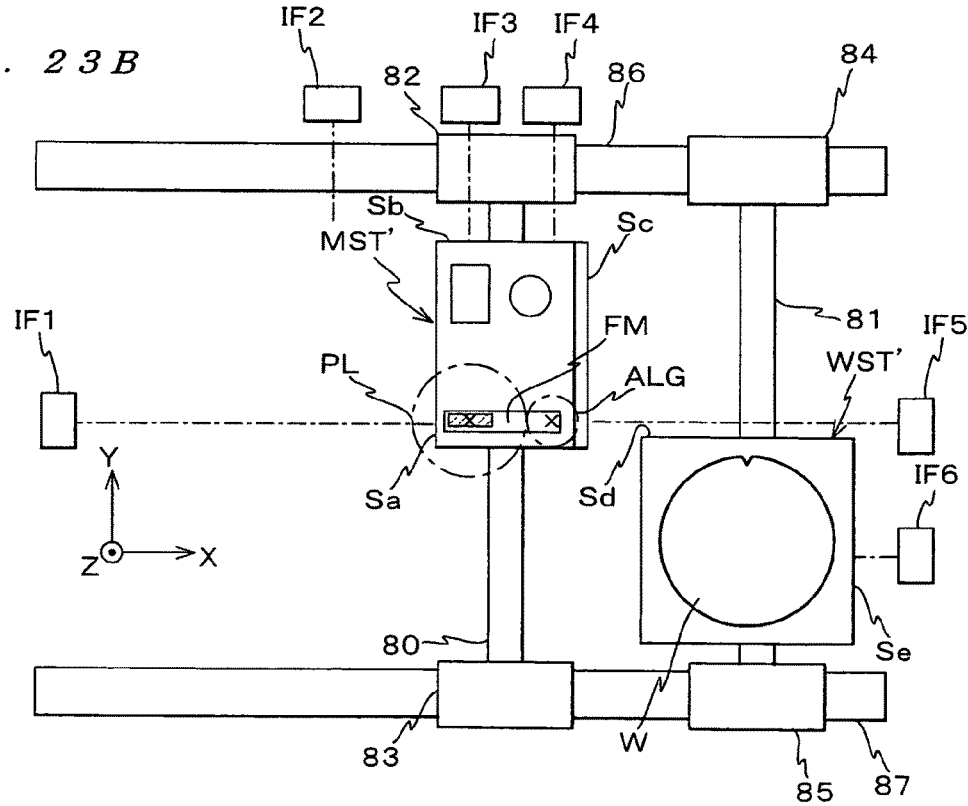

STAGE DRIVE METHOD AND STAGE UNIT, EXPOSURE APPARATUS, AND DEVICE MANUFACTURING METHOD

This is a Division of application Ser. No. 11/785,860, filed Apr. 20, 2007, now U.S. Pat. No. 8,045,136, which in turn is a Division of application Ser. No. 10/588,029, filed Aug. 1, 2006, now U.S. Pat. No. 7,589,822, which in turn is a National Phase of International Application No. PCT/JP2005/001076, filed Jan. 27, 2005. The disclosures of the prior applications are hereby incorporated by reference herein in their entirety.

TECHNICAL FIELD

The present invention relates to stage drive methods and stage units, exposure apparatus, and device manufacturing methods, and more particularly to a stage drive method in which two stages movable in an area including a first area within a two-dimensional plane where a liquid is locally supplied are driven and a stage unit suitable for implementing the stage drive method, an exposure apparatus that supplies liquid in a space between a projection optical system and a substrate and exposes the substrate via the projection optical system and the liquid, and a device manufacturing method that uses the exposure apparatus.

BACKGROUND ART

Conventionally, in a lithography process for manufacturing electronic devices such as a semiconductor device (such as an integrated circuit), a liquid crystal display device or the like, a reduction projection exposure apparatus by the step-and-repeat method that transfers an image of a pattern of a mask or a reticle (hereinafter generally referred to as a 'reticle') onto each of a plurality of shot areas on a photosensitive substrate such as a wafer coated with a resist (photosensitive agent), a glass plate, or the like (hereinafter generally referred to as a 'substrate' or a 'wafer') via a projection optical system, or a projection exposure apparatus by the step-and-scan method (the so-called scanning stepper (also referred to as a scanner)) are mainly used.

Resolution R of the projection optical system that the projection exposure apparatus has can be expressed as in equation (1) below by Rayleigh's formula.

$$R = k_1 \cdot \lambda / NA \quad (1)$$

In this case, $\lambda$ is the exposure wavelength, NA is the numerical aperture of the projection optical system, and $k_1$ is a process factor. According to equation (1), resolution R becomes higher when the exposure wavelength used (the wavelength of the exposure light) becomes shorter or when the numerical aperture or the projection optical system (NA) becomes larger. Therefore, as the integrated circuit becomes finer, the exposure wavelength used in the projection exposure apparatus is becoming shorter year by year, and nowadays, exposure apparatus that uses the ArF excimer laser (wavelength 193 nm) whose wavelength is shorter than the KrF excimer laser (wavelength 248 nm) is also put to practical use. Further, the numerical aperture of the projection optical system is gradually increasing.

When performing exposure, the depth of focus (DOF) is also important as well as the resolution. Depth of focus $\delta$ can be expressed as in equation (2) below.

$$\delta = k_2 \cdot \lambda / NA^2 \quad (2)$$

In this case, $k_2$ is a process factor. From equations (1) and (2), it can be seen that when exposure wavelength $\lambda$ is shortened and numerical aperture NA is increased (a larger NA) in order to increase resolution R, depth of focus $\delta$ becomes narrower. In the projection exposure apparatus, when exposure is performed, because the surface of the wafer is made to conform to the image plane of the projection optical system, depth of focus $\delta$ should preferably be wide to some extent.

However, due to the shorter wavelength of the exposure light and the larger numerical aperture of the projection optical system described above, the depth of focus is becoming narrower. Further, the exposure wavelength is presumed to be much shorter in the future; however, in such a case, the depth of focus may become so small that focus margin shortage may occur during the exposure operation.

Therefore, as a method of substantially shortening the exposure wavelength while increasing (widening) the depth of focus when compared with the depth of focus in the air, the exposure apparatus that uses the immersion method is recently gathering attention. As such an exposure apparatus using the immersion method, the apparatus that performs exposure in a state where the space between the lower surface of the projection optical system and the wafer surface is locally filled with liquid such as water or an organic solvent is known (for example, refer to Patent Document 1 below). According to the exposure apparatus of Patent Document 1, the resolution can be improved by making use of the fact that the wavelength of the exposure light in the liquid becomes 1/n of the wavelength in the air (n is the refractive index of the liquid which is normally around 1.2 to 1.6), and the depth of focus can be also substantially increased n times when compared with the case where the same resolution is obtained by a projection optical system (supposing that such a projection optical system can be made) that does not employ the immersion method. That is, the depth of focus can be substantially increased n times than in the air.

However, in the exposure apparatus according to Patent Document 1, the liquid has to be recovered once at the point before the wafer stage moves away from under the projection optical system during wafer exchange, so as to change the state of the space between the lower surface of the projection optical system and the wafer surface from a wet state to a dry state. However, when the recovery and the supply of the liquid is performed each time the wafer is exchanged, it is certain that the time required for the recovery and supply of the liquid will cause a decrease in throughput of the exposure apparatus.

Further, when the optical path space of the projection optical system on the image plane side is changed from the wet state into the dry state in the manner described above, in the case the dry state continues, water stains (water marks) may be generated on the surface of the optical member constituting the projection optical system on the lowest end, which is also referred to as a front (lens) (such as a lens or a glass plate; hereinafter referred to as a 'tip lens'). Further, in the case an optical member (e.g. a prism or the like), which is a member configuring an autofocus mechanism, is arranged in the vicinity of the tip lens, water stains (water marks) may be generated on the surface of the optical member configuring the autofocus mechanism. This water stain generation may lead to a decrease in transmittance of the projection optical system or may be the cause of flare, and furthermore it may be a cause of deterioration in other image-forming performances in the projection optical system. Further, in the case water marks are generated on the prism or the like referred to above, there was the risk of the plane conforming accuracy decreasing when the surface of the wafer was made to conform to the image plane of the projection optical system. Further, when many water marks are generated, the tip lens or the optical member has to be replaced, however, the time required for the replacement also becomes the cause of decreasing the operation rate of the exposure apparatus.

In the description, the stains that are formed on the tip lens or the like also in the case of using liquid other than water will also be referred to as water stains (water marks).

Patent Document 1: the Pamphlet of International Publication Number WO99/49504

DISCLOSURE OF INVENTION

Means for Solving the Problems

The present invention has been made in consideration of the situation described above, and according to a first aspect of the present invention, there is provided a stage drive method in which a first stage and a second stage are independently driven within an area in a two-dimensional plane of a predetermined range including a first area where liquid is locally supplied and a second area located on one side of the first area in a first axis direction, wherein on a transition from a first state in which one stage of the first stage and the second stage is positioned at the first area to a second state in which the other stage is positioned at the first area, the first stage and the second stage are simultaneously driven in a second axis direction intersecting the first axis direction while one of a state where the first stage and the second stage are close together in the second axis direction and a state where the first stage and the second stage are in contact in the second axis direction is maintained.

In this case, 'a state where the first stage and the second stage are close together' refers to a state where the first stage and the second stage are close together so that the liquid does not leak from between the first stage and the second stage or the leakage level of the liquid is low. However, the permissible value of the distance between the first stage and the second stage differs depending on the material of the stages and/or the type of the liquid. In the description, the expression 'a state where the first stage and the second stage are close together' is used in the sense described above.

According to this method, when independently driving the first stage and the second stage within the area in a two-dimensional plane of a predetermined range including the first area where liquid is locally supplied and the second area located on one side of the first area in the first axis direction, in the case of a transition from the first state where one stage of the first stage and the second stage is positioned at the first area to the second state where the other stage is positioned at the first area, the first stage and the second stage are simultaneously driven in the second axis direction intersecting the first axis direction while a state where the first stage and the second stage are close together in the second axis direction or a state where the first stage and the second stage are in contact in the second axis direction is maintained. This allows the transition from the first state to the second state, in a state where an immersion area is formed on at least one stage of the first stage and the second stage, while preventing or suppressing the leakage of the liquid from the gap between the first stage and the second stage (both stages). That is, it becomes possible to perform a transition from a state where the liquid is held on one stage to a state where the liquid is held on both of the stages and then to a state where the liquid is held on the other stage, without going through the process of fully recovering the liquid and supplying the liquid again. Accordingly, it becomes possible to perform the transition from the first state to the second state within a short period.

According to a second aspect of the present invention, there is provided a second stage drive method in which a first stage is driven within an area in a two-dimensional plane of a predetermined range including a first area where liquid is locally supplied and a second area located on one side of the first area in a first axis direction, and a second stage is driven within an area of a predetermined range including the first area and a third area located on the other side of the first area in the first axis direction, wherein on a transition from a first state in which one stage of the first stage and the second stage is positioned at the first area to a second state in which the other stage is positioned at the first area, the first stage and the second stage are simultaneously driven in the first axis direction while one of a state where the first stage and the second stage are close together in the first axis direction and a state where the first stage and the second stage are in contact in the first axis direction is maintained.

According to this method, when driving the first stage within the area in the two-dimensional plane of a predetermined range including the first area where liquid is locally supplied and the second area located on one side of the first area in the first axis direction and also driving the second stage within the area of a predetermined range including the first area and the third area located on the other side of the first area in the first axis direction, in the case of a transition from the first state where one stage of the first stage and the second stage is positioned at the first area to the second state where the other stage is positioned at the first area, the first stage and the second stage are simultaneously driven in the first axis direction while one of a state where the first stage and the second stage are close together in the first axis direction and a state where the first stage and the second stage are in contact in the first axis direction is maintained. This allows the transition from the first state to the second state, in a state where an immersion area is formed on at least one stage of the first stage and the second stage, while preventing or suppressing the leakage of the liquid from the gap between the first stage and the second stage. That is, it becomes possible to perform a transition from a state where the liquid is held on one stage to a state where the liquid is held on both of the stages and then to a state where the liquid is held on the other stage, without going through the process of fully recovering the liquid and supplying the liquid again. Accordingly, it becomes possible to perform the transition from the first state to the second state within a short period.

According to a third aspect of the present invention, there is provided a first stage unit, the unit comprising: a first stage and a second stage that are independently driven within an area in a two-dimensional plane of a predetermined range, which includes a first area where liquid is locally supplied and a second area located on one side of the first area in a first axis direction; and a control unit that controls the first stage and second stage so as to simultaneously move the first stage and the second stage in a second axis direction intersecting the first axis direction while one of a state where the first stage and the second stage are close together in the second axis direction and a state where the first stage and the second stage are in contact in the second axis direction is maintained, on a transition from a first state in which one stage of the first stage and the second stage is positioned at the first area to a second state in which the other stage is positioned at the first area.

According to this unit, when a transition is performed from the first state where one stage of the first stage and the second stage is positioned at the first area where the liquid is locally supplied within a two-dimensional plane to the second state where the other stage is positioned at the first area, the control unit controls the first stage and second stage so as to simultaneously move the first stage and the second stage in the second axis direction intersecting the first axis direction while one of a state where the first stage and the second stage are close together in the second axis direction and a state where the first stage and the second stage are in contact in the second axis direction is maintained. This allows the transition from the first state to the second state, in a state where an immersion area is formed on at least one stage of the first stage and the second stage, while preventing or suppressing the leakage of the liquid from the gap between the first stage and the second stage (both stages). That is, it becomes possible to perform a transition from a state where the liquid is held on one stage to a state where the liquid is held on both of the stages and then to a state where the liquid is held on the other stage, without going through the process of fully recovering the liquid and supplying the liquid again. Accordingly, it becomes possible to perform the transition from the first state to the second state within a short period.

According to a fourth aspect of the present invention, there is provided a second stage unit, the unit comprising: a first stage that can be moved within an area in a two-dimensional plane of a predetermined range including a first area and a second area located on one side of the first area in a first axis direction where liquid is locally supplied; a second stage that can be moved within an area of a predetermined range including the first area and a third area located on the other side of the first area in the first axis direction; and a control unit that controls the first stage and second stage so as to simultaneously move the first stage and the second stage in the first axis direction while one of a state where the first stage and the second stage are close together in the first axis direction and a state where the first stage and the second stage are in contact in the first axis direction is maintained, on a transition from a first state in which one stage of the first stage and the second stage is positioned at the first area to a second state in which the other stage is positioned at the first area.

According to this unit, when a transition is performed from the first state where one stage of the first stage and the second stage is positioned at the first area where the liquid is locally supplied within a two-dimensional plane to the second state where the other stage is positioned at the first area, the control unit controls the first stage and second stage so as to simultaneously move the first stage and the second stage in the first axis direction while one of a state where the first stage and the second stage are close together in the first axis direction and a state where the first stage and the second stage are in contact in the first axis direction is maintained. This allows the transition from the first state to the second state, in a state where an immersion area is formed on at least one stage of the first stage and the second stage, while preventing or suppressing the leakage of the liquid from the gap between the first stage and the second stage. That is, it becomes possible to perform a transition from a state where the liquid is held on one stage to a state where the liquid is held on both of the stages and then to a state where the liquid is held on the other stage, without going through the process of fully recovering the liquid and supplying the liquid again. Accordingly, it becomes possible to perform the transition from the first state to the second state within a short period.

According to a fifth aspect of the present invention, there is provided a first exposure apparatus that supplies a liquid to a space between a projection optical system and a substrate and exposes the substrate with an energy beam via the projection optical system and the liquid, the apparatus comprising: a first stage that can be moved within an area of a predetermined range including a first area directly below the projection optical system where the liquid is supplied and a second area located on one side of the projection optical system in a first axis direction; a second stage that can be moved within an area of a predetermined range including the first area and a third area located on the other side of the projection optical system in the first axis direction; a stage drive system that drives the first stage and the second stage, as well as simultaneously drives the first stage and the second stage in the first axis direction while one of a state where the first stage and the second stage are close together in the first axis direction and a state where the first stage and the second stage are in contact in the first axis direction is maintained, on a transition from a first state in which one stage of the first stage and the second stage is positioned at the first area to a second state in which the other stage is positioned at the first area; a first mark detection system arranged above the second area that detects a mark located on the first stage; and a second mark detection system arranged above the third area that detects a mark located on the second stage.

According to this apparatus, when a transition is performed from the first state where one stage is positioned at the first area directly below the projection optical system where the liquid is supplied to a second state where the other stage is positioned at the first area, the stage drive system simultaneously drives the first stage and the second stage in the first axis direction while one of a state where the first stage and the second stage are close together in the first axis direction and a state where the first stage and the second stage are in contact in the first axis direction is maintained. This allows the transition from the first state to the second state, in a state where the liquid is held in the space between the projection optical system and at least one stage directly below the projection optical system, while preventing or suppressing the leakage of the liquid from the gap between the first stage and the second stage. That is, during the period after the exposure operation of the substrate via the projection optical system and the liquid using the one stage has been performed until the exposure operation of the substrate via the projection optical system and the liquid using the other stage begins, it becomes possible to perform the transition from a state where the liquid is held or retained in the space between the one stage and the projection optical system to a state where the liquid is held in the space between both of the stages and the projection optical system and then to a state where the liquid is held in the space between the other stage and the projection optical system, without going through the process of fully recovering the liquid and supplying the liquid again. Accordingly, it becomes possible to begin the exposure operation of the substrate on the other stage after the exposure operation of the substrate on the one stage has been completed within a short period. Further, because the liquid constantly exists on the image plane side of the projection optical system, generation of water stains (water marks) on the optical members on the image plane side of the projection optical system can be effectively prevented. Further, because the exposure operation of the substrate on the first stage and the mark detection operation (alignment operation) of the substrate on the second stage by the second mark detection system, and the exposure operation of the substrate on the second stage and the mark detection operation (alignment operation) of the substrate on the first stage by the first mark detection system can each be performed in parallel, an improvement in the throughput can be expected when comparing the case where the substrate exchange, mark detection (alignment), and exposure operation are performed sequentially, using a single stage.

According to a sixth aspect of the present invention, there is provided a second exposure apparatus that supplies a liquid to a space between a projection optical system and a substrate and exposes the substrate with an energy beam via the projection optical system and the liquid, the apparatus comprising: a first stage that can be moved within an area of a predetermined range including a first area directly below the projection optical system where the liquid is supplied and a second area located on one side of the first area in a first axis direction; a second stage that can be moved within an area of a predetermined range including the first area and a third area located on the other side of the first area in the first axis direction; and a stage drive system that drives the first stage and the second stage, and simultaneously drives the first stage and the second stage in the first axis direction while one of a state where the first stage and the second stage are close together in the first axis direction and a state where the first stage and the second stage are in contact in the first axis direction is maintained, on a transition from a first state in which one stage of the first stage and the second stage is positioned at the first area to a second state in which the other stage is positioned at the first area.

According to this apparatus, when a transition is performed from the first state where one stage is positioned at the first area directly below the projection optical system where the liquid is supplied to a second state where the other stage is positioned at the first area, the stage drive system simultaneously drives the first stage and the second stage in the first axis direction while one of a state where the first stage and the second stage are close together in the first axis direction and a state where the first stage and the second stage are in contact in the first axis direction is maintained. This allows the transition from the first state to the second state, in a state where the liquid is held in the space between the projection optical system and at least one stage directly below the projection optical system, while preventing or suppressing the leakage of the liquid from the gap between the first stage and the second stage. That is, during the period after the exposure operation of the substrate on the first stage via the projection optical system and the liquid has been performed until the measurement directly under the projection optical system using the second stage begins, it becomes possible to perform the transition from a state where the liquid is held in the space between the first stage and the projection optical system to a state where the liquid is held in the space between both of the stages and the projection optical system and then to a state where the liquid is held in the space between the second stage and the projection optical system, without going through the process of fully recovering the liquid and supplying the liquid again. Further, the same applies to after the measurement has been completed on the second stage until the exposure begins on the first stage. Accordingly, the measurement operation using the second stage after the exposure operation of the substrate on the first stage has been completed and the exposure operation of the substrate on the first stage after the measurement operation using the second stage has been completed can be started within a short period, which can improve the throughput. Further, because the liquid constantly exists on the image plane side of the projection optical system, generation of water stains (water marks) on the optical members on the image plane side of the projection optical system can be effectively prevented. Further, the exposure operation of the substrate using the first stage and the measurement operation using the second stage can be performed in parallel, depending on the measurement operation.

According to a seventh aspect of the present invention, there is provided a third exposure apparatus that supplies a liquid to a space between a projection optical system and a substrate and exposes the substrate via the projection optical system and the liquid, the apparatus comprising: a first stage that can be moved within an area of a predetermined range including a first area directly below the projection optical system where the liquid is supplied and a second area located on one side of the first area in a first axis direction; a second stage that can be moved independent from the first stage within an area of a predetermined range including the first area and the second area; and a stage drive system that drives the first stage and the second stage, and simultaneously drives the first stage and the second stage in a second axis direction intersecting the first axis direction while one of a state where the first stage and the second stage are close together in the second axis direction and a state where the first stage and the second stage are in contact in the second axis direction is maintained, on a transition from a first state in which one stage of the first stage and the second stage is positioned at the first area to a second state in which the other stage is positioned at the first area.

According to this apparatus, when a transition is performed from the first state where one stage is positioned at the first area directly below the projection optical system to which the liquid is supplied to the second state where the other stage is positioned at the first area, the stage drive system simultaneously drives the first stage and the second stage in the second axis direction (the direction intersecting the first axis direction in which the first area and the second area are arranged) while one of a state where the first stage and the second stage are close together in the second axis direction and a state where the first stage and the second stage are in contact in the second axis direction is maintained. This allows the transition from the first state to the second state, in a state where the liquid is held in the space between the projection optical system and at least one stage directly below the projection optical system, while preventing or suppressing the leakage of the liquid from the gap between the first stage and the second stage. That is, during the period after the exposure operation of the substrate on one stage side via the projection optical system and the liquid has been performed until the exposure operation of the substrate on the other stage side via the projection optical system and the liquid begins, it becomes possible to perform the transition from a state where the liquid is held in the space between one stage and the projection optical system to a state where the liquid is held in the space between both of the stages and the projection optical system and then to a state where the liquid is held in the space between the other stage and the projection optical system, without going through the process of fully recovering the liquid and supplying the liquid again. Accordingly, the exposure operation of the substrate on the other stage, which is performed after the exposure operation of the substrate on the one stage has been completed, can be started within a short period, which allows the throughput to be improved. Further, because the liquid constantly exists on the image plane side of the projection optical system, generation of water stains (water marks) on the optical members on the image plane side of the projection optical system can be effectively prevented.

According to an eighth aspect of the present invention, there is provided a fourth exposure apparatus that supplies a liquid to a space between a projection optical system and a substrate and exposes the substrate via the projection optical system and the liquid, the apparatus comprising: a first stage that can be moved within an area including a first area directly below the projection optical system where the liquid is supplied and an area different from the first area; a second stage that can be moved independent from the first stage within the area including the first area and the area different from the first area; a stage drive system that drives the first stage and the second stage, and simultaneously drives the first stage and the second stage in a predetermined direction while a state where the first stage and the second stage are close together in the predetermined direction is maintained, on a transition from a first state in which one stage of the first stage and the second stage is positioned at the first area to a second state in which the other stage is positioned at the first area; and a suppressing member arranged in at least one of the first stage and the second stage, so as to suppress leakage of the liquid from a gap between the stages by being positioned in the gap between the stages on the transition.

According to this apparatus, when a transition is performed from the first state where one stage of the first stage and the second stage that can be moved within the area including the first area directly below the projection optical system and the area different from the first area is positioned at the first area, to the second state where the other stage is positioned at the first area, because the first stage and the second stage are in a state close together in the first axis direction and are also simultaneously driven in the predetermined direction in a state where the suppressing member for suppressing liquid leakage arranged in at least one of the first stage and second stage is positioned in the gap between the stages, liquid leakage from between the stages can be suppressed as much as possible.

Further, in a lithography process, by exposing the substrate with the energy beam using each of the first to fourth exposure apparatus of the present invention, the device pattern can be transferred onto the substrate with good accuracy, and as a consequence, the productivity of microdevices with high integration can be improved. Accordingly, it can also be said further from another aspect that the present invention is a device manufacturing method that includes a lithography process in which the substrate is exposed with the energy beam, using any one of the first to fourth exposure apparatus of the present invention.

BRIEF DESCRIPTION OF THE DRAWINGS

FIG. 23A is a view (No. 2) for describing a drive method of a wafer stage and a measurement stage in a parallel processing operation related to the fourth embodiment;

FIG. 23B is a view (No. 2) for describing a drive method of a wafer stage and a measurement stage in a parallel processing operation related to the fourth embodiment;

BEST MODE FOR CARRYING OUT THE INVENTION

A First Embodiment

A first embodiment of the present invention will be described below, referring to FIGS. 1 to 10.

Figure 1:
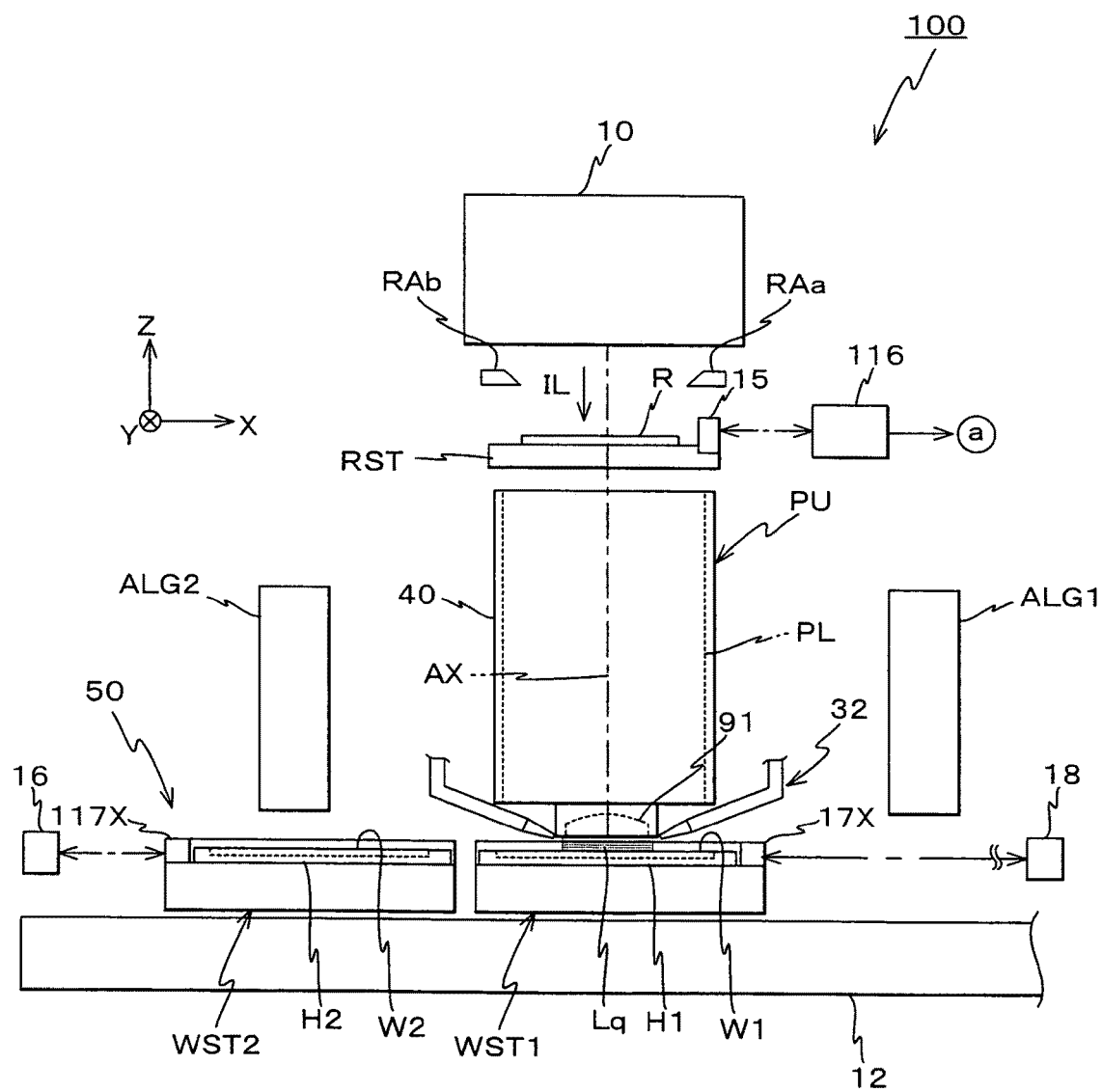
FIG. 1 is a schematic view showing a configuration of an exposure apparatus related to a first embodiment.

FIG. 1 schematically shows the entire configuration of an exposure apparatus 100 related to the first embodiment. Exposure apparatus 100 is a projection exposure apparatus by the step-and-scan method, that is, the so-called scanning stepper (also called a scanner). Exposure apparatus 100 is equipped with illumination system 10, a reticle stage RST that holds a reticle R serving as a mask, a projection unit PU, a wafer stage unit 50 that has wafer stages WST1 and WST2, off-axis alignment systems ALG1 and ALG2, a control system for these components or assemblies, and the like. On wafer stages WST1 and WST2, substrates serving as wafers are to be mounted. In FIG. 1, a wafer W1 is mounted on wafer stage WST1, and a wafer W2 is mounted on wafer stage WST2.

As is disclosed in, for example, Kokai (Japanese Unexamined Patent Application Publication) No. 2001-313250 and its corresponding U.S. Patent Application Publication No. 2003/0025890 description or the like, illumination system 10 is configured including a light source and an illuminance uniformity optical system, which includes an optical integrator, and the like. Illumination system 10 also includes a beam splitter, a relay lens, a variable ND filter, a reticle blind, and the like (all of which are not shown). In illumination system 10, an illumination light (exposure light) IL illuminates a slit-shaped illumination area set by the reticle blind on reticle R with a substantially uniform illuminance. In this case, for example, an ArF excimer laser beam (wavelength: 193 nm) is used as illumination light IL. Further, as the optical integrator, a fly-eye lens, a rod integrator (an internal reflection type integrator), a diffractive optical element or the like can be used. As illumination system 10, besides the system described above, a system having the arrangement disclosed in, for example, Kokai (Japanese Unexamined Patent Application Publication) No. 6-349701, and the corresponding U.S. Pat. No. 5,534,970, may also be employed. As long as the national laws in designated states or elected states, to which this international application is applied, permit, the above disclosures of the Kokai publications, the U.S. patent application publication description, and the U.S. patent are incorporated herein by reference.

On reticle stage RST, reticle R on which a circuit pattern or the like is formed on its pattern surface (the lower surface in FIG. 1) is fixed, for example, by vacuum chucking. Reticle stage RST is finely drivable or movable in within an XY plane perpendicular to the optical axis of illumination system 10 (coincides with an optical axis AX of a projection optical system PL that will be described later) by a reticle stage drive section 11 (not shown in FIG. 1, refer to FIG. 5) that includes a linear motor or the like. Reticle stage RST is also drivable in a predetermined scanning direction (in this case, a Y-axis direction, which is the direction orthogonal to the page surface in FIG. 1) at a designated scanning speed.

The position of reticle stage RST within the stage moving plane is constantly detected by a reticle laser interferometer (hereinafter referred to as 'reticle interferometer') 116 via a movable mirror 15 at a resolution of, for example, around 0.5 to 1 nm. In actual, on reticle stage RST, a Y movable mirror that has a reflection surface orthogonal to the Y-axis direction and an X movable mirror that has a reflection surface orthogonal to an X-axis direction are arranged, and corresponding to these movable mirrors, a reticle Y interferometer and a reticle X interferometer are arranged; however in FIG. 1, such details are representatively shown as movable mirror 15 and reticle interferometer 116. Incidentally, for example, the edge surface of reticle stage RST may be polished in order to form a reflection surface (corresponds to the reflection surfaces of the X movable mirror and the Y movable mirror described above). Further, instead of the reflection surface that extends in the X-axis direction used for detecting the position of reticle stage RST in the scanning direction (the Y-axis direction in this embodiment), at least one corner cubic mirror (such as a retroreflector) may be used. Of the interferometers reticle Y interferometer and reticle X interferometer, one of them, such as reticle Y interferometer, is a dual-axis interferometer that has two measurement axes, and based on the measurement values of reticle Y interferometer, the rotation of reticle stage RST in a rotation direction (a θz direction) around a Z-axis can be measured in addition to the Y position of reticle stage RST.

The measurement values of reticle interferometer 116 are sent to a main controller 20 (not shown in FIG. 1, refer to FIG. 5), and based on the measurement values of reticle interferometer 116, main controller 20 computes the position of reticle stage RST in the X, Y, and θz directions and also controls the position (and velocity) of reticle stage RST by controlling reticle stage drive section 11 based on the computation results.

Above reticle R, reticle alignment detection systems RAa and RAb in pairs, each consisting of a TTR (Through The Reticle) alignment system that uses light of the exposure wavelength to observe a reticle mark on reticle R and a corresponding fiducial mark on a fiducial mark plate at the same time via projection optical system PL, are arranged in the X-axis direction at a predetermined distance. As such reticle alignment detection systems RAa and RAb, a system having a structure similar to the one disclosed in, for example, Kokai (Japanese Unexamined Patent Application Publication) No. 7-176468 and the corresponding U.S. Pat. No. 5,646,413 or the like is used. As long as the national laws in designated states (or elected states), to which this international application is applied, permit, the above disclosures of the Kokai publication and the U.S. patent are incorporated herein by reference.

Projection unit PU is arranged below reticle stage RST in FIG. 1. Projection unit PU is configured including a barrel 40, and projection optical system PL consisting of a plurality of optical elements held in a predetermined positional relation within barrel 40. As projection optical system PL, a dioptric system is used, consisting of a plurality of lenses (lens elements) that share an optical axis AX in the Z-axis direction. Projection optical system PL is, for example, a both-side telecentric dioptric system that has a predetermined projection magnification (such as one-quarter, one-fifth, or one-eighth times) is used. Therefore, when illumination light IL from illumination system 10 illuminates the illumination area on reticle R, a reduced image of the circuit pattern within the illumination area of reticle R (a partial reduced image of the circuit pattern) is formed on the wafer whose surface is coated with a resist (a photosensitive agent) by illumination light IL that has passed through reticle R, via projection unit PU (projection optical system PL).

In exposure apparatus 100 of the embodiment, because exposure is performed applying the immersion method (to be described later), the numerical aperture NA substantially increases which makes the opening on the reticle side larger. Therefore, in a dioptric system consisting only of lenses, it becomes difficult to satisfy the Petzval condition, which tends to lead to an increase in the size of the projection optical system. In order to prevent such an increase in the size of the projection optical system, a catodioptric system that includes mirrors and lenses may also be used.

Further, in the embodiment, a liquid supply/drainage system 32 for locally supplying a liquid in the space between a lens 91 constituting projection optical system PL closest to the image plane side (the wafer side) (hereinafter also referred to as a 'tip lens') and the wafer on wafer stage WST1 or WST2 (or between tip lens 91 and wafer stage WST1 or WST2). In FIG. 1, a nozzle constituting this liquid supply/drainage unit is representatively shown as liquid supply/drainage system 32. The arrangement or the like of liquid supply/drainage system 32 will be described later in the description.

Wafer stage unit 50 is equipped with a base platform 12, wafer stages WST1 and WST2 arranged above the upper surface of base platform 12, an interferometer system 118 (refer to FIG. 5) that includes interferometers 16 and 18 for measuring the positions of wafer stages WST1 and WST2, and a wafer stage drive section 124 (refer to FIG. 5) for driving wafer stages WST1 and WST2.

On the bottom surface of wafer stages WST1 and WST2, non-contact bearings (not shown) such as, for example, vacuum preload air bearings (hereinafter referred to as 'air pads') are arranged in a plurality of areas, and by the static pressure of the pressurized air blowing out from the air pads toward the upper surface of base platform 12, wafer stages WST1 and WST2 are supported by levitation in a non-contact manner above the upper surface of base platform 12 via a clearance of around several µm. Further, wafer stages WST1 and WST2 are configured drivable or movable in a two-dimensional direction, individually in the X-axis direction (the lateral direction of the page surface in FIG. 1) and the Y-axis direction (the orthogonal direction of the page surface in FIG. 1), by wafer stage drive section 124.

Figure 2:
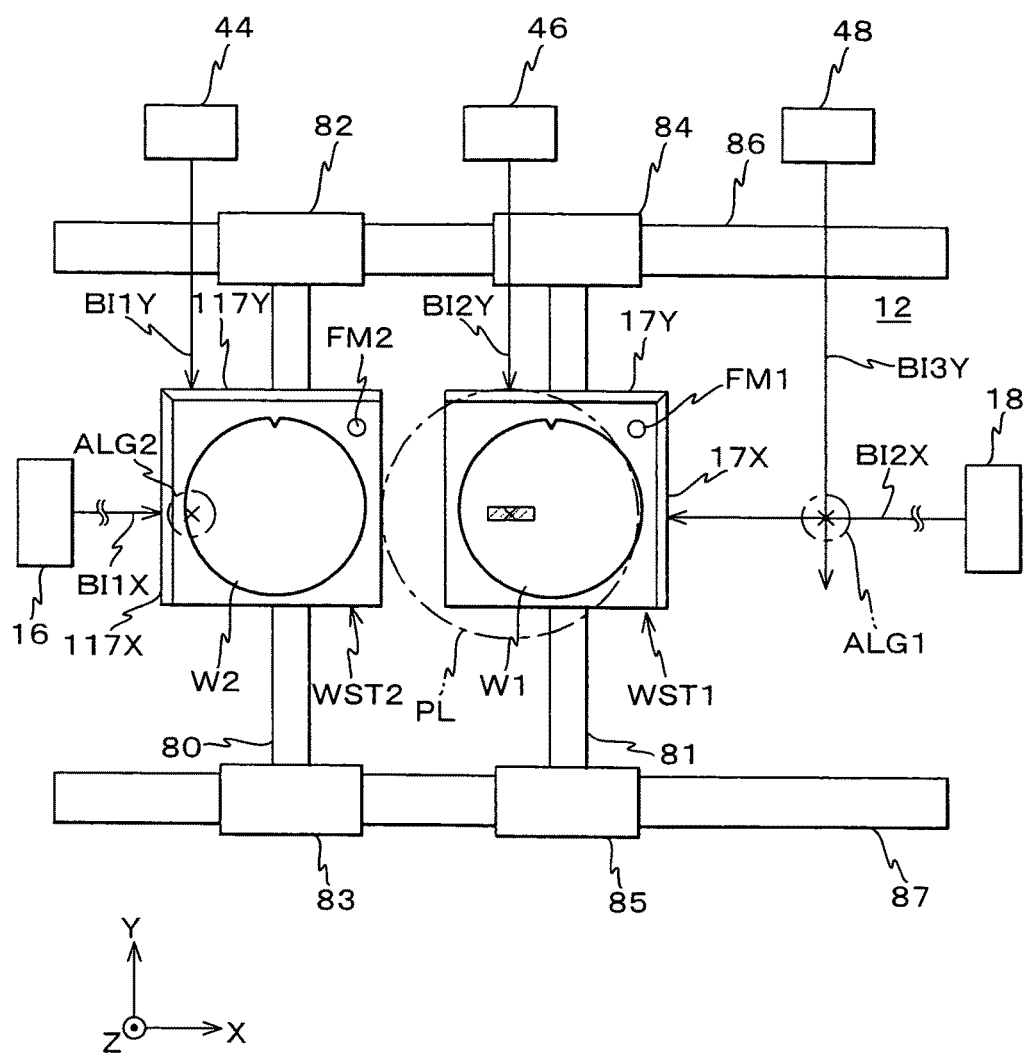
FIG. 2 is a planar view showing a wafer stage unit related to the first embodiment.

On base platform 12, as is shown in the planar view in FIG. 2, X-axis linear guides 86 and 87 in pairs, serving as an X stator extending in the X-axis direction, are arranged at a predetermined distance in the Y-axis direction. X-axis linear guides 86 and 87 are each configured, for example, of a magnetic pole unit that incorporates a permanent magnet group consisting of a plurality of sets of an N-pole magnet and an S-pole magnet alternately arranged along the X-axis direction at a predetermined distance. Above X-axis linear guides 86 and 87, two sliders each, sliders 82, 84 and sliders 83, 85 are arranged in a state enclosing the corresponding X-axis linear guides 86 and 87 from above in a non-contact manner. More specifically, the four sliders in total, 82, 84, 83, and 85 have a cross-sectional shape resembling the letter U so as to enclose the corresponding X-axis linear guides 86 and 87 from above and from the side, and the sliders are supported by levitation with respect to the corresponding X-axis linear guides 86 and 87, via the air pads (not shown) via a clearance of (e.g.) around several µm. Sliders 82, 84, 83, and 85 are each configured by an armature unit that incorporates a plurality of armature coils arranged along the X-axis direction at a predetermined distance. More specifically, in the embodiment, sliders 82 and 84 consisting of armature units and X-axis linear guide 86 consisting of the magnetic pole unit constitute moving magnet type X-axis linear motors. Similarly, sliders 83 and 85 and X-axis linear guide 87 constitute moving magnet type X-axis linear motors. In the description below, the four X-axis linear motors will each be appropriately referred to as X-axis linear motor 82, X-axis linear motor 84, X-axis linear motor 83, and X-axis linear motor 85, using the same reference numerals as the sliders 82, 84, 83, and 85 configuring each of the movers.

Of the four X-axis linear motors referred to above, the sliders that configure the two X-axis linear motors, 82 and 83, are fixed to both ends in the longitudinal direction of a Y-axis linear guide 80 serving as a Y stator extending in the Y-axis direction. Further, the sliders that configure the remaining two X-axis linear motors, 84 and 85, are fixed to both ends of a Y-axis linear guide 81 serving as a Y stator extending in the Y-axis direction. Accordingly, Y-axis linear guides 80 and 81 are each driven along the X-axis by the pair of X-axis linear motors 82 and 83 and by the pair of X-axis linear motors 84 and 85, respectively.

Y-axis linear guides 80 and 81 are each configured, for example, by an armature unit that incorporates armature coils arranged along the Y-axis direction at a predetermined distance.

One of the Y-axis linear guides, Y-axis linear guide 81, is arranged in an inserted state in an opening formed in wafer stage WST1. Inside the opening referred to above of wafer stage WST1, for example, a magnetic pole unit that has a permanent magnet group consisting of a plurality of sets of an N-pole magnet and an S-pole magnet alternately arranged along the Y-axis direction at a predetermined distance is arranged. And, the magnetic pole unit and Y-axis linear guide 81 constitute a moving magnet type Y-axis linear motor that drives wafer stage WST1 in the Y-axis direction. Similarly, the other Y-axis linear guide, Y-axis linear guide 80, is arranged in an inserted state in an opening formed in wafer stage WST2. Inside the opening referred to above of wafer stage WST2, for example, a magnetic pole unit similar to the one arranged in wafer stage WST1 side is arranged. And, the magnetic pole unit and Y-axis linear guide 80 constitute a moving magnet type Y-axis linear motor that drives wafer stage WST2 in the Y-axis direction. In the description below, the Y-axis linear motors will each be appropriately referred to as Y-axis linear motor 81 and Y-axis linear motor 80, using the same reference numerals as the linear guides 81 and 80 configuring each of the stators.

Figure 5:
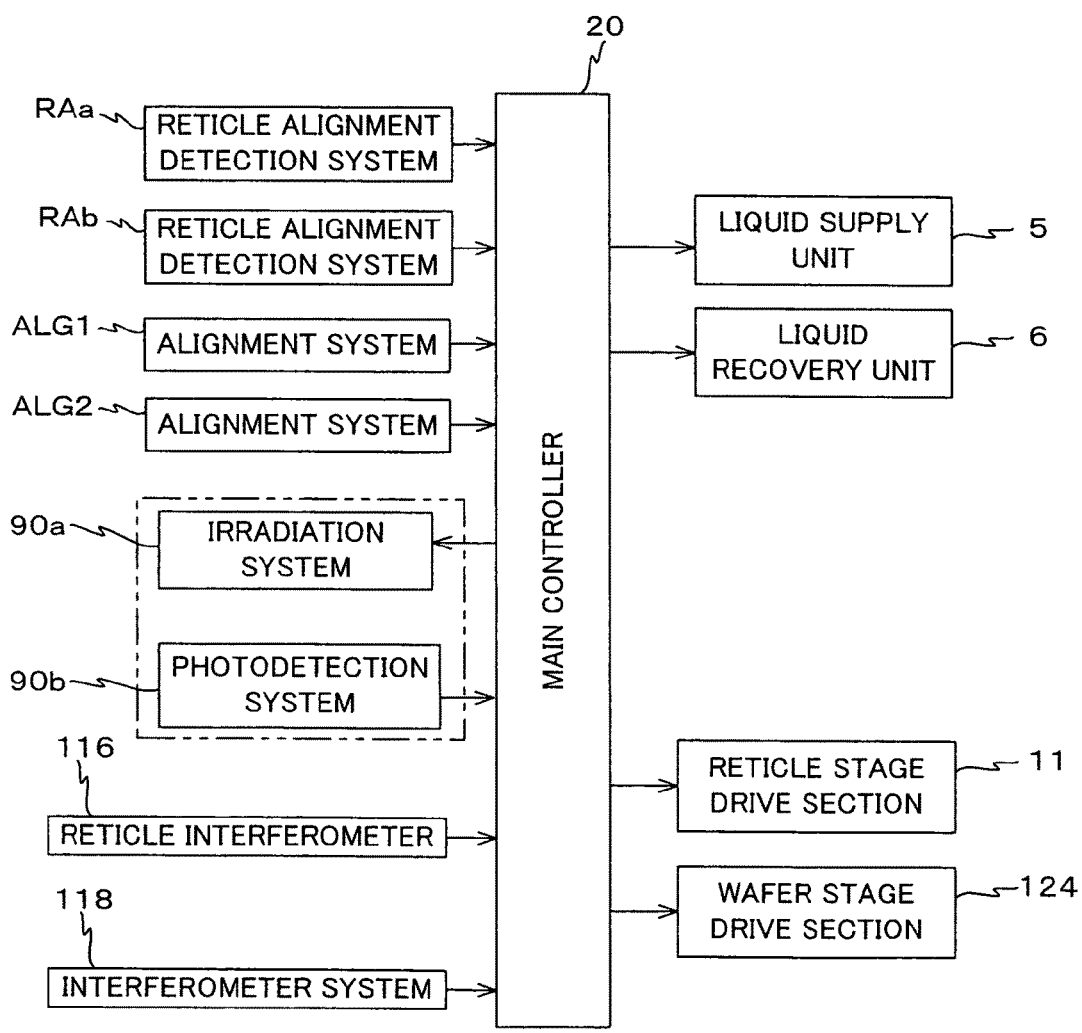
FIG. 5 is a block diagram showing the main configuration of a control system of the exposure apparatus in the first embodiment.

In the embodiment, wafer stage drive section 124 shown in FIG. 5 is configured including X-axis linear motors 82 to 85 and Y-axis linear motors 80 and 81. Each of the linear motors described above that configure wafer stage drive section 124 operate under the control of main controller 20 shown in FIG. 5.

By slightly changing the thrust generated by the pair of X-linear motors 84 and 85 (or 82 and 83), yawing control of wafer stage WST1 (or WST2) becomes possible.

In the embodiment, wafer stages WST1 and WST2 are each shown as a monolithic stage. In actual, however, wafer stages WST1 and WST2 are each equipped with a stage main body driven by Y-axis linear motors 81 and 80, and a wafer table mounted on the wafer stage main body via a Z-leveling drive mechanism (such as a voice coil motor or the like) that can be finely driven or moved relatively in the Z-axis direction and in the rotational directions around the X-axis (θx direction) and the Y-axis (θy direction).

On wafer stage WST1 (or to be more precise, on the wager table), as is shown in FIG. 1, a wafer holder H1 that holds wafer W1 by vacuum suction or the like is arranged. As it can be seen from the perspective view in FIG. 3, wafer holder H1 has a roughly square shape main body section 70 in a planar view (when viewed from above), and four auxiliary plates 72a to 72d arranged in the periphery of the area where wafer W1 is to be mounted so that they overlap main body section 70 from above. The surfaces of such auxiliary plates 72a to 72d are arranged so that they are substantially the same height as the surface of wafer W1. Incidentally, auxiliary plates 72a to 72d may consist of a single member. Further, there may be a step formed between the wafer surface and the auxiliary plate surface, as long as liquid Lq can be held on the image plane side of projection optical system PL.

On the upper surface of wafer stage WST1, an X movable mirror 17X that has a reflection surface orthogonal to the X-axis on one end in the X-axis direction (the +X side end) is arranged extending in the Y-axis direction, and a Y movable mirror 17Y that has a reflection surface orthogonal to the Y-axis on one end in the Y-axis direction (the +Y side end) is arranged extending in the X-axis direction. As is shown in FIG. 2, interferometer beams (measurement beams) from the interferometers that configure interferometer system 118 (to be described later, refer to FIG. 5) are incident on each reflection surface of movable mirrors 17X and 17Y, and by each of the interferometers receiving the reflection beams, displacement from the reference position (normally, a fixed mirror is arranged on the side surface of projection unit PU or on the side surface of alignment system ALG1, which is to be the reference plane) of the reflection surface of each movable mirror is measured. Accordingly, the two-dimensional position of wafer stage WST1 is measured. It is desirable to also keep the upper surface of movable mirrors 17X and 17Y substantially the same height (flush) as wafer W1.

Figure 3:
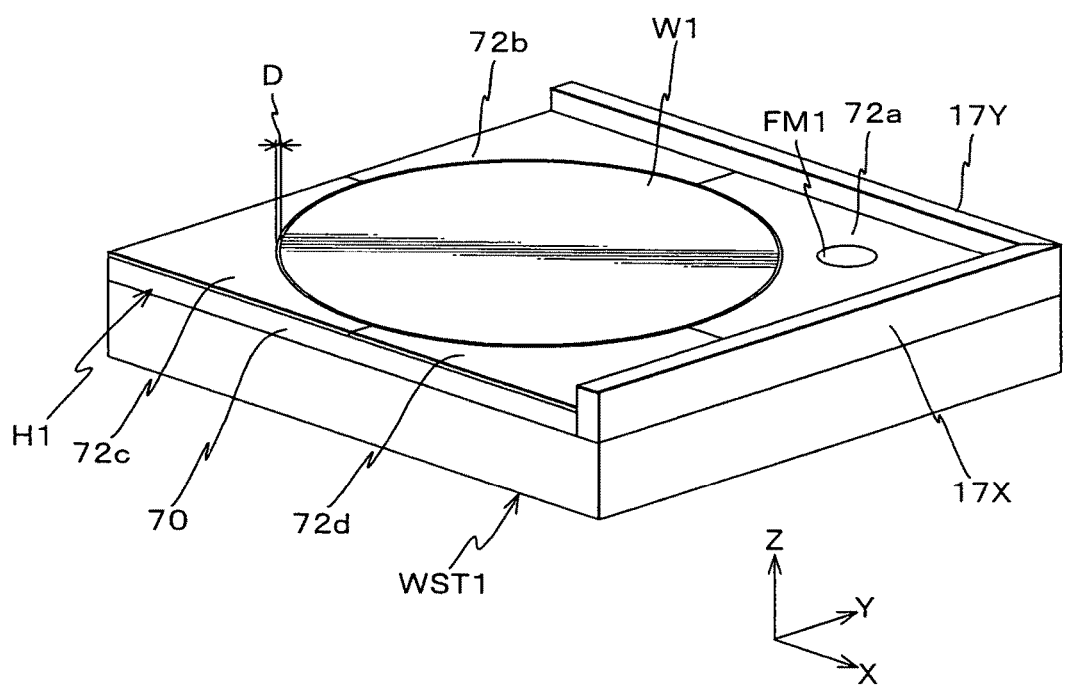
FIG. 3 is a perspective view showing a wafer stage WST1 in FIG. 2.

As is shown in FIG. 3, a gap D exists between each of the auxiliary plates 72a to 72d and wafer W1. The size of the gap is set from 0.1 mm to 1 mm and under. In addition, a notch (a V-shaped cut) is formed in a part of wafer W; however, the notch is omitted in the drawings since the size of the notch is also around 1 mm.

Further, a circular opening is formed in a part of auxiliary plate 72a, and a fiducial mark plate FM1 is embedded into the opening. The surface of fiducial mark plate FM1 is to be on the same plane as auxiliary plate 72a. On the surface of fiducial mark plate FM1, at least a first fiducial mark in pairs for reticle alignment, a second fiducial mark detected by alignment system ALG1 in the manner described later (none of which are shown), and the like are formed.

On wafer stage WST2 (or to be more precise, on the wafer table), a wafer holder H2 that holds wafer W2 by vacuum suction or the like is arranged, as is shown in FIG. 1. Wafer holder H2 has an arrangement similar to wafer holder H1 previously described. Accordingly, in the circular opening formed in a part of an auxiliary plate configuring wafer holder H2, a fiducial mark plate FM2 is embedded (not shown in FIG. 1, refer to FIG. 2).

Further, on the upper surface of wafer stage WST2, an X movable mirror 117X that has a reflection surface orthogonal to the X-axis on one end in the X-axis direction (the −X side end) is arranged extending in the Y-axis direction, and a Y movable mirror 117Y that has a reflection surface orthogonal to the Y-axis on one end in the Y-axis direction (the +Y side end) is arranged extending in the X-axis direction. As is shown in FIG. 2, interferometer beams (measurement beams) from the interferometers that configure interferometer system 118 (to be described later, refer to FIG. 5) are incident on each reflection surface of movable mirrors 117X and 117Y, and by each of the interferometers receiving the reflection beams, displacement from the reference position of the reflection surface of each movable mirror is measured. Accordingly, the two-dimensional position of wafer stage WST2 is measured.

Incidentally, the end surfaces of wafer stages WST1 and WST2 can be mirror-polished so as to make reflection surfaces (corresponding to the reflection surfaces of movable mirrors 17X, 17Y, 117X, and 117Y previously described).

Figure 10:
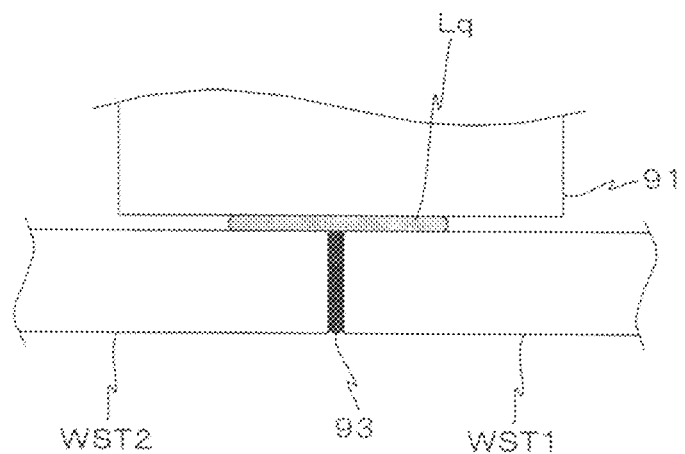
FIG. 10 is a view showing an elastic seal member.

Further, on the surface on the side of wafer stages WST1 and WST2 that face each other, e.g. the −X side surface of wafer stage WST1, a seal member 93 is applied covering the entire surface as is shown in FIG. 10. As such seal member 93, for example, an elastic seal member made of fluorine-contained rubber or the like is used.

Instead of applying seal member 93 to the −X side surface of wafer stage WST1, seal member 93 can be applied to the +X side surface of wafer stage WST2, or seal member 93 can be applied to both the −X side surface of wafer stage WST1 and the +X side surface of wafer stage WST2.

Referring back to FIG. 1, on both sides of projection unit PU on the +X side and the −X side at positions equally apart, off-axis alignment systems (hereinafter simply referred to as 'alignment systems') ALG1 and ALG2 referred to earlier are disposed. In actual, alignment systems ALG1 and ALG2 are attached to a holding member that holds projection unit PU. As alignment systems ALG1 and ALG2, for example, a sensor of an FIA (Field Image Alignment) system based on an image-processing method is used. This sensor irradiates a broadband detection beam that does not expose the resist on the wafer on a target mark, picks up the images of the target mark formed on the photodetection surface by the reflection light from the target mark and an index (not shown; an index pattern on an index plate arranged inside alignment systems ALG1 and ALG2) with a pick-up device (such as a CCD), and outputs the imaging signals. Incidentally, alignment systems ALG1 and ALG2 are not limited to the FIA system, and it is a matter of course that an alignment sensor that irradiates a coherent detection light on a target mark and detects the scattered light or diffracted light generated from the target mark, or a sensor that detects two diffracted lights (e.g. diffracted lights of the same order, or diffracted lights diffracting in the same direction) generated from the target mark by making them interfere with each other can be used independently, or appropriately combined.

In the embodiment, alignment system ALG1 is used for measuring the position of alignment marks formed on wafer W1, fiducial marks formed on fiducial mark plate FM1, and the like. Further, alignment system ALG2 is used for measuring the position of alignment marks formed on wafer W2, fiducial marks formed on fiducial mark plate FM2, and the like.

Information from these alignment systems ALG1 and ALG2 is to be supplied to main controller 20, as is shown in FIG. 5.

Next, the arrangement and the like of interferometer system 118 will be described, referring to FIG. 2. As is shown in FIG. 2, interferometer system 118 has three Y-axis interferometers, 46, 48, and 44 whose measurement axes are BI2Y, BI3Y, and BI1Y. The measurement axes are parallel to the Y-axis, and respectively pass through the detection center of projection optical system PL (optical axis AX), the detection center of alignment system ALG1, and the detection center of alignment system ALG2. Interferometer system 118 also has two X-axis interferometers, 16 and 18 whose measurement axes are BI1X and BI2X. These measurement axes are parallel to the X-axis, and respectively join the detection center of projection optical system PL (optical axis AX) and the detection center of alignment system ALG1, and the detection center of projection optical system PL (optical axis AX) and the detection center of alignment system ALG2.

In this case, when wafer stage WST1 is in the area (a first area) in the vicinity of the position directly under the optical axis of projection optical system PL and exposure of the wafer on wafer stage WST1 is to be performed, the position of wafer stage WST1 is controlled by X-axis interferometer 18 and Y-axis interferometer 46. In the description below, the coordinate system set by the measurement axes of X-axis interferometer 18 and Y-axis interferometer 46 will be referred to as a first exposure coordinate system.

Further, when wafer stage WST2 is in the first area and exposure of the wafer on wafer stage WST2 is to be performed, the position of wafer stage WST1 is controlled by X-axis interferometer 16 and Y-axis interferometer 46. In the description below, the coordinate system set by the measurement axes of X-axis interferometer 16 and Y-axis interferometer 46 will be referred to as a second exposure coordinate system.

Further, when wafer stage WST1 is in the area (a second area) in the vicinity of the position directly under the detection center of alignment system ALG1 and detection of alignment marks formed on the wafer on wafer stage WST1 such as wafer alignment (to be described later) is to be performed, the position of wafer stage WST1 is controlled by X-axis interferometer 18 and Y-axis interferometer 48. In the description below, the coordinate system set by the measurement axes of X-axis interferometer 18 and Y-axis interferometer 48 will be referred to as a first alignment coordinate system.

Further, when wafer stage WST2 is in the area (a third area) in the vicinity of the position directly under the detection center of alignment system ALG2 and detection of alignment marks formed on the wafer on wafer stage WST2 such as wafer alignment (to be described later) is to be performed, the position of wafer stage WST2 is controlled by X-axis interferometer 16 and Y-axis interferometer 44. In the description below, the coordinate system set by the measurement axes of X-axis interferometer 16 and Y-axis interferometer 44 will be referred to as a second alignment coordinate system.

As is obvious from the description above, in the embodiment, the interferometer beams from X-axis interferometers 18 and 16 constantly irradiate movable mirrors 17X and 117X of wafer stages WST1 and WST2, respectively, in the entire moving range of wafer stages WST1 and WST2. Accordingly, for the X-axis direction, the position of wafer stages WST1 and WST2 is controlled by X-axis interferometers 18 and 16 in any case, such as when exposure is performed using projection optical system PL and also when alignment systems ALG1 and ALG2 are used. Such X-axis interferometers 18 and 16 are both multi-axis interferometers that have at least three measurement axes that are separate in the Y-axis direction and the Z-axis direction, and the output values of each optical axis can be measured independently. Accordingly, with these X interferometers 18 and 16, other than measuring the position of wafer stages WST1 and WST2 in the X-axis direction, the rotation amount around the Y-axis (rolling amount) and the rotation amount around the Z-axis (yawing amount) can also be measured.

Further, Y-axis interferometers 44, 46, and 48 are dual-axis interferometers each having two optical axes that are separate, for example, in the Z-axis direction, and the output values of each optical axis can be measured independently. Accordingly, with these Y-axis interferometers 44, 46, and 48, other than measuring the position of wafer stages WST1 and WST2 in the Y-axis direction, the rotation amount around the X-axis (pitching amount) can also be measured.

Further, the multi-axis interferometers described above may detect positional information related to the optical axis direction (the Z-axis direction) of projection optical system PL, by irradiating laser beams on a reflection surface arranged on the frame on which projection optical system PL is mounted (not shown), via reflection surfaces arranged on wafer stages WST1 and WST2 at an inclination of 45°.

Next, details on liquid supply/drainage system 32 will be described, referring to FIG. 4. Liquid supply/drainage system 32 is equipped with a liquid supply unit 5, a liquid recovery unit 6, supply pipes 21, 22, 27, and 28 connecting to liquid supply unit 5 and recovery pipes 23, 24, 29, 30 connecting to liquid recovery unit 6 and the like.

Liquid supply unit 5 is configured to include a liquid tank, a compression pump, a temperature control unit, a plurality of valves for controlling the supply/stop of the liquid to supply pipes 21, 22, 27, and 28, and the like. As the valves referred to above, flow control valves are preferably used so that not only the supply/stop of the liquid but also the flow rate can be adjusted. The temperature control unit adjusts the temperature of the liquid within the liquid tank so that the temperature of the liquid is about the same level as the temperature within the chamber (not shown) where the exposure apparatus main body constituted by projection unit PU and the like are housed.

One end of supply pipe 21 connects to liquid supply unit 5. The other end branches into three sections where on each end, supply nozzles 21a, 21b, and 21c consisting of a tapered nozzle are respectively formed (arranged). The tip of these supply nozzles 21a, 21b, and 21c are located in the vicinity of tip lens 91 (refer to FIG. 1) previously described, and are arranged in the X-axis direction at a predetermined distance and also close to the +Y side of an exposure area IA (an area on the image plane conjugate with the illumination area on the slit previously described). The supply nozzles are arranged symmetrically, with supply nozzle 21a in the center and supply nozzles 21b and 21c on both sides.

One end of supply pipe 22 connects to liquid supply unit 5. The other end branches into three sections where on each end, supply nozzles 22a, 22b, and 22c consisting of a tapered nozzle are respectively formed (arranged). The tip of these supply nozzles 22a, 22b, and 22c are located in the vicinity of tip lens 91, and are arranged in the X-axis direction at a predetermined distance and also close to the −Y side of exposure area IA. In this case, supply nozzles 22a, 22b, and 22c are arranged facing supply nozzles 21a, 21b, and 21c, with exposure area IA in between.

One end of supply pipe 27 connects to liquid supply unit 5. The other end has a supply nozzle 27a consisting of a tapered nozzle formed (arranged). The tip of supply nozzle 27a is located in the vicinity of tip lens 91, and is arranged close to the −X side of exposure area IA.

One end of supply pipe 28 connects to liquid supply unit 5. The other end has a supply nozzle 28a consisting of a tapered nozzle formed (arranged). The tip of supply nozzle 28a is located in the vicinity of tip lens 91, and is arranged close to the +X side of exposure area IA and also faces supply nozzle 27a, with exposure area IA in between.

Incidentally, the liquid tank, the compression pump, the temperature adjustment unit, the valves, and the like do not all have to be equipped in exposure apparatus 100, and at least a part of such parts may be substituted by the equipment available in the factory where exposure apparatus 100 is installed.

Liquid recovery unit 6 is configured to include a liquid tank and a suction pump, and a plurality of valves for controlling the recovery/stop of the liquid via recovery pipes 23, 24, 29, and 30, and the like. As the valves, flow control valves are preferably used corresponding to the valves used in the liquid supply unit 5.

One end of recovery pipe 23 connects to liquid recovery unit 6. The other end branches into two sections where on each end, recovery nozzles 23a and 23b consisting of a widened nozzle are respectively formed (arranged). In this case, recovery nozzles 23a and 23b are arranged alternately in between supply nozzles 22a to 22c. The tip of recovery nozzles 23a and 23b and the tip of supply nozzles 22a, 22b, and 22c are arranged substantially collinear on a line parallel to the X-axis.

One end of recovery pipe 24 connects to liquid recovery unit 6. The other end branches into two sections where on each end, recovery nozzles 24a and 24b consisting of a widened nozzle are respectively formed (arranged). In this case, recovery nozzles 24a and 24b are arranged alternately in between supply nozzles 21a to 21c and also face recovery nozzles 23a and 23b, with exposure area IA in between. The tip of recovery nozzles 24a and 24b and the tip of supply nozzles 21a, 21b, and 21c are arranged substantially collinear on a line parallel to the X-axis.

One end of recovery pipe 29 connects to liquid recovery unit 6. The other end branches into two sections where on each end, recovery nozzles 29a and 29b consisting of a widened nozzle are respectively formed (arranged). Recovery nozzles 29a and 29b are arranged with supply nozzle 28a in between. The tip of recovery nozzles 29a and 29b and the tip of supply nozzle 28a are arranged substantially collinear on a line parallel to the Y-axis.

One end of recovery pipe 30 connects to liquid recovery unit 6. The other end branches into two sections where on each end, recovery nozzles 30a and 30b consisting of a widened nozzle are respectively formed (arranged). Recovery nozzles 30a and 30b are arranged with supply nozzle 27a in between, and also face recovery nozzles 29a and 29b, with exposure area IA in between. The tip of recovery nozzles 30a and 30b and the tip of supply nozzle 27a are arranged substantially collinear on a line parallel to the Y-axis.

Incidentally, the tank for recovering the liquid, the suction pump, the valves, and the like do not all have to be equipped in exposure apparatus 100, and at least a part of such parts may be substituted by the equipment available in the factory where exposure apparatus 100 is installed.

In the embodiment, as the liquid, ultra pure water (hereinafter, it will simply be referred to as 'water' besides the case when specifying is necessary) that transmits the ArF excimer laser beam (light with a wavelength of 193 nm) is to be used. Ultra pure water can be obtained in large quantities at a semiconductor manufacturing plant or the like, and it also has an advantage of having no adverse effect on the photoresist on the wafer or to the optical lenses. Further, ultra pure water has no adverse effect on the environment as well as an extremely low concentration of impurities, therefore, cleaning action on the surface of the wafer and the surface of tip lens 91 can be anticipated.

Refractive index n of the water is said to be around 1.44. In the water the wavelength of illumination light IL is 193 nm×1/n, shorted to around 134 nm.

Liquid supply unit 5 and liquid recovery unit 6 both have a controller, and the controllers operate under the control of main controller 20 (refer to FIG. 5). For example, when wafer W1 (or wafer W2) is moved in a direction shown by a solid arrow A in FIG. 4 (−Y direction), according to instructions from main controller 20, the controller of liquid supply unit 5 opens the valve connected to supply pipe 21 to a predetermined degree and completely closes the other valves so as to supply the water in the space between tip lens 91 and wafer W1 (or W2) toward the −Y direction via supply nozzles 21a to 21c arranged in supply pipe 21. Further, when the water is supplied, according to instructions from main controller 20, the controller of liquid recovery unit 6 opens the valve connected to recovery pipe 23 to a predetermined degree and completely closes the other valves so that the water is recovered into liquid recovery unit 6 from the space between tip lens 91 and wafer W1 (or W2) via recovery nozzles 23a and 23b. During the supply and recovery operations, main controller 20 gives orders to liquid supply unit 5 and liquid recovery unit 6 so that the amount of water supplied to the space between tip lens 91 and wafer W1 (or W2) toward the −Y direction from supply nozzles 21a to 21c constantly equals the amount of water recovered via recovery nozzles 23a and 23b. Accordingly, a constant amount of water Lq (refer to FIG. 1) is held or retained in the space between tip lens 91 and wafer W1 (or W2). In this case, water Lq held in the space between tip lens 91 and wafer W1 (or W2) is constantly replaced.

Figure 4:
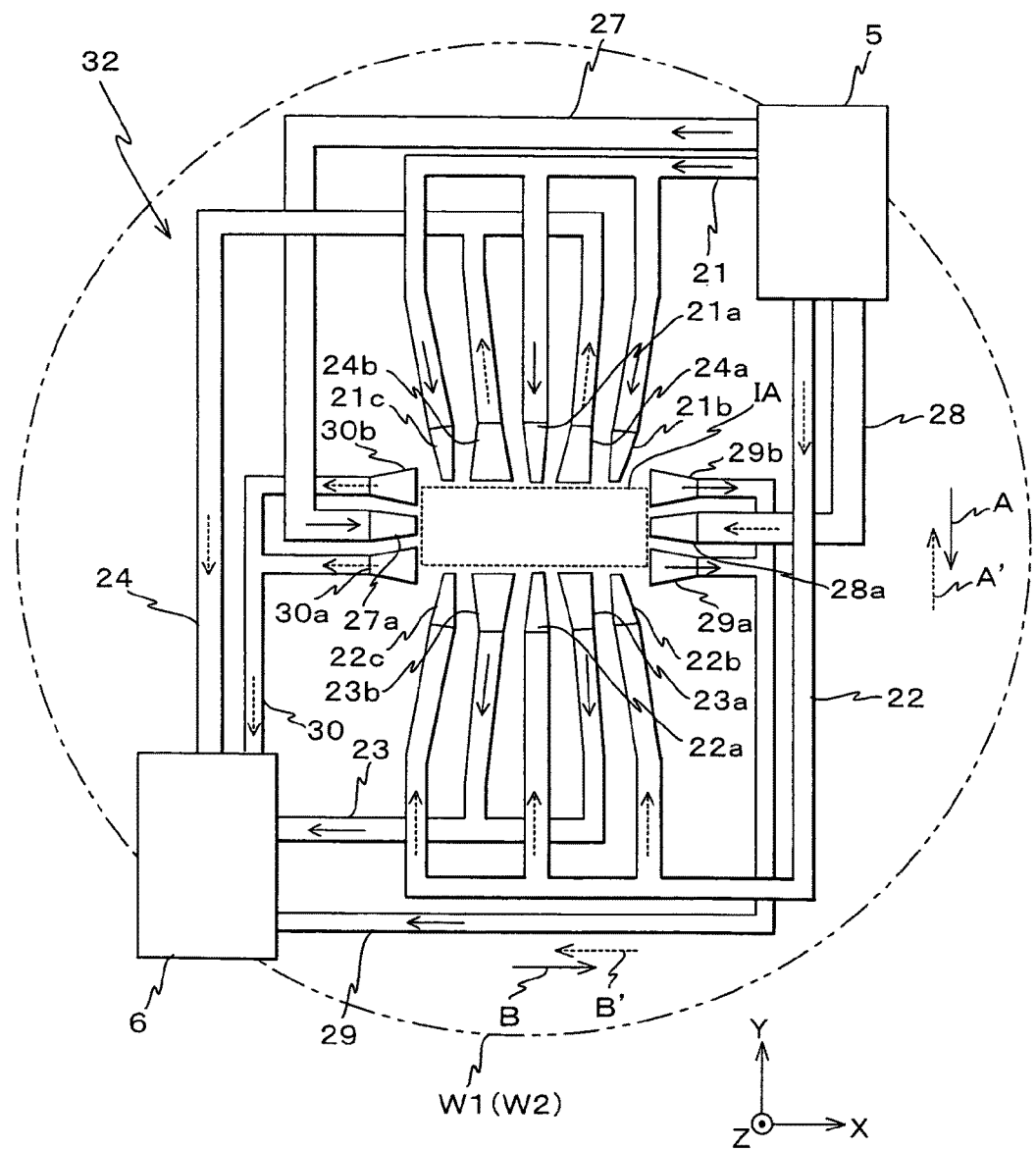
FIG. 4 is a rough planar view of a liquid supply/drainage mechanism.

Further, when wafer W1 (or wafer W2) is moved in a direction shown by a dotted arrow A' in FIG. 4 (+Y direction), according to instructions from main controller 20, the controller of liquid supply unit 5 opens the valve connected to supply pipe 22 to a predetermined degree and completely closes the other valves so as to supply the water in the space between tip lens 91 and wafer W1 (or W2) toward the +Y direction via supply nozzles 22a to 22c arranged in supply pipe 22. Further, when the water is supplied, according to instructions from main controller 20, the controller of liquid recovery unit 6 opens the valve connected to recovery pipe 24 to a predetermined degree and completely closes the other valves so that the water is recovered into liquid recovery unit 6 from the space between tip lens 91 and wafer W1 (or W2) via recovery nozzles 24a and 24b. During the supply and recovery operations, main controller 20 gives orders to liquid supply unit 5 and liquid recovery unit 6 so that the amount of water supplied to the space between tip lens 91 and wafer W1 (or W2) toward the +Y direction from supply nozzles 22a to 22c constantly equals the amount of water recovered via recovery nozzles 24a and 24b. Accordingly, a constant amount of water Lq (refer to FIG. 1) is held in the space between tip lens 91 and wafer W1 (or W2). In this case, water Lq held in the space between tip lens 91 and wafer W1 (or W2) is constantly replaced.

As is described above, in the embodiment, a group of supply nozzles and a group of recovery nozzles that are grouped together is arranged on both one side and the other side of the Y-axis direction with exposure area IA in between. Therefore, in the case the wafer is moved in either the +Y direction or in the −Y direction, the space between wafer W1 (or W2) and tip lens 91 continues to be filled stably with the water. That is, in both the so-called plus-scan and the minus scan, the water can be stably held in the space between the wafer and tip lens 91.

Further, because the water flows over wafer W1 (or W2), in the case foreign particles (including scattered particles from the resist) adhere on wafer W1 (or wafer W2), the water can remove such foreign particles. Further, because liquid supply unit 5 supplies water whose temperature is adjusted to a predetermined temperature and the water is constantly replaced, even if illumination light IL is irradiated on wafer W1 (or W2) on exposure, heat exchange is performed between the wafer and the water flowing over the wafer, which can suppress temperature increase of the wafer surface. Further, in the embodiment, because the water flows in the same direction as the moving direction of the wafer, the liquid that has absorbed the foreign particles or heat can be recovered without the liquid staying in the exposure area directly under the tip lens.

Further, when wafer W1 (or wafer W2) is moved in a direction shown by a solid arrow B in FIG. 4 (+X direction), according to instructions from main controller 20, the controller of liquid supply unit 5 opens the valve connected to supply pipe 27 to a predetermined degree and completely closes the other valves so as to supply the water in the space between tip lens 91 and wafer W1 (or W2) toward the +X direction via supply nozzle 27a arranged in supply pipe 27. Further, when the water is supplied, according to instructions from main controller 20, the controller of liquid recovery unit 6 opens the valve connected to recovery pipe 29 to a predetermined degree and completely closes the other valves so that the water is recovered into liquid recovery unit 6 from the space between tip lens 91 and wafer W1 (or W2) via recovery nozzles 29a and 29b. During the supply and recovery operations, main controller 20 gives orders to liquid supply unit 5 and liquid recovery unit 6 so that the amount of water supplied to the space between tip lens 91 and wafer W1 (or W2) from supply nozzle 27a constantly equals the amount of water recovered via recovery nozzles 29a and 29b. Accordingly, a constant amount of water Lq (refer to FIG. 1) is held in the space between tip lens 91 and wafer W1 (or W2). In this case, water Lq held in the space between tip lens 91 and wafer W1 (or W2) is constantly replaced.

Further, when wafer W1 (or wafer W2) is moved in a direction shown by a dotted arrow B' in FIG. 4 (−X direction), according to instructions from main controller 20, the controller of liquid supply unit 5 opens the valve connected to supply pipe 28 to a predetermined degree and completely closes the other valves so as to supply the water in the space between tip lens 91 and wafer W1 (or W2) toward the −X direction via supply nozzle 28a arranged in supply pipe 28. Further, when the water is supplied, according to instructions from main controller 20, the controller of liquid recovery unit 6 opens the valve connected to recovery pipe 30 to a predetermined degree and completely closes the other valves so that the water is recovered into liquid recovery unit 6 from the space between tip lens 91 and wafer W1 (or W2) via recovery nozzles 30a and 30b. During the supply and recovery operations, main controller 20 gives orders to liquid supply unit 5 and liquid recovery unit 6 so that the amount of water supplied to the space between tip lens 91 and wafer W1 (or W2) toward the +Y direction from supply nozzle 28a constantly equals the amount of water recovered via recovery nozzles 30a and 30b. Accordingly, a constant amount of water Lq (refer to FIG. 1) is held in the space between tip lens 91 and wafer W1 (or W2). In this case, water Lq held in the space between tip lens 91 and wafer W1 (or W2) is constantly replaced.

In the manner described above, as in the case of moving wafer W1 (or W2) in the Y-axis direction, in the case of moving the wafer in either the +X direction or the −X direction, the space between the wafer and tip lens 91 continues to be filled stably with the water. Accordingly, during the so-called stepping operation between shots, the water can be continuously held in the space between the wafer and tip lens 91.

In the description above, the case has been described in which the water is held in the space between the wafer and the tip lens. However, as is previously described, because the wafer surface and the surface of wafer holders H1 and H2 are substantially flush, even in the case wafer holder H1 (or H2) is located at a position corresponding to exposure area IA directly under projection unit PU, the water is held in the space between tip lens 91 and wafer holder H1 (or H2), or in other words, the auxiliary plates previously described, as in the description above. Further, during the stepping operation, in the case the water can be held in the space between the wafer and tip lens 91, the water supply and recovery can be stopped.

In addition to the nozzles that supply and recover the water from the X-axis direction or the Y-axis direction, for example, nozzles that supply and recover the water from an oblique direction can also be arranged.

Further, supply nozzles 21a to 21c, 22a to 22c, 27a, and 28a can continue to supply liquid Lq while recovery nozzles 23a, 23b, 24a, 24b, 29a, 29b, 30a, and 30b continue to recover liquid Lq, regardless of the moving direction of the wafer.

Further, the liquid supply/drainage system is not limited to the arrangement shown in FIG. 4 described above, and various arrangements can be applied as long as an immersion area can be formed on the image plane side of projection optical system PL.

In exposure apparatus 100 of the embodiment, further in the holding member that holds projection unit PU (not shown), a multiple point focal position detection system based on an oblique method constituted by an irradiation system 90a (not shown in FIG. 1, refer to FIG. 5) and a photodetection system 90b (not shown in FIG. 1, refer to FIG. 5), similar to the one disclosed in, for example, Kokai (Japanese Patent Unexamined Application Publication) No. 6-283403 and the corresponding U.S. Pat. No. 5,448,332, is arranged. Irradiation system 90a has a light source whose on/off is controlled by main controller 20 in FIG. 5, and emits imaging beams toward the imaging plane of projection optical system PL so as to form a large number of pinholes or slit images. The emitted beams are irradiated on the wafer surface from an oblique direction against optical axis AX via a prism (not shown, a part of the optical system in irradiation system 90a) arranged on the barrel of projection unit PU. Meanwhile, the beams of the imaging beams reflected off the wafer surface are reflected by another prism (not shown, a part of the optical system in photodetection system 90b) arranged on the barrel of projection unit PU, and are received by a photodetection element in photodetection system 90b.

Defocus signals, which are an output of photodetection system 90b of focal position detection system (90a, 90b), are sent to main controller 20. On scanning exposure (to be described later) or the like, main controller 20 computes the Z position of the wafer surface and the θx and θy rotations based on defocus signals such as the S-curve signal from photodetection system 90b, and controls the movement of wafer stages WST1 and WST2 in the Z-axis direction and the inclination in a two-dimensional direction (that is, rotation in the θx and θy direction) via wafer stage drive section 124 so that the difference between the Z position of the wafer surface and the θx and θy rotations that have been calculated and their target values become zero, or in other words, defocus equals zero. And, by such control, main controller 20 performs auto-focusing (automatic focusing) and auto-leveling in which the imaging plane of projection optical system PL and the surface of the wafer are made to substantially coincide with each other within the irradiation area (the area optically conjugate with the illumination area described earlier) of illumination light IL. As long as the national laws in designated states or elected states, to which this international application is applied, permit, the above disclosures of Kokai (Japanese Patent Unexamined Application Publication) No. 6-283403 and the corresponding U.S. patent are incorporated herein by reference.

The focal position detection system can be a system that detects positional information of the wafer surface via a liquid, or it can be a system that performs detection without going through the liquid. Further, the focal position detection system is not limited to the system that detects positional information of the wafer surface on the image plane side of projection optical system PL, and it can be a system that detects positional information of the wafer surface at a position away from projection optical system PL.

FIG. 5 shows a main arrangement of a control system of exposure apparatus 100 of the embodiment. The control system is mainly composed of main controller 20, which is made up of a microcomputer (or a workstation) or the like having overall control over the entire apparatus.

Next, the operation of each section on exposure in exposure apparatus 100 of the embodiment will be described. In the following description, as is shown in FIG. 2, the case when exposure is performed on the wafer stage WST1 side will be described.

On starting the exposure operation, main controller 20 moves wafer stage WST1 to a scanning starting position (acceleration starting position) for exposure of the first shot area on wafer W by controlling X-axis linear motors 84 and 85 and Y-axis linear motor 81 while monitoring the measurement values of interferometers 18 and 46, based on the results of wafer alignment performed in advance such as, for example, Enhanced Global Alignment (EGA). In this exposure sequence, the position of wafer stage WST1 is controlled on the first exposure coordinate system.

Next, main controller 20 begins the relative scanning of reticle R (reticle stage RST) and wafer W1 (wafer stage WST1) in the Y-axis direction. On this relative scanning, main controller 20 controls both reticle stage drive section 11 and Y-axis linear motor 81 (and X-axis linear motors 84 and 85), while monitoring the measurement values of interferometers 18 and 46 and reticle interferometer 116 previously described.

Then, when both stages RST and WST1 reach their target scanning speed, main controller 20 gives instructions to the light source (the ArF excimer laser unit, not shown) to start pulse emission. And, when both stages, RST and WST, reach a constant speed synchronous state, illumination light IL (ultraviolet pulse light) from illumination system 10 begins to illuminate the pattern area of reticle R, and scanning exposure begins. Pulse emission of the light source starts prior to the beginning of the scanning exposure as is described above, however, main controller 20 moves predetermined blades of the movable reticle blind (not shown) within illumination system 10 synchronously with reticle stage RST, which prevents exposure from being performed on unnecessary areas of wafer W1 before the scanning exposure has been started.

Then, different areas in the pattern area of reticle R are sequentially illuminated by illumination light IL, and when the entire pattern area has been illuminated, scanning exposure of the first shot area of wafer W1 is completed. By this operation, the pattern of reticle R is reduced and transferred onto the first shot area of wafer W1 via projection optical system PL.

In this case, after the exposure has been completed, main controller 20 continues to move the movable reticle blind (not shown) within illumination system 10 synchronously with reticle stage RST, which prevents unnecessary exposure of wafer W1.

When the scanning exposure of the first shot area has been completed in the manner described above, main controller 20 steps wafer stage WST1 via X-axis linear motors 84 and 85 and Y-axis linear motor 81 in the X-axis and Y-axis directions, and wafer stage WST1 is moved to the acceleration starting position (scanning starting position) for exposing the second shot area. During this stepping operation between shots, main controller 20 measures the positional displacement in the X, Y, and θz directions real-time based on the measurement values of interferometers 18 and 46. Then, based on the measurement results, main controller 20 controls the position of wafer stage WST1 so that the XY positional displacement of wafer stage WST1 moves into a predetermined state. Further, based on the displacement information of wafer stage WST1 in the θz direction, main controller 20 controls the rotation of at least either the reticle stage RST (reticle fine movement stage) or wafer stage WST1 so as to compensate the rotational displacement error on the wafer side.

Then, when the stepping operation between shots has been completed, main controller 20 controls the operation of each section as in the description above, and scanning exposure as in the description above is performed on the second shot area of wafer W1.

In this manner, the scanning exposure of the shot area of wafer W1 and the stepping operation for exposing the next shot are repeatedly performed, and the circuit pattern of reticle R is sequentially transferred onto all the shot areas subject to exposure on wafer W1.

Incidentally, during the exposure operation by the step-and-scan method to wafer W1 described above, it is a matter of course that main controller 20 performs the open/close operation of each valve in liquid supply unit 5 and liquid recovery unit 6 of liquid supply/drainage system 32 according to the moving direction of wafer W1 in a similar manner as is previously described. Accordingly, during the exposure operation by the step-and-scan method to wafer W1 described above, the state where a constant amount of water is held stably in the space between tip lens 91 and wafer W1 is maintained.

Next, details on a parallel processing operation using the two wafer stages WST1 and WST2 will be described, referring to FIG. 2 and to FIGS. 6 to 9. During the operation below, main controller 20 performs the open/close operation of each valve in liquid supply unit 5 and liquid recovery unit 6 of liquid supply/drainage system 32 according to the moving direction of the wafer stages positioned at the first area directly under projection unit PU as is previously described, and the space directly under tip lens 91 of projection optical system PL is constantly filled with the water. However, in the description below, for the sake of simplicity, the description related to the control of liquid supply unit 5 and liquid recovery unit 6 will be omitted.

FIG. 2 shows a state where exposure of wafer W1 on wafer stage WST1 is performed by the step-and-scan method in the manner previously described, while on the wafer stage WST2 side, wafer alignment of wafer W2 positioned at the third area under alignment system ALG2 is being performed in parallel with the exposure.

While exposure of wafer W1 is performed by the step-and-scan method in the manner described above, the following operation is being performed on the wafer stage WST2 side.

More specifically, prior to the wafer alignment referred to above, at a left-hand side loading position, wafer exchange is performed between a wafer carrier mechanism (not shown) and wafer stage WST2. In this case, the left-hand side loading position is to be determined at a position directly under alignment system ALG2 where fiducial mark plate FM2 is positioned. In this case, at the left-hand side loading position, main controller 20 resets Y-axis interferometer 44 before alignment system ALG2 detects the second fiducial marks formed on fiducial mark plate FM2.

On the detection of the second fiducial marks referred to above, main controller 20 picks up the images of the second fiducial marks using alignment system ALG2, and performs a predetermined processing on the imaging signals, and by analyzing the signals that have been processed, main controller 20 detects the position of the second fiducial marks with the index center of alignment system ALG2 serving as a reference. Further, based on the detection results of the position of the second fiducial marks and the measurement results of interferometers 16 and 44 on the detection, main controller 20 computes the position coordinates of the second fiducial marks on the second alignment coordinate system.

Next, by detecting positional information (positional information with respect to the detection center of alignment system ALG2) of alignment marks (sample marks) arranged in a specific plurality of shot areas (sample shot areas) on wafer W2 using alignment system ALG2 while controlling the position of wafer stage WST2 on the second alignment coordinate system referred to earlier, main controller 20 obtains the positional information of the sample marks on the second alignment coordinate system. Then, based on the detection results and the design position coordinates of the specific shot areas, main controller 20 executes statistical calculation such as the one disclosed in, for example, Kokai (Japanese Patent Unexamined Application Publication) No. 61-22249 and the corresponding U.S. Pat. No. 4,780,617, and computes or calculates the position coordinates of the plurality of shot areas on wafer W2 on the second alignment coordinate system. That is, in the manner described above, EGA (Enhanced Global Alignment) is performed. And then, by subtracting the position coordinates of the second fiducial marks described above from the position coordinates of the plurality of shot areas on wafer W2 on the second alignment coordinate system, main controller 20 converts the position coordinates of the plurality of shot areas into position coordinates using the position of the second fiducial marks as its origin. As long as the national laws in designated states or elected states, to which this international application is applied, permit, the above disclosures of the Kokai publication and the U.S. Patent are incorporated herein by reference.

Normally, in the exposure sequence and the wafer alignment/exchange sequence performed in parallel on the two stages, wafer stages WST1 and WST2, the wafer alignment/exchange sequence is completed before the exposure sequence. Therefore, wafer stage WST2 on which alignment has been completed moves into a waiting state at a predetermined waiting position.

Figure 6:
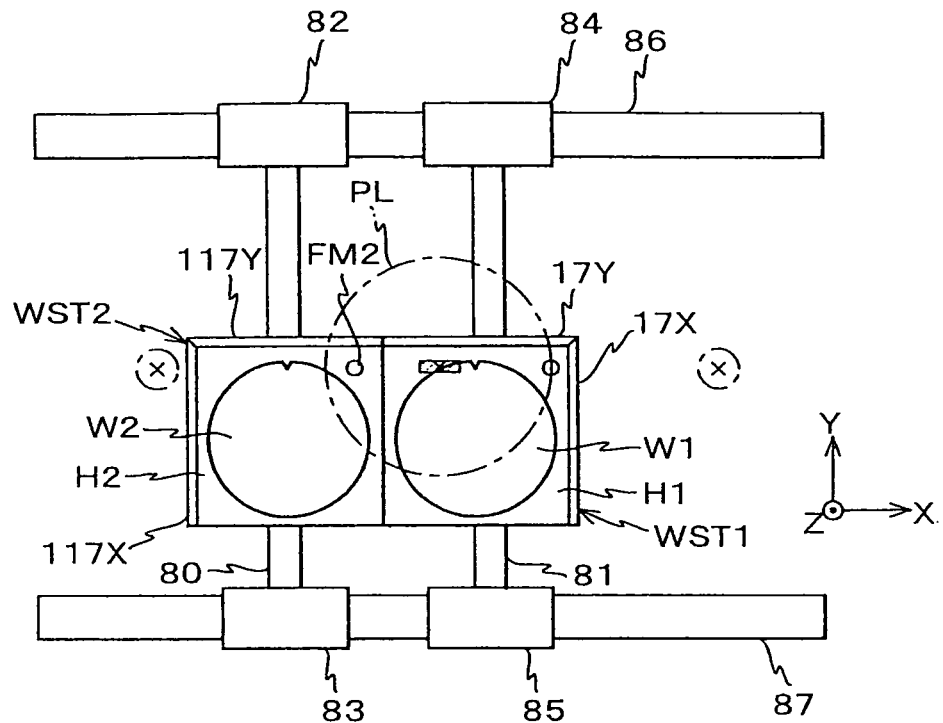
FIG. 6 is a view (No. 1) for describing a drive method of two wafer stages in a parallel processing operation.

Then, at the point where exposure of wafer W1 has been completed on the wafer stage WST1 side, main controller 20 begins to move wafer stages WST1 and WST2 toward a predetermined position shown in FIG. 6.

Then, after wafer stages WST1 and WST2 are moved to the position shown in FIG. 6, main controller 20 begins an operation of simultaneously driving wafer stages WST1 and WST2 in the +X direction. In the state shown in FIG. 6, wafer stage WST1 and wafer stage WST2 are in contact via elastic seal member 93 applied to wafer stage WST1.

Figure 7:
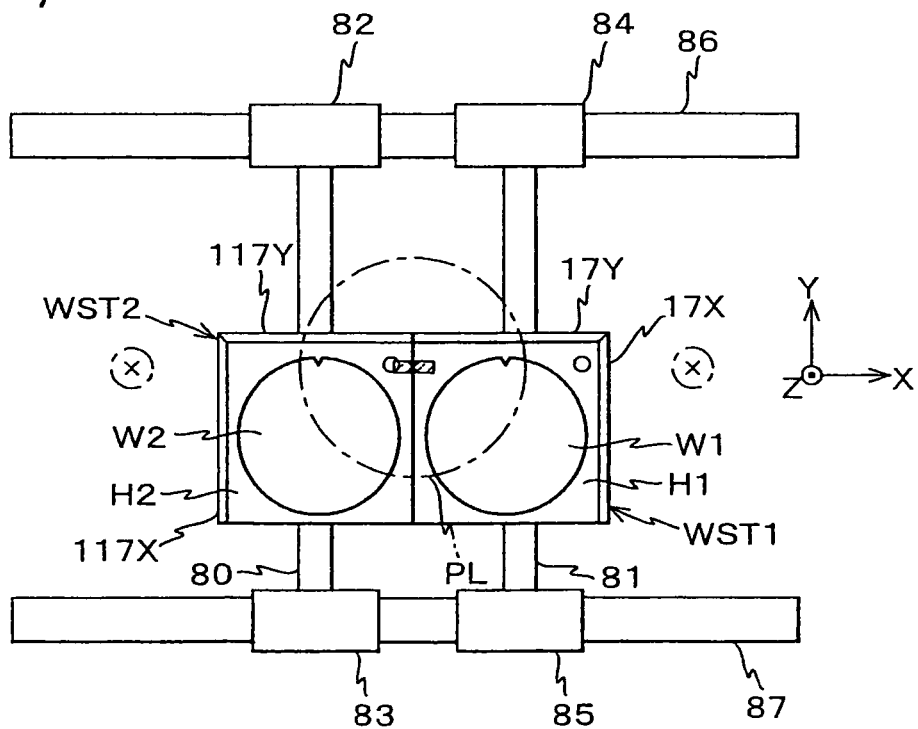
FIG. 7 is a view (No. 2) for describing a drive method of two wafer stages in a parallel processing operation.

When main controller 20 simultaneously drives wafer stages WST1 and WST2 in the manner described above, in the state shown in FIG. 6, the water held in the space between tip lens 91 of projection unit PU and wafer W1 sequentially moves over the following areas along with the movement of wafer stages WST1 and WST2 to the +X side: wafer W1→wafer stage WST1 (wafer holder H1, to be more specific)→wafer stage WST2 (wafer holder H2, to be more specific). During the movement, wafer stages WST1 and WST2 maintain the positional relation of being in contact via elastic seal member 93 as in the state shown in FIG. 6. FIG. 7 shows a state where the water (the immersion area) simultaneously exists on both wafer stages WST1 and WST2 (wafer holders H1 and H2) during the movement above, that is, the state just before the water is passed over from wafer stage WST1 to wafer stage WST2.

Figure 8:
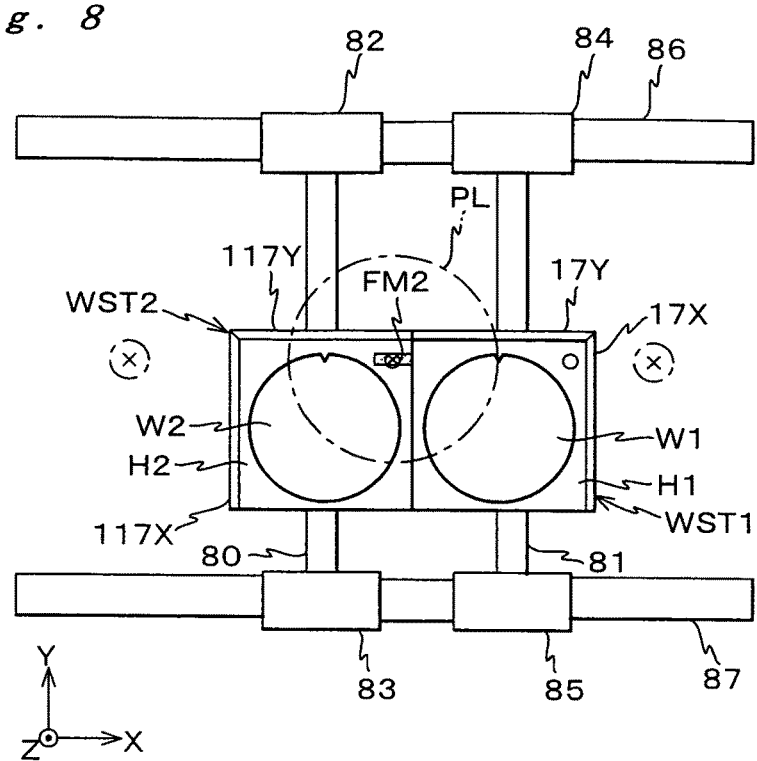
FIG. 8 is a view (No. 3) for describing a drive method of two wafer stages in a parallel processing operation.

When wafer stages WST1 and WST2 are further driven simultaneously by a predetermined distance in the +X direction from the state shown in FIG. 7, then the water moves into a state where it is held in the space between the area including fiducial mark plate FM2 on wafer stage WST2 and tip lens 91 as is shown in FIG. 8. And, prior to this state, main controller 20 resets Y-axis interferometer 46 at some point where the interferometer beam from Y-axis interferometer begins to be irradiated on movable mirror 117Y.

Figure 9:
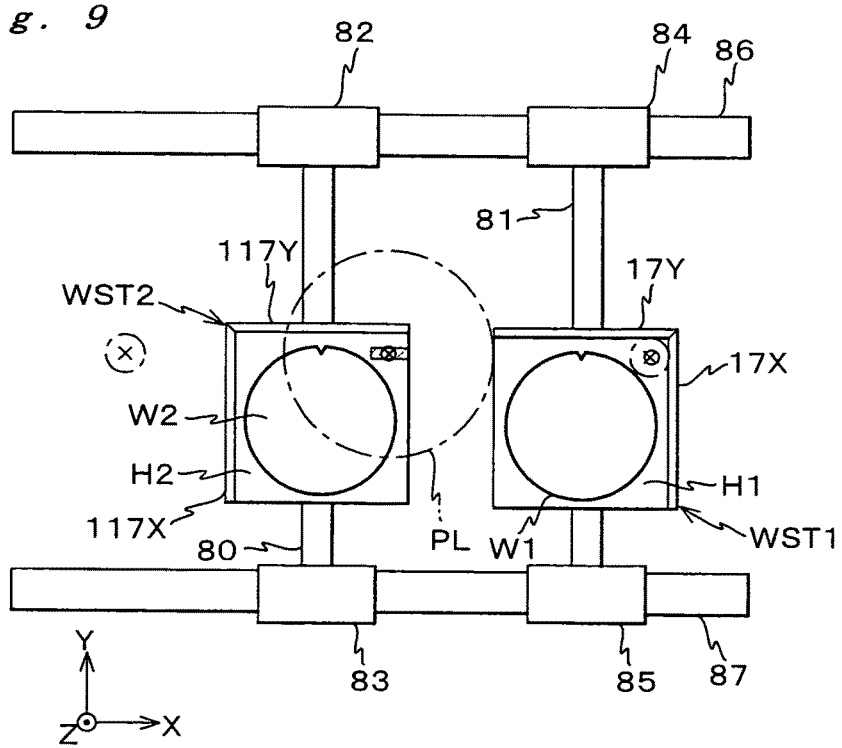
FIG. 9 is a view (No. 4) for describing a drive method of two wafer stages in a parallel processing operation.

Next, main controller 20 begins to drive wafer stage WST1 toward a right-hand side loading position shown in FIG. 9. The right-hand side loading position is to be determined at a position directly under alignment system ALG1 where fiducial mark plate FM1 is positioned.

In parallel with starting to move wafer stage WST1 toward the right-hand side loading position, main controller 20 detects the relative position between the first fiducial marks in pairs on fiducial mark plate FM2 and the projected images on the wafer surface of the reticle alignment marks on reticle R corresponding to the first fiducial marks with reticle alignment system RAa and RAb (refer to FIG. 1) in pairs, using illumination light IL. On this detection, the first fiducial marks in pairs on fiducial mark plate FM2 and the images of the reticle alignment marks are detected via projection optical system PL and the water.

Then, based on the relative position information that has been detected, the positional information of each shot area on wafer W2 with respect to the second fiducial marks obtained in advance, and the known positional relation between the first fiducial mark and the second fiducial mark, main controller 20 computes the relative positional relation between the projection position (the projection center of projection optical system PL) of the pattern of reticle R and each shot area on wafer W2. And, based on the computation results, main controller 20 transfers the pattern of reticle R on each shot area of wafer W2 by the step-and-scan method while controlling the position of wafer stage WST2 on the second exposure coordinate system as in the case of wafer W1 described above.

In parallel with the operation on the wafer stage WST2 side described above, on the wafer stage WST1 side at the right-hand side loading position, wafer exchange is performed with a wafer carrier system (not shown), and at the same time, or immediately after the wafer exchange, main controller 20 performs detection of the second fiducial marks on fiducial mark plate FM1 using alignment system ALG1. Prior to the detection of the second fiducial marks, main controller 20 resets Y-axis interferometer 48. Then, main controller 20 performs EGA on W2 using alignment system ALG1 while controlling the position of wafer stage WST1 on the first alignment coordinate system.

Hereinafter, main controller repeats the parallel operation performed on wafer stages WST1 and WST2 described above.

On the parallel processing using wafer stage WST1 and wafer stage WST2, during the period while the exposure of the wafer on one of the wafer stages is completed until the exposure of the wafer on the other wafer stage is started, transition from a state where one of the wafer stages is directly under projection unit PU (that is, a state where the water is located on one of the wafer stages) to a state where the other wafer stage is directly under projection unit PU (that is, a state where the water is located on the other wafer stage) is performed. During this transition, the state where wafer stage WST1 and wafer stage WST2 are in contact in the X-axis direction via elastic seal member 93 (the state shown in FIG. 10) is maintained as is previously described. Therefore, even if a state where the water (the immersion area) crosses both wafer stages WST1 and WST2 occurs as is shown in FIG. 7, elastic seal member 93 prevents the water (liquid) from leaking under the stage via the gap between wafer stages WST1 and WST2 without fail.

While wafer stage WST1 and wafer stage WST2 are being moved, a state (moving period, moving interval) occurs where the interferometer beams from both Y-axis interferometers 46 and 48 do not irradiate movable mirror 17Y of wafer stage WST1, and a state (moving period, moving interval) also occurs where the interferometer beams from both Y-axis interferometers 46 and 44 do not irradiate movable mirror 117Y of wafer stage WST2. In the embodiment, however, a linear encoder (not shown) controls the position of both of the stages WST1 and WST2 in such a state. In the case the linear encoder controls the position of the wafer stages, main controller 20 resets the Y-axis interferometer at the point where the interferometer beam from either of the Y-axis interferometers begins to irradiate movable mirrors 17Y or 117Y.

As is obvious from the description so far, in the embodiment, wafer stage drive section 124 configures at least a part of a stage drive system. Further, the stage drive system, wafer stage WST1, and wafer stage ST2 configures at least a part of a stage unit.

As is described above in detail, according to exposure apparatus 100, the stage unit equipped in the exposure apparatus, and the drive method of wafer stages WST1 and WST2 executed in exposure apparatus 100 of the embodiment, when a transition is performed from a first state where one of the wafer stages WST1 (or WST2) is positioned at a first area including the position directly under projection unit PU to which the liquid (water) is supplied to a second state where the other wafer stage WST2 (or WST1) is positioned at the first area, the stage drive system (such as 124) simultaneously drives wafer stages WST1 and WST2 in the X-axis direction while maintaining the state where wafer stage WST1 and wafer stage WST2 are in contact in the X-axis direction via elastic seal member 93.

Therefore, it becomes possible to perform the transition from the first state where one of the wafer stages WST1 (or WST2) is positioned at the first area to a second state where the other wafer stage WST2 (or WST1) is positioned at the first area in a state where the water continues to be supplied to the space between projection optical system PL (projection unit PU) and the specific wafer stage (this stage switches from one of the wafer stages to the other wafer stage with the movement) directly below projection optical system PL without leaking any water from the gap between the wafer stages. More specifically, the transition from a state where the water is held in the space between one of the wafer stages and projection optical system PL to a state where the water is held in the space between the other wafer stage and projection optical system PL can be performed during the period after the exposure operation of the wafer on one of the wafer stages via projection optical system PL and the water (liquid) has been completed until the exposure of the wafer on the other wafer stage via projection optical system PL and the water (liquid) is started, without going through the process of fully recovering the water and then supplying the water again.

Accordingly, it becomes possible to improve the throughput by reducing the time (that is, to maintain the time around the same level as a typical exposure apparatus (a non-immersion type exposure apparatus) that does not perform immersion exposure) from after the completion of the exposure operation on one of the wafer stages until the beginning of the exposure operation on the other wafer stage. Further, because the water constantly exists on the image plane side of projection optical system PL, generation of water stains (water marks) on the optical members (e.g. tip lens 92, the prisms of the multiple point focal position detection system previously described, or the like) on the image plane side of projection optical system PL can be effectively prevented, which allows the image-forming performance of projection optical system PL and the detection accuracy of the multiple point focal position detection system to be favorably maintained for over a long period of time.

Further, the parallel processing operation of wafer stages WST1 and WST2 can improve the throughput of the exposure apparatus improved when compared with a conventional exposure apparatus that has a single wafer stage and sequentially performs wafer exchange, wafer alignment, and exposure operations using the single wafer stage.

Further, by performing exposure with high resolution and a larger depth of focus than in the air by the immersion exposure, the pattern of reticle R can be transferred with good precision on the wafer, and for example, transfer of a fine pattern that has a device rule of around 70 to 100 nm can be achieved.

Further, in the embodiment, because wafer stage WST1 and wafer stage WST2 are in contact via elastic seal member 93, water leakage from the gap between both stages can be suppressed, and in addition, the damper effect of elastic seal member 93 can reduce the impact when wafer stage WST1 and wafer stage WST2 comes into contact.

Furthermore, in the embodiment, because there are no movable mirrors for the interferometers on the −X side surface of wafer stage WST1 and the +X side surface of wafer stage WST2, the reflection surfaces of the movable mirrors on both wafer stages do not face each other closely together even when both stages are close together in the X-axis direction. This allows not only the position of both stages to be monitored by interferometer system 118 while both wafer stages are driven simultaneously in the X-axis direction, but also prevents the water from adhering to the reflection surface.

A Second Embodiment

Next, a second embodiment of the present invention will be described, referring to FIGS. 11 to 15B. For parts that have the same or similar arrangement as the first embodiment previously described, the same reference numerals will be used, and the description thereabout will be brief, or entirely omitted. In the exposure apparatus of the second embodiment, the configuration or the like of the wafer stage unit and the parallel processing operation using the two wafer stages differ from the first embodiment previously described. Further, the point where only one mark detection system is arranged is also different from the first embodiment previously described. The configuration or the like of other components or assemblies are similar to the first embodiment previously described. Accordingly, from the viewpoint of avoiding repetition in the following description, the differences will mainly be described.

Figure 11:
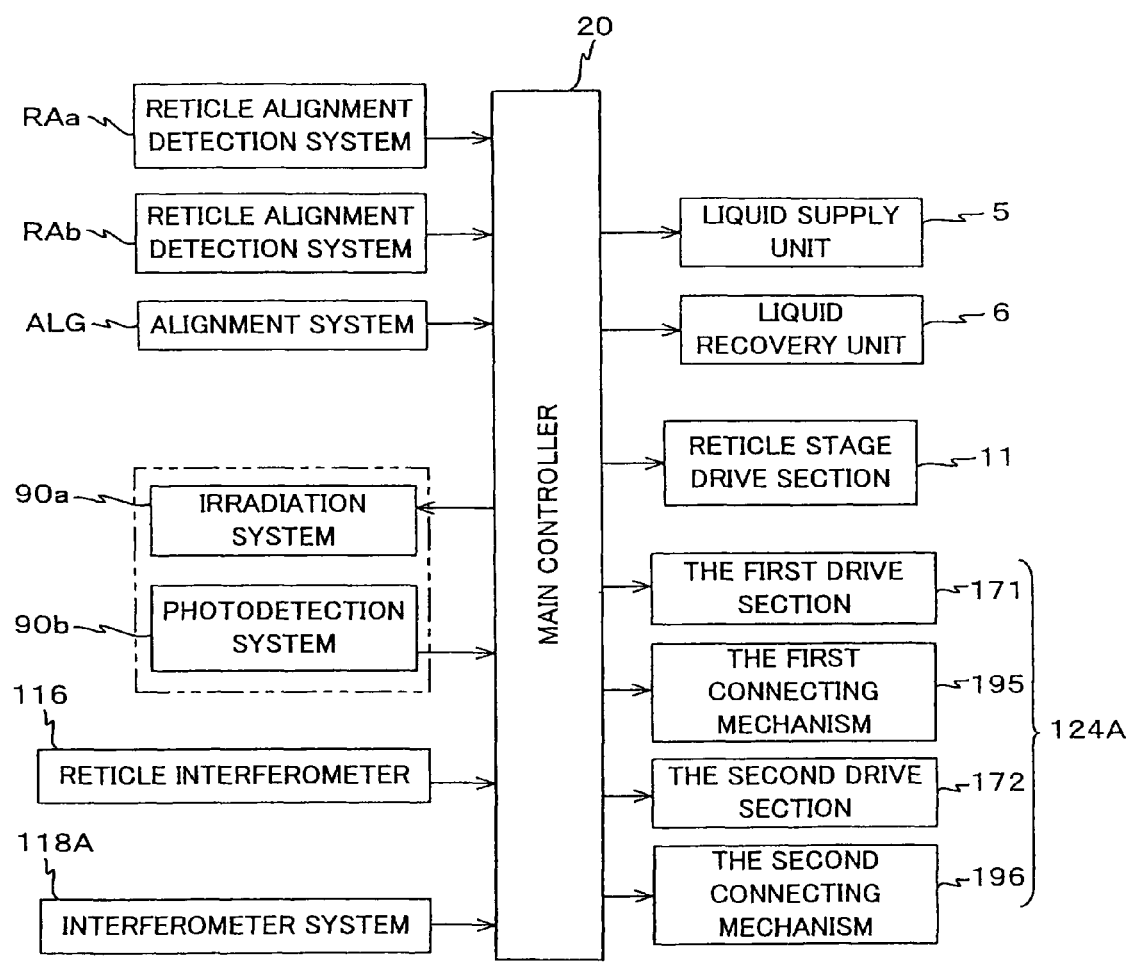
FIG. 11 is a block diagram showing the main configuration of a control system of the exposure apparatus in a second embodiment.

FIG. 11 shows an arrangement of a control system in the exposure apparatus of the second embodiment. When FIG. 11 is compared to FIG. 5, it can be seen that in the second embodiment, instead of wafer stage drive section 124 in the first embodiment previously described, the point where a wafer stage drive section 124A is arranged is different from the first embodiment previously described.

Figure 12:
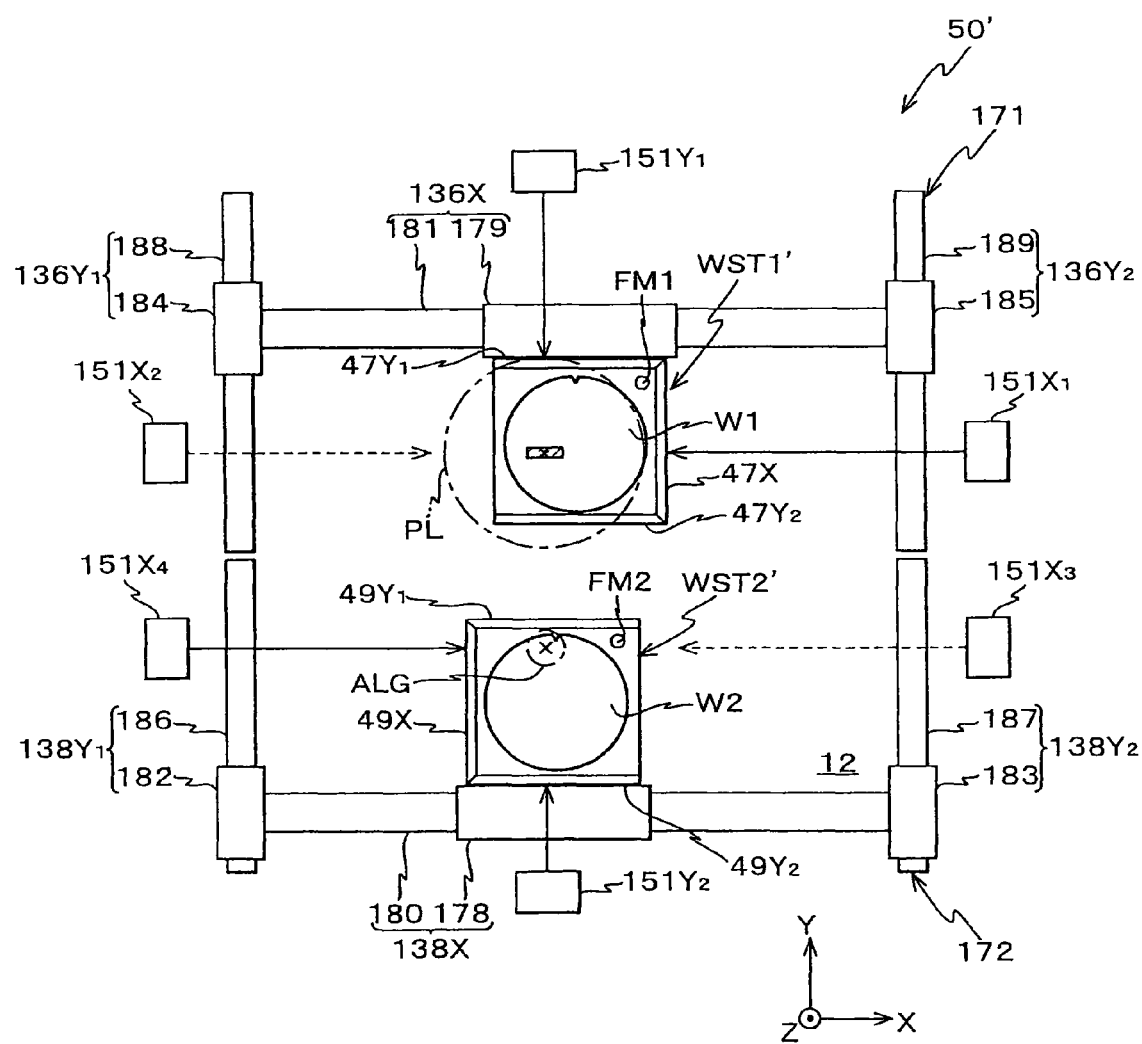
FIG. 12 is a planar view showing a wafer stage unit related to the second embodiment.

In the second embodiment, instead of wafer stage unit 50 described earlier, a wafer stage unit 50' shown in FIG. 12 is arranged. As is shown in FIG. 12, wafer stage unit 50' is equipped with a base platform 12, wafer stage WST1' and wafer stage WST2' arranged above (the front side of the page surface of FIG. 12) the upper surface of base platform 12, six interferometers $151X_1$, $151X_2$, $151X_3$, $151X_4$, $151Y_1$, and $151Y_2$ for measuring the positions of wafer stages WST1' and WST2', a first drive section 171 and a second drive section 172 shaped roughly in a letter H in a planar view (when viewed from above) that individually drive wafer stages WST1' and WST2', and a first connecting mechanism 195 and a second connecting mechanism 196 (not shown in FIG. 12, refer to FIG. 11).

In this case, the six interferometers $151X_1$, $151X_2$, $151X_3$, $151X_4$, $151Y_1$, and $151Y_2$ referred to above constitute an interferometer system 118A shown in FIG. 11, and wafer stage drive section 124A shown in FIG. 11 is configured including the first drive section 171, the second drive section 172, the first connecting mechanism 195, and the second connecting mechanism 196.

The first drive section 171 is equipped with an X-axis linear motor 136X serving as a linear actuator for driving wafer stage WST1' (or WST2') in the X-axis direction, and Y-axis linear motors $136Y_1$ and $136Y_2$ in pairs that integrally drive wafer stage WST1' (or WST2') in the Y-axis direction, which is the scanning direction, with X-axis linear motor 136X.

X-axis linear motor 136X is equipped with an X-axis linear guide 181 serving as a stator whose longitudinal direction is the X-axis direction, and an X mover 179 that moves in the X-axis direction along X-axis linear guide 181.

X-axis linear guide 181 is composed of a housing that extends in the X-axis direction, and an armature unit that has a plurality of armature coils arranged along the X-axis direction at a predetermined distance inside the housing. On one end of X-axis linear guide 181 in the longitudinal direction (the X-axis direction), a mover (Y mover) 184 of one of the Y-axis linear motors, $136Y_1$, is fixed, and on the other end, a mover (Y mover) 185 of the other Y-axis linear motor, $136Y_2$, is fixed.

X mover 179, for example, has a cylindrical shape that surrounds X-axis linear guide 181 from all around, and inside X mover 179 a mover yoke whose YZ sectional surface is a reversed U-shape is arranged. In the mover yoke, a plurality of N-pole permanent magnets and S-pole permanent magnets are arranged alternately along the longitudinal direction. Therefore, in the space inside X mover 179, an alternating magnetic field is formed along the X-axis direction.

In this case, by the electromagnetic interaction between X-mover 179 and X-axis linear guide 181, a drive force (Lorentz force) that drives X mover 179 in the X-axis direction is generated. That is, X-axis linear motor 136X is a moving magnet type linear motor by the electromagnetic drive method.

On the −Y side surface of X mover 179, the first connecting mechanism 195 (not shown in FIG. 12, refer to FIG. 11) for connecting wafer stage WST1' (or WST2') is arranged. As the first connecting mechanism 195, for example, a mechanism that uses the electromagnetic suction of an electromagnet or a mechanism that mechanically engages wafer stage WST1' (or WST2') can also be used. Main controller 20 controls the first connecting mechanism 195 so as to connect X mover 179 to wafer stage WST1' (or WST2') or to release the connection. Incidentally, in a connected state, wafer stage WST1' (or WST2') is in a state where it is cantilevered by X mover 179. FIG. 12 shows the state where X mover 179 cantilevers wafer stage WST1' (or WST2').

One of the Y-axis linear motors $136Y_1$ is equipped with a Y-axis linear guide 188 serving as a stator arranged extending in the Y-axis direction, and a Y mover 184 that moves along Y-axis linear guide 188. As Y-axis linear guide 188, an armature unit having a similar arrangement as X-axis linear guide 181 previously described is used. Further, as Y mover 184, a magnetic pole unit having a similar arrangement as X mover 179 previously described but with a reversed U-shape in the XZ section is used. That is, Y-axis linear motor $136Y_1$ is a moving magnet type linear motor by the electromagnetic drive method.

The other Y-axis linear motor $136Y_2$ is equipped with a Y-axis linear guide 189 serving as a stator arranged extending in the Y-axis direction, and a Y mover 185 that moves along Y-axis linear guide 189. Y-axis linear motor $136Y_2$ is also a moving magnet type linear motor by the electromagnetic drive method that is configured in a similar manner as Y-axis linear motor $136Y_1$.

Further, because both ends of X-axis linear guide 181 are respectively fixed to movers 184 and 185 as is previously described, when Y-axis linear motors $136Y_1$ and $136Y_2$ generate a drive force in the Y-axis direction, wafer stage WST1' (or WST2') is also driven in the Y-axis direction with X-axis linear motor 136X. In this case, by making Y-axis linear motors $36Y_1$ and $36Y_2$ generate different drive forces, the rotation around the Z-axis of wafer stage WST1' (or WST2') can be controlled via X-axis liner motor 36X.

The second drive section 172 is arranged on the −Y side of the first drive section 171 described earlier, arranged substantially diphycercal within the page surface of FIG. 12. The second drive section 172 is configured in a similar manner as the first drive section 171 described above. More specifically, the second drive section 172 is equipped with an X-axis linear motor 138X serving as a linear actuator configured of an X-axis linear guide 180 and an X mover 178, a Y-axis linear motor $138Y_1$ configured of a Y mover 182 arranged on one end of X-axis linear guide 180 and a Y-axis linear guide 186, and a Y-axis linear motor $138Y_2$ configured of a Y mover 183 arranged on the other end of X-axis linear guide 180 and a Y-axis linear guide 187.

Similar to X mover 179, on the +Y surface side of X mover 178, the second connecting mechanism 196 (not shown in FIG. 12, refer to FIG. 11) similar to the first connecting mechanism 195 for connecting wafer stage WST1' (or WST2') is arranged. Main controller 20 controls the second connecting mechanism 196 so as to connect X mover 178 to wafer stage WST2' (or WST1') or to release the connection. FIG. 12 shows the state where X mover 178 cantilevers wafer stage WST2' (or WST2').

Wafer stage WST1' is configured of a stage main body without any magnetic pole units arranged, which is different from the stage main body constituting wafer stage WST1 of the first embodiment previously described, and a wafer table similar to the wafer table constituting wafer stage WST1 previously described arranged on the upper surface of the stage main body via a Z-tilt drive mechanism (not shown). On the upper surface of the wafer table, a +Y movable mirror $47Y_1$, −Y movable mirror $47Y_2$, and a +X movable mirror 47X are arranged in the vicinity of the edge section on the ±Y side and the +X side.

Wafer stage WST2' has an arrangement similar to wafer stage WST1' referred to above. On the upper surface of the wafer table constituting wafer stage WST2', a +Y movable mirror $49Y_1$, −Y movable mirror $49Y_2$, and a −X movable mirror 49X are arranged in the vicinity of the edge section on the ±Y side and the −X side.

In the second embodiment as well, an elastic seal member similar to elastic seal member 93 shown in FIG. 10 is arranged on at least either the side surface of wafer stage WST1' on which the movable mirror is not arranged (the −X side surface) or the side surface of wafer stage WST2' on which the movable mirror is not arranged (the +X side surface).

Further, as is shown in FIG. 12, an alignment system ALG is arranged on the −Y side of projection optical system PL a predetermined distance away.

As is shown in FIG. 12, interferometer system 118A has two Y-axis interferometers $151Y_1$ and $151Y_2$ whose measurement axes are parallel to the Y-axis. The measurement axes respectively pass through the projection center of projection optical system PL (optical axis AX) and the detection center of alignment system ALG. Interferometer system 118A also has two X-axis interferometers $151X_1$ and $151X_2$ whose measurement axes are parallel to the X-axis. The measurement axes also respectively cross the measurement axis of interferometer $151Y_1$ perpendicularly at the projection center of projection optical system PL (optical axis AX). Interferometer system 118A also has two more X-axis interferometers $151X_3$ and $151X_4$ whose measurement axes are parallel to the X-axis. The measurement axes also respectively cross the measurement axis of interferometer $151Y_2$ perpendicularly at the detection center of alignment system ALG.

The four X-axis interferometers $151X_1$ to $151X_4$ are multi-axis interferometers that have at least three measurement axes that are separate in the Y-axis direction and the Z-axis direction, and the output values of each optical axis can be measured independently. Accordingly, with the four X-axis interferometers $151X_1$ to $151X_4$, other than measuring the position of wafer stages WST1' and WST2' in the X-axis direction, the rotation amount around the Y-axis (rolling amount) and the rotation amount around the Z-axis (yawing amount) can also be measured.

The two Y-axis interferometers $151Y_1$ and $151X_2$ are dual-axis interferometers each having two optical axes that are separate, for example, in the Z-axis direction, and the output values of each optical axis can be measured independently. Accordingly, with the Y-axis interferometers $151Y_1$ and $151Y_2$, other than measuring the position of wafer stages WST1' and WST2' in the Y-axis direction, the rotation amount around the X-axis (pitching amount) can also be measured.

In this case, when wafer stage WST1' is in the area (a first area) in the vicinity of the position directly under the optical axis of projection optical system PL and exposure of the wafer on wafer stage WST1' (wafer W1 in FIG. 12) is to be performed, the position of wafer stage WST1' within the XY plane is controlled on a first exposure coordinate system, which is set by the measurement axes of X-axis interferometer $151X_1$ and Y-axis interferometer $151Y_1$.

Further, when wafer stage WST2' is in the first area of projection optical system PL and exposure of the wafer on wafer stage WST2' (wafer W2 in FIG. 12) is to be performed, the position of wafer stage WST2' within the XY plane is controlled on a second coordinate system, which is set by the measurement axes of X-axis interferometer $151X_2$ and Y-axis interferometer $151Y_1$.

Further, when wafer stage WST1' is in the area (a second area) in the vicinity of the position directly under the detection center of alignment system ALG, and in the case such as when alignment (EGA) of the wafer on wafer stage WST1' (wafer W1 in FIG. 12) is to be performed, the position of wafer stage WST1' within the XY plane is controlled on a first alignment coordinate system, which is set by the measurement axes of X-axis interferometer $151X_3$ and Y-axis interferometer $151Y_2$.

Furthermore, when wafer stage WST2' is in the area (a second area) in the vicinity of the position directly under the detection center of alignment system ALG, and in the case such as when alignment (EGA) of the wafer on wafer stage WST2' (wafer W2 in FIG. 12) is to be performed, the position of wafer stage WST2' within the XY plane is controlled on a second alignment coordinate system, which is set by the measurement axes of X-axis interferometer $151X_4$ and Y-axis interferometer $151Y_2$.

The other sections in the configuration including liquid supply/drainage system 32 are configured in the same manner as in the first embodiment previously described.

Next, a series of operations including a parallel processing operation such as an exposure operation of a wafer on one of the wafer stages and an alignment operation of a wafer on the other wafer stage will be described, referring to FIGS. 12 to 15B. During the operation below, main controller 20 performs the open/close operation of each valve in liquid supply unit 5 and liquid recovery unit 6 of liquid supply/drainage system 32 according to the moving direction of the wafer stages positioned at the first area directly under projection unit PU as is previously described, and the space directly under a tip lens 91 of projection optical system PL is constantly filled with the water. However, in the description below, for the sake of simplicity, the description related to the control of liquid supply unit 5 and liquid recovery unit 6 will be omitted.

While wafer stage WST1' and wafer stage WST2' are being moved, an interval exists where the interferometer beams from the X-axis interferometer or the Y-axis interferometer does not irradiate the movable mirrors and position control of the wafer stages by the interferometers becomes difficult. In such a case, the position of the wafer stages is controlled by a linear encoder (not shown), and in the case the linear encoder controls the position of the wafer stages, main controller 20 resets the desired interferometer at the point where the interferometer beam from the desired interferometer begins to irradiate the movable mirrors. However, in the description below, in order to avoid complication, the description related to measuring the position of the wafer stages by the linear encoder and the reset of the interferometers will be omitted.

FIG. 12 shows a state where exposure of wafer W1 mounted on wafer stage WST1' is performed in the manner similar to the first embodiment described earlier by the step-and-scan method, while in parallel with this operation on the wafer stage WST2' side, wafer alignment of wafer W2 is performed at the second area below alignment system ALG.

Main controller 20 performs the exposure operation of wafer W1 while moving wafer stage WST1' by controlling the drive of X-axis linear motor 136, and Y-axis linear motors $136Y_1$ and $136Y_2$ in pairs, while controlling the position of wafer stage WST1' on the first exposure coordinate system.

While exposure is being performed on wafer W1 by the step-and-scan method on the wafer stage WST1' side, the following operation is performed on the wafer stage WST2' side.

More specifically, prior to the wafer alignment described above, at a predetermined loading position, wafer exchange is performed between a wafer carrier mechanism (not shown) and wafer stage WST2'.

After wafer exchange, main controller 20 executes the EGA previously described which includes detection the positional information of the sample marks arranged in the specific plurality of sample shot areas on wafer W2 using alignment system ALG while controlling the position of wafer stage WST2' on the second alignment coordinate system referred to earlier, and computes the position coordinates of a plurality of shot areas on wafer W2 on the second alignment coordinate system. FIG. 12 shows a state during detection of the positional information of the sample marks. Further, around the time of detection of the positional information of the sample marks, main controller 20 detects the positional information of the second fiducial marks formed on a fiducial mark plate FM2 on wafer stage WST2'. Then, main controller 20 converts the position coordinates of the plurality of shot areas on wafer W2 obtained in advance into position coordinates using the position of the second fiducial marks as its origin.

The movement of wafer stage WST2' on the wafer alignment or the like described above is performed by main controller 20, by driving and controlling X-axis linear motor 138X, and Y-axis linear motors $138Y_1$ and $138Y_2$ in pairs previously described.

Normally, in the wafer alignment operation of wafer W2 on wafer stage WST2' and the exposure operation of wafer W1 on wafer stage WST1', the wafer alignment operation is completed before the exposure operation. Therefore, after the wafer alignment has been completed, main controller 20 moves wafer stage WST2' to a predetermined waiting position shown in FIG. 13A via X-axis linear motor 138X, and Y-axis linear motors $138Y_1$ and $138Y_2$ in pairs, and makes wafer stage WST2' wait at the position.

Figure 13A:
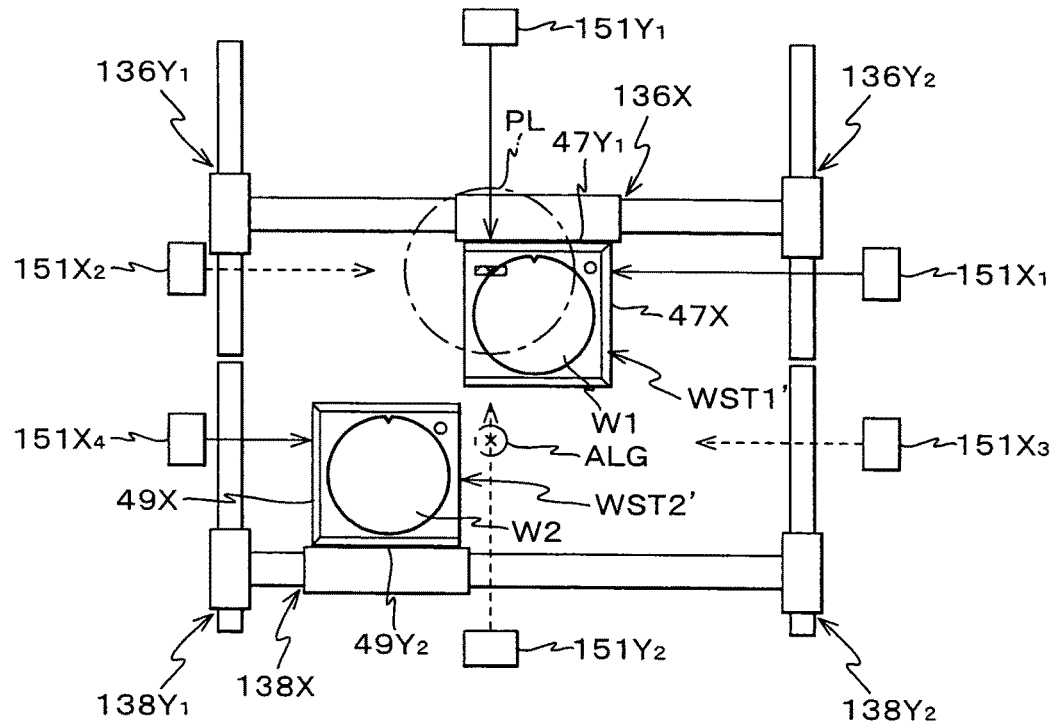
FIG. 13A is a view (No. 1) for describing a drive method of two wafer stages in a parallel processing operation related to the second embodiment.

Then, when the exposure operation of wafer W on wafer stage WST1' is completed, main controller 20 moves wafer stage WST1' to the position shown in FIG. 13A via X-axis linear motor 136, and Y-axis linear motors $136Y_1$ and $136Y_2$ in pairs. The exposure completion position of wafer W1 is preferably set in the vicinity of the position shown in FIG. 13A.

Figure 13B:
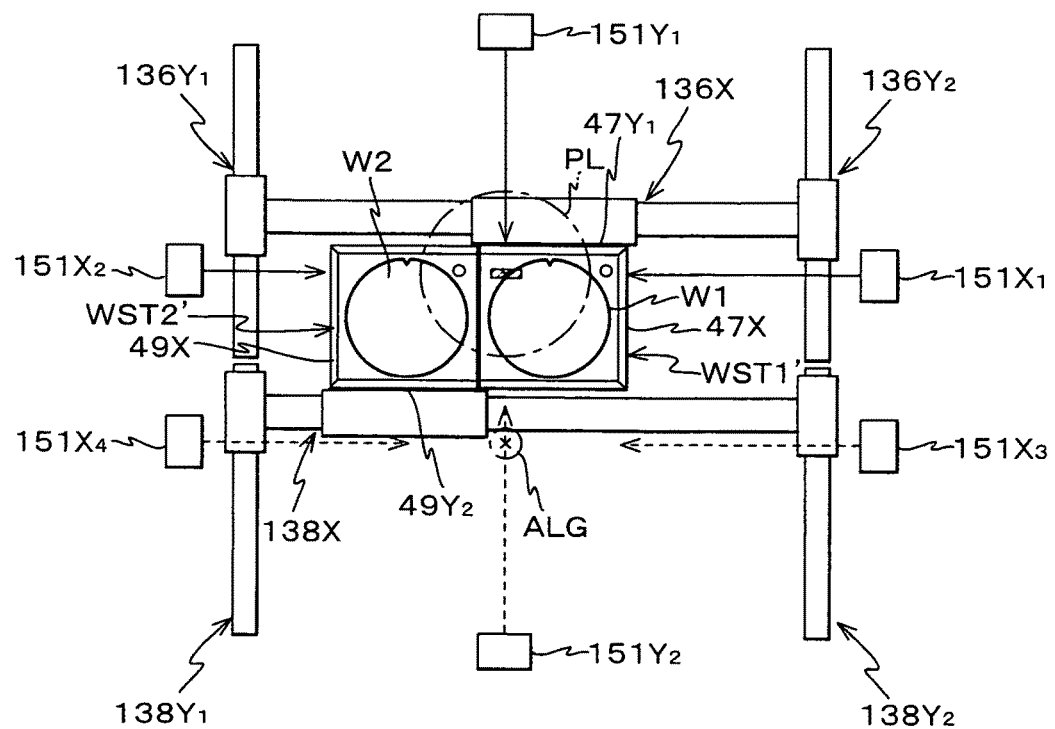
FIG. 13B is a view (No. 1) for describing a drive method of two wafer stages in a parallel processing operation related to the second embodiment.

After moving wafer stage WST1' to the position shown in FIG. 13A, main controller 20 moves wafer stage WST2' via X-axis linear motor 138, and Y-axis linear motors $138Y_1$ and $138Y_2$ in pairs to a position shown in FIG. 13B. In the state where wafer stage WST2' has moved to the position shown in FIG. 13B, wafer stage WST1' and wafer stage WST2' are in contact via the elastic seal member as in the first embodiment previously described.

Figure 14A:
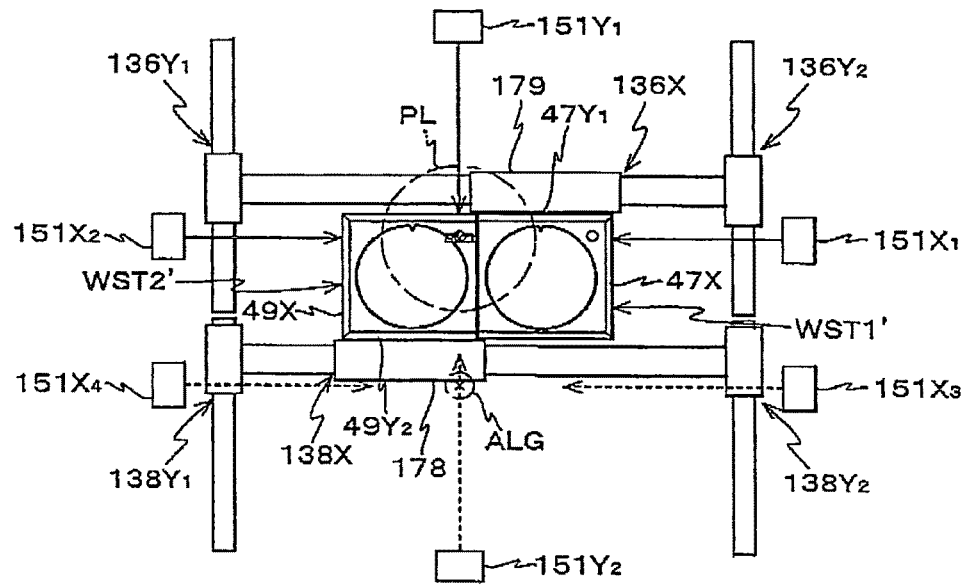
FIG. 14A is a view (No. 2) for describing a drive method of two wafer stages in a parallel processing operation related to the second embodiment.

Next, main controller 20 simultaneously moves wafer stage WST1' and wafer stage WST2' in the +X direction by controlling X-axis linear motor 136, and Y-axis linear motors $136Y_1$ and $136Y_2$ in pairs, and X-axis linear motor 138, and Y-axis linear motors $138Y_1$ and $138Y_2$ in pairs. FIG. 14A shows a state where both wafer stages WST1' and WST2' have been moved simultaneously in the +X direction from the state shown in FIG. 13B and the water is held in the space between the area including fiducial mark plate FM2 on wafer stage WST2' and tip lens 91.

In the state shown in FIG. 13B, the water that has been held or retained in the space between tip lens 91 of projection unit PU and wafer W1 sequentially moves over the following areas along with the movement of wafer stages WST1' and WST2' to the +X side: wafer W1→wafer stage WST1'→wafer stage WST2'. During the movement, wafer stages WST1' and WST2' maintain the positional relation of being in contact via elastic seal member 93.

Figure 14B:
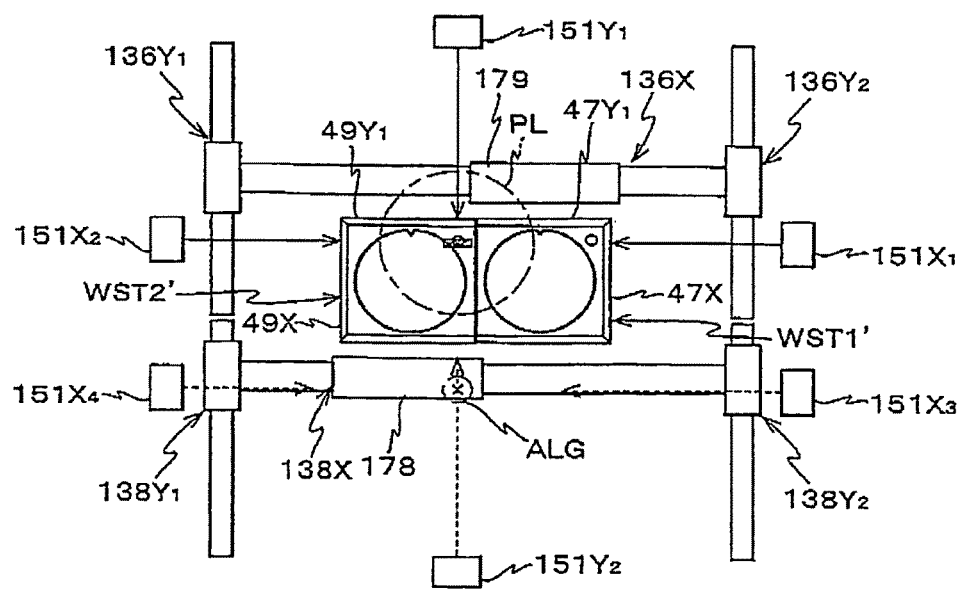
FIG. 14B is a view (No. 2) for describing a drive method of two wafer stages in a parallel processing operation related to the second embodiment.

Next, main controller 20 releases the connected state of X mover 179 and wafer stage WST1' by the first connecting mechanism 195 and the connected state of X mover 178 and wafer stage WST2' by the second connecting mechanism 196, and after this operation, main controller 20 slightly moves X mover 179 in the +Y direction and X mover 178 in the −Y direction. FIG. 14B shows the state after the X movers 179 and 178 have been driven or moved.

In the state shown in FIG. 14B, wafer stages WST1' and WST2' are supported by levitation above base platform 12 by air pads (not shown) arranged on each of the bottom surfaces (the surface on the −Z side) of wafer stages WST1' and WST2'. However, without limitation to this configuration, support legs that can freely appear can be arranged on the wafer stages WST1' and WST2' side or on the base platform 12 side, and wafer stages WST1' and WST2' can be stably supported above base platform 12 by the legs just before the connections between wafer stage WST1' and X mover 179 and wafer stage WST2' and X mover 178 are released.

Next, main controller 20 drives X mover 179 via Y-axis linear motors $136Y_1$ and $136Y_2$ in pairs and X-axis linear motor 136, and moves X mover 179 to a position where it can be connected to wafer stage WST2', and also drives X mover 178 via Y-axis linear motors $138Y_1$ and $138Y_2$ in pairs and X-axis linear motor 138, and moves X mover 178 to a position where it can be connected to wafer stage WST1'. At this point, the encoder (not shown) controls the position of each X mover.

Figure 15A:
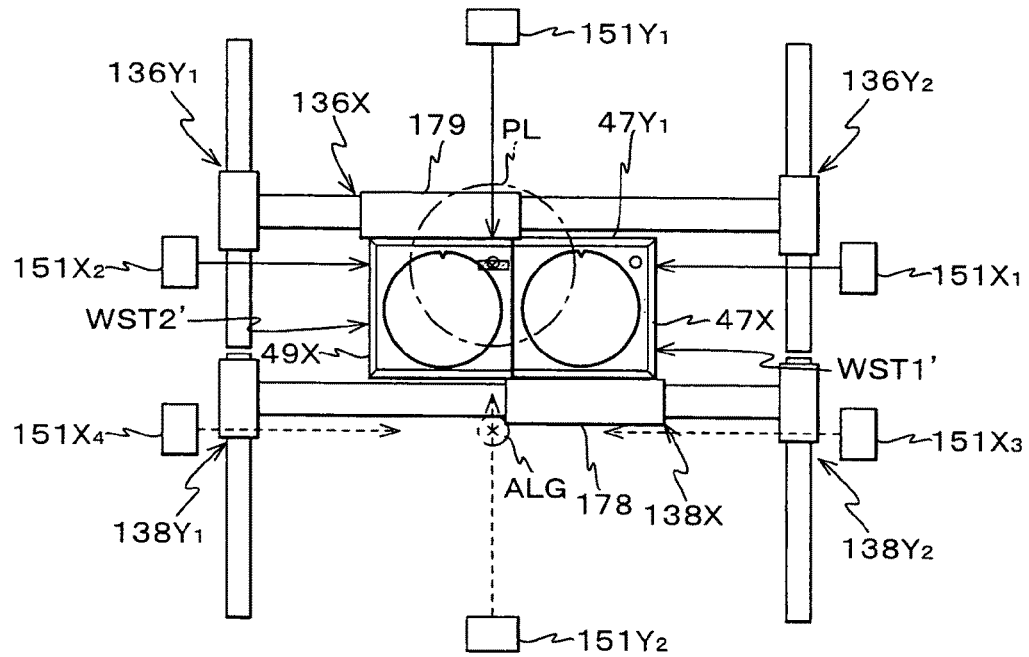
FIG. 15A is a view (No. 3) for describing a drive method of two wafer stages in a parallel processing operation related to the second embodiment.
Figure 15B:
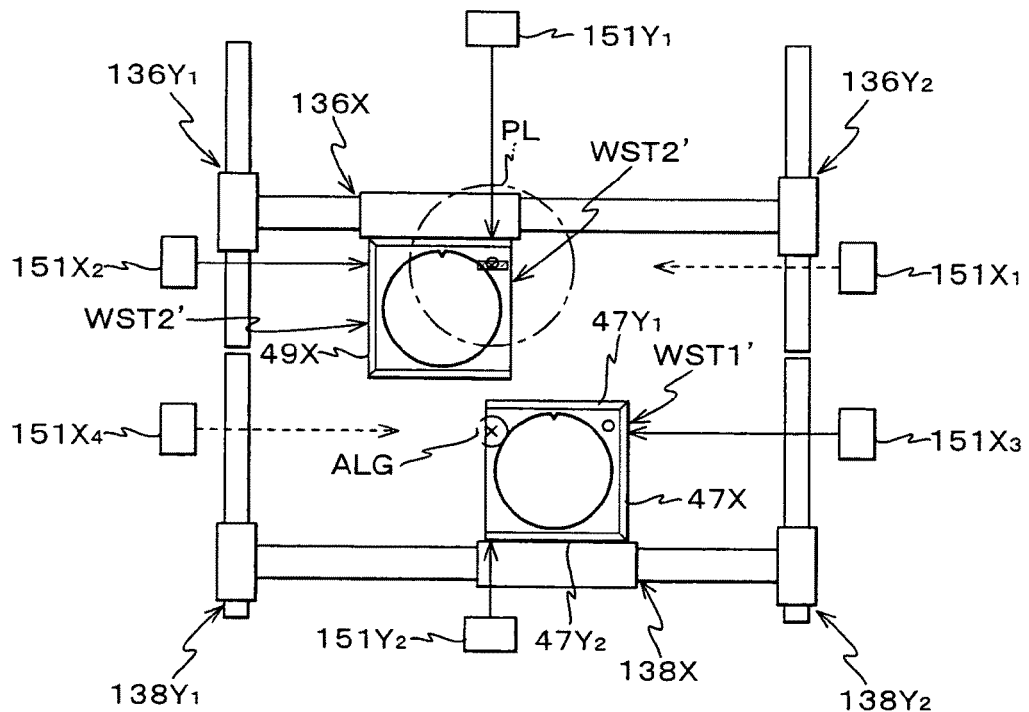
FIG. 15B is a view (No. 3) for describing a drive method of two wafer stages in a parallel processing operation related to the second embodiment.

FIG. 15A shows the state where X mover 179 is driven and moved to a position where it can be connected to wafer stage WST2', while X mover 178 is driven and moved to a position where it can be connected to wafer stage WST1' in the manner described above. Then, main controller 20 connects X mover 179 to wafer stage WST2' via the first connecting mechanism 195, and also connects X mover 178 to wafer stage WST1' via the second connecting mechanism 196. The movement of X movers 178 and 179 in the X direction and the attach/release of wafer stages WST1 and WST2 can be performed without any movement in the Y-axis direction.

After wafer stage WST2' is connected to X mover 179 and wafer stage WST1' is connected to X mover 178 in the manner described above, main controller 20 measures the first fiducial mark in pairs on fiducial mark plate FM2 and the reticle alignment marks in pairs on reticle R, using reticle alignment systems RAa and RAb, while controlling the position of wafer stage WST2' on the second exposure coordinate system previously described. Then, based on the measurement results and the results of the alignment performed earlier, main controller 20 moves wafer stage WST2' to the acceleration starting position for exposing the first shot area on wafer W2. Then, main controller 20 drives and controls wafer stage WST2' via X-axis linear motor 136, and Y-axis linear motors $136Y_1$ and $136Y_2$ in pairs while controlling the position of wafer stage WST2' on the second exposure coordinate system, and the exposure operation of wafer W2 is performed by the step-and-scan method in a similar manner as in the first embodiment previously described.

Meanwhile, main controller 20 moves wafer stage WST1' toward a loading position via Y-axis linear motors $138Y_1$ and $138Y_2$, and X-axis linear motor 136. The position of wafer stage WST1' during this movement is controlled on the first alignment coordinate system. And, at the loading position, after wafer exchange of wafer W1 on wafer stage WST1' that has been exposed and the next wafer subject to exposure has been performed, main controller 20 performs the wafer alignment operation on the new wafer in a similar manner as the description above.

Then, at the point where wafer alignment of wafer stage WST1' has been completed and the exposure operation on wafer stage WST2' has been completed, wafer stage WST1' and wafer stage WST2' follow the paths described above completely backwards, and return to the state shown in FIG. 12.

As is described above, in the exposure apparatus of the second embodiment, the exposure operation of a wafer on one stage and the wafer exchange and wafer alignment operation on the other stage is performed in a simultaneous parallel processing, while performing a switching operation (switching) between wafer stages WST1' and WST2'.

As is obvious from the description so far, in the second embodiment, a stage drive system is configured including wafer stage drive section 124A and main controller 20. Further, a stage unit is configured including the stage drive system and wafer stages WST1' and WST2'. Further, a switching unit is configured including the first connecting mechanism 195, the second connecting mechanism 196, Y-axis linear motors 136Y₁ to 136Y₄, X-axis linear motors 136X and 138X, and main controller 20 for controlling the parts above.

As is described above in detail, according to the exposure apparatus, the stage unit equipped in the exposure apparatus, and the drive method of wafer stages WST1' and WST2' executed by the exposure apparatus in the second embodiment, During transition from the first state in which one of the wafer stages WST1' (or WST2') is positioned at the first area directly under projection optical system PL where the liquid is supplied to the second state in which the other stage WST2' (or WST1') is positioned at the first area, the stage drive system (20, 124A) simultaneously drives wafer stages WST1' and WST2' in the X-axis direction while maintaining the state of wafer stages WST1' and WST2' being in contact in the X-axis direction (the direction that intersects the Y-axis direction in which the first area and the second area close to the position directly under the alignment system ALG are lined) via elastic seal member 93.

Therefore, it becomes possible to perform the transition from the first state in which one of the wafer stages WST1' (or WST2') is positioned at the first area to the second state in which the other stage WST2' (or WST1') is positioned at the first area, in a state where the water (liquid) is supplied (held) in the space between projection optical system PL and the specific wafer stage directly below projection optical system PL (this wafer stage switches from one of the wafer stages to the other wafer stages due to the movement of the stages), without leaking the liquid from the gap between both stages. More specifically, the transition from a state where the water is held in the space between one of the wafer stages and projection optical system PL to a state where the water is held in the space between the other wafer stage and projection optical system PL can be performed during the period after the exposure operation of the wafer on one of the wafer stages via projection optical system PL and the water (liquid) has been completed until the exposure of the wafer on the other wafer stage via projection optical system PL and the water (liquid) is started, without going through the process of fully recovering the water and then supplying the water again. Accordingly, it becomes possible to improve the throughput by reducing the time (that is, to maintain the time around the same level as a typical exposure apparatus (a non-immersion type exposure apparatus) that does not perform immersion exposure) from after the completion of the exposure operation on one of the wafer stages until the beginning of the exposure operation on the other wafer stage. Further, because the water constantly exists on the image plane side of projection optical system PL, for the same reasons as in the first embodiment previously described, the image-forming performance of projection optical system PL and the detection accuracy of the multiple point focal position detection system can be favorably maintained for over a long period of time.

Further, the parallel processing operation of wafer stages WST1' and WST2' can improve the throughput of the exposure apparatus improved when compared with a conventional exposure apparatus that has a single wafer stage and sequentially performs wafer exchange, wafer alignment, and exposure operations using the single wafer stage.

Further, also in the exposure apparatus of the second embodiment, by performing exposure with high resolution and a larger depth of focus than in the air by the immersion exposure, the pattern of reticle R can be transferred with good precision on the wafer.

Further, also in the second embodiment, for the same reasons as in the first embodiment previously described, water leakage from the gap between both stages can be suppressed, and in addition, the impact when wafer stage WST1 and wafer stage WST2 comes into contact can be reduced.

Furthermore, also in the second embodiment, because there are no movable mirrors for the interferometers on the −X side surface of wafer stage WST1' and the +X side surface of wafer stage WST2' as in the first embodiment previously described, the reflection surfaces of the movable mirrors on both wafer stages do not face each other closely together even when both stages are close together in the X-axis direction. This allows not only the position of both stages to be monitored by interferometer system 118A while both wafer stages are driven simultaneously in the X-axis direction, but also prevents the water from adhering to the reflection surface.

In the second embodiment above, the case has been described where three movable mirrors are arranged on both wafer stages WST1' and WST2' and six interferometers are arranged, however, the arrangement of the movable mirrors and the interferometers is not limited to the arrangement described in the second embodiment above. For example, two movable mirrors can be arranged on both of the stages, and an arrangement of the interferometers that allows the position of both wafer stages to be measured using the respective mirrors can be employed.

Further, in the second embodiment above, the shifting by X movers 178 and 179 is performed after the water held under tip lens 91 moves from above one of the stages to the other stage. The shifting by X movers 178 and 179, however, can be performed before the water moves from above one of the stages to the other stage.

A Third Embodiment

Next, a third embodiment of the present invention will be described, referring to FIGS. 16 to 18B. For components or assemblies that have the same or similar arrangement as the first embodiment previously described, the same reference numerals will be used, and the description thereabout will be brief, or entirely omitted. In the exposure apparatus of the third embodiment, only the configuration or the like of the wafer stage unit differ from the first embodiment previously described, and the configuration or the like of other components are similar to the first embodiment previously described. Accordingly, from the viewpoint of avoiding repetition in the following description, the differences will mainly be described.

Figure 16:
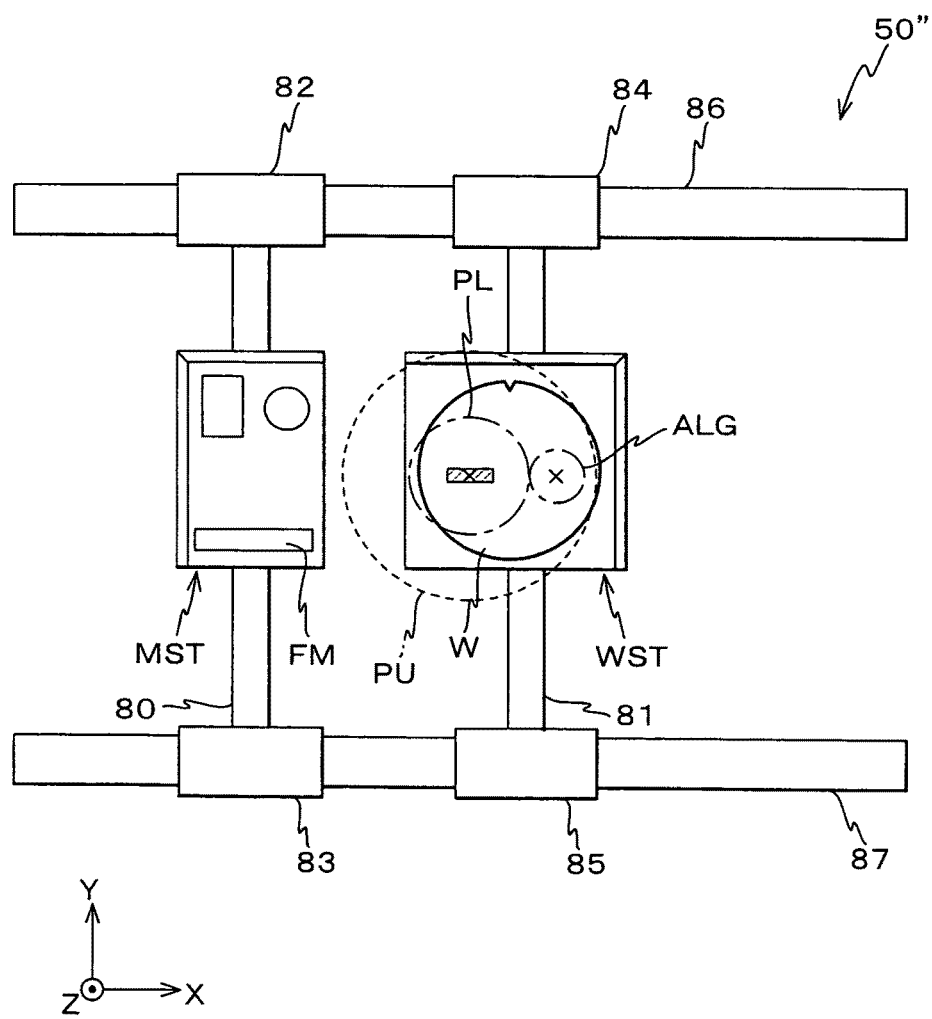
FIG. 16 is a planar view showing a wafer stage unit related to a third embodiment.

Different from wafer stage unit 50 that constitutes the exposure apparatus of the first embodiment previously described, as is shown in FIG. 16, a wafer stage unit 50" of the third embodiment is equipped with a wafer stage WST on which a wafer can be loaded, and a measurement stage MST used only for measurement.

Wafer stage WST and measurement stage MST correspond to wafer stage WST1 and wafer stage WST2 described earlier in the first embodiment, and are driven within a two-dimensional plane by a wafer stage drive section (80 to 87) similar to the drive section in the first embodiment.

Further, in the vicinity of a projection optical system PL (the barrel of projection unit PU), only one alignment system ALG is arranged. Projection unit PU and alignment system ALG are actually arranged in a nested state, as is shown in FIG. 16. More specifically, at least the lower end section of alignment system ALG is positioned on the outer side of the section in the vicinity of the lower end section of projection unit PU whose diameter is smaller than the other sections (the section surrounding the tip lens) on the section below the large diameter section of projection unit PU.

On the upper surface of measurement stage MST, various measurement members are arranged. As such measurement members, for example, a fiducial mark plate on which a plurality of fiducial marks are formed or a sensor that receives illumination light IL via projection optical system PL such as the ones disclosed in, for example, Kokai (Japanese Unexamined Patent Application Publication) No. 5-21314, and the corresponding U.S. Pat. No. 5,243,195 are included. As the sensor, an illumination monitor having a photodetection section of a predetermined area for receiving illumination light IL on the image plane of projection optical system PL whose details are disclosed in Kokai (Japanese Unexamined Patent Application Publication) No. 11-16816, and the corresponding U.S. Patent Application Publication No. 2002/0061469, an uneven illuminance measuring sensor, which has a pinhole-shaped light-receiving section that receives illumination light IL on the image plane of projection optical system PL whose details are disclosed in Kokai (Japanese Unexamined Patent Application Publication) No. 57-117238 and the corresponding U.S. Pat. No. 4,465,368, or an aerial image measuring instrument that measures the light intensity of the aerial image (projected image) of the pattern projected by projection optical system PL whose details are disclosed in Kokai (Japanese Unexamined Patent Application Publication) No. 2002-14005, and the corresponding U.S. Patent Application Publication No. 2002/0041377 can be employed. As long as the national laws in designated states or elected states, to which this international application is applied, permit, the above disclosures of the Kokai publications, the U.S. patent application publications, and the U.S. Patent are incorporated herein by reference. The measurement members installed on measurement stage MST is not limited to the ones referred to above, and various measurement members can be installed when necessary.

In the embodiment, in response to the immersion exposure performed in which wafer W is exposed by exposure light (illumination light) IL via projection optical system PL and water, the illumination monitor, the irregular illuminance measuring sensor, and the aerial image measuring instrument above used for measurement using illumination light IL are to receive illumination light IL via projection optical system PL and the water. Further, only a part of each sensor, such as the optical system, can be arranged on measurement stage MST, or the whole sensor can be disposed on measurement stage MST.

Further, measurement members may or may not have to be installed on wafer stage WST.

Further, in the third embodiment, similar to the first embodiment previously described, an elastic seal member similar to elastic seal member 93 in FIG. 10 is arranged on at least either the −X side surface of wafer stage WST or the +X side surface of measurement stage MST.

Hereinafter, details on a parallel processing operation using wafer stage WST and measurement stage MST equipped in the exposure apparatus of the third embodiment will be described, referring to FIGS. 16 to 18B. In the exposure apparatus related to the third embodiment as well, an interferometer system similar to the one used in the first embodiment is arranged, and the position of wafer stage WST and measurement stage MST is controlled as in the first embodiment. In the description below, in order to prevent redundant explanation, the description related to controlling the position of the stages by the interferometer system will be omitted. And, in the operation below, as is previously described, main controller 20 performs the open/close operation of each valve in liquid supply unit 5 and liquid recovery unit 6 of liquid supply/drainage system 32 according to the moving direction of the stage positioned at the first area directly under projection unit PU, and the space directly under tip lens 91 of projection optical system PL is constantly filled with the water. However, in the description below, for the sake of simplicity, the description related to the control of liquid supply unit 5 and liquid recovery unit 6 will be omitted.

FIG. 16 shows a state where exposure by the step-and-scan method is performed on wafer W in a manner similar to the first embodiment previously described. At this point, measurement stage MST is waiting at a predetermined waiting position where it does not bump into wafer stage WST.

Figure 17A:
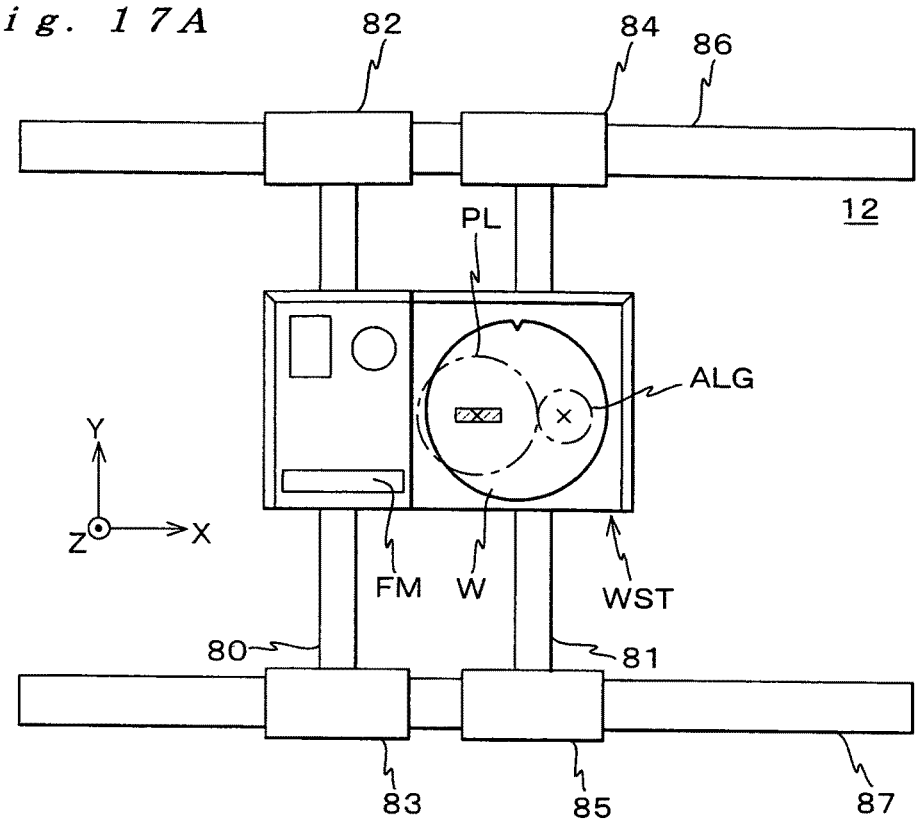
FIG. 17A is a view (No. 1) for describing a drive method of a wafer stage and a measurement stage in a parallel processing operation related to the third embodiment.

Then, on the wafer stage WST side, for example, at the stage where exposure of one lot (25 or 50 wafers in one lot) of wafer W is completed, main controller 20 moves measurement stage MST to the position shown in FIG. 17A. In the state shown in FIG. 17A, measurement stage MST and wafer stage WST are in contact via the elastic seal member.

Next, main controller 20 begins the operation of simultaneously driving both stages WST and MST in the +X direction, while maintaining the positional relation between wafer stage WST and measurement stage MST in the X-axis direction.

Figure 17B:
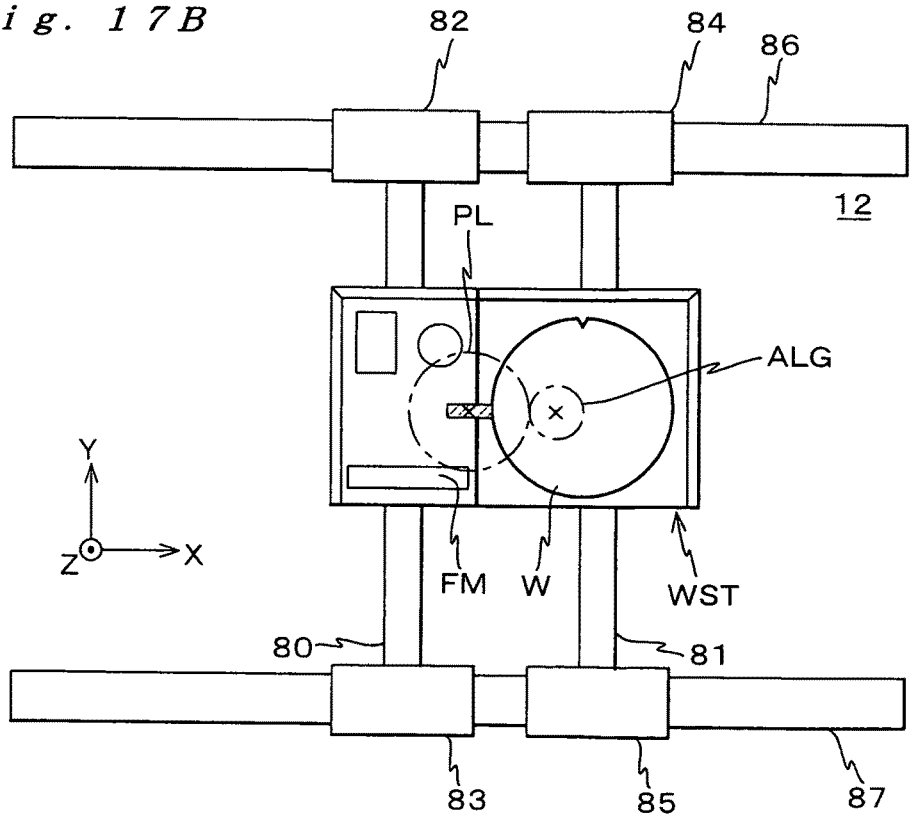
FIG. 17B is a view (No. 1) for describing a drive method of a wafer stage and a measurement stage in a parallel processing operation related to the third embodiment.

When main controller 20 simultaneously drives wafer stage WST and measurement stage MST in the manner described above, in the state shown in FIG. 17A, the water held in the space between tip lens 91 of projection unit PU and wafer W sequentially moves over the following areas along with the movement of wafer stage WST and measurement stage MST to the +X side: wafer W→wafer stage WST→measurement stage MST. During the movement, wafer stage WST and measurement stage MST maintain the positional relation of being in contact via the elastic seal member as in the state shown in FIG. 17A. FIG. 17B shows a state where the water (the immersion area) simultaneously exists on both wafer stage WST and measurement stage MST during the movement above, that is, the state just before the water is passed over from wafer stage WST to measurement stage MST.

Figure 18A:
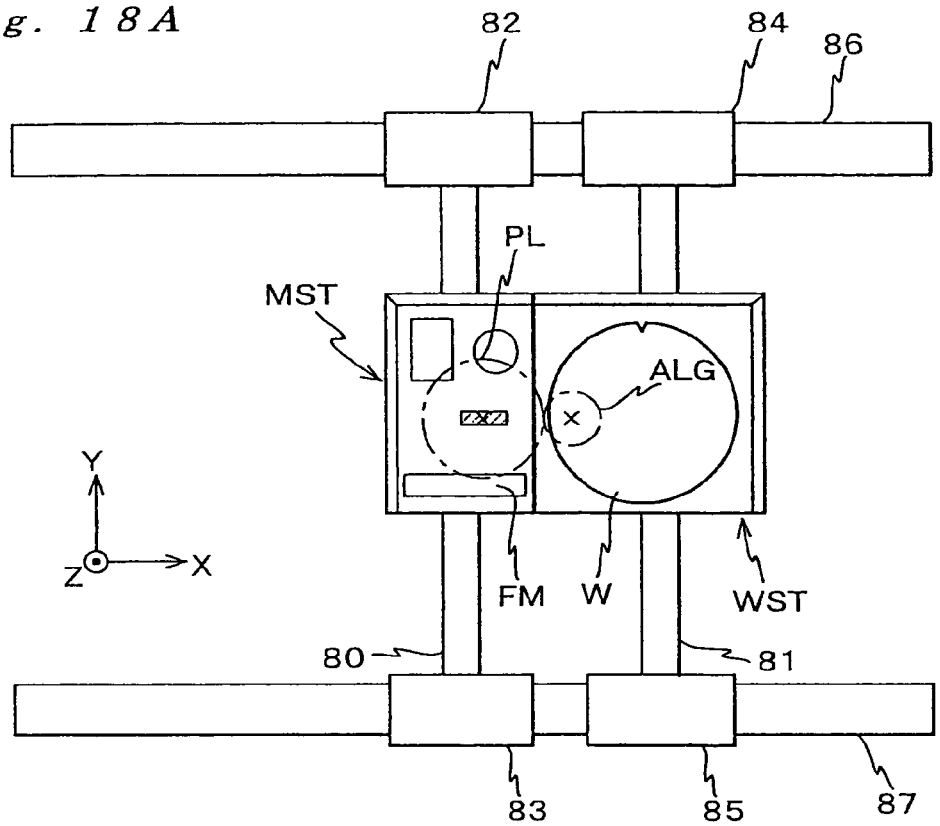
FIG. 18A is a view (No. 2) for describing a drive method of a wafer stage and a measurement stage in a parallel processing operation related to the third embodiment.

When wafer stage WST and measurement stage MST are further driven simultaneously by a predetermined distance in the +X direction from the state shown in FIG. 17B, then it becomes a state where the water is held in between measurement stage MST and tip lens 91 as is shown in FIG. 18A.

Figure 18B:
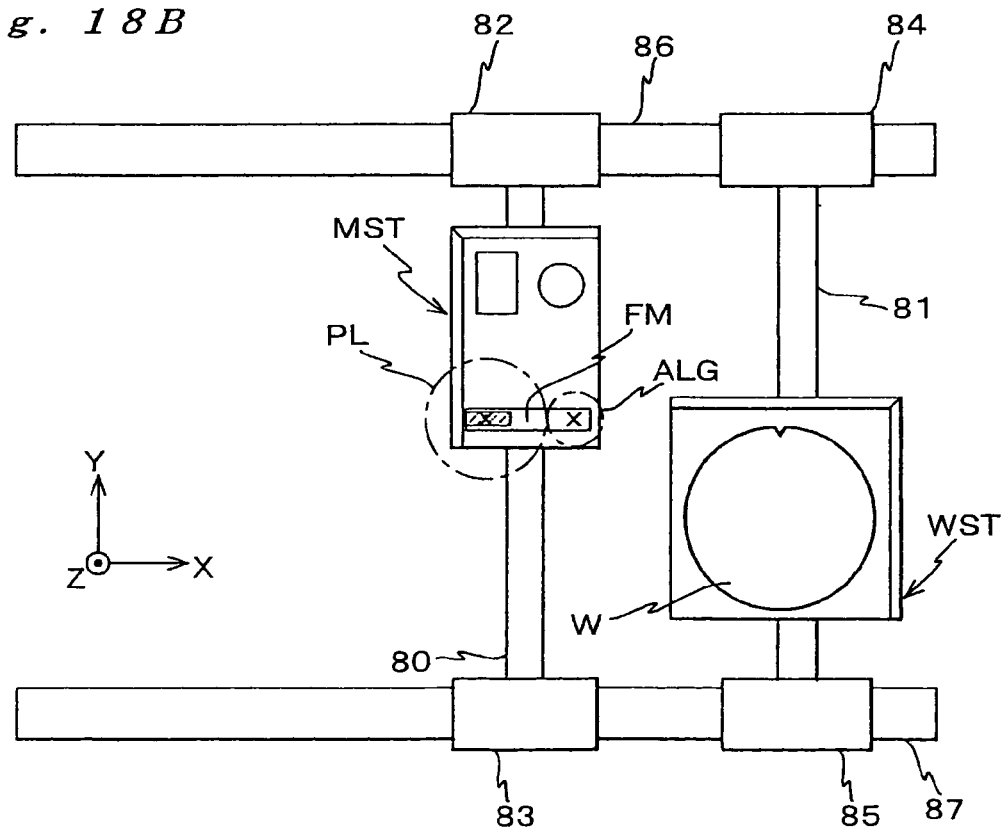
FIG. 18B is a view (No. 2) for describing a drive method of a wafer stage and a measurement stage in a parallel processing operation related to the third embodiment.

Next, main controller 20 moves wafer stage WST to a predetermined wafer exchange position and also exchanges the wafer, and in parallel with this, executes a predetermined measurement using measurement stage MST as necessary. As an example of this measurement, baseline measurement of alignment system ALG performed after the reticle has been exchanged on reticle stage RST can be given. To be more specific, main controller 20 detects a first fiducial mark in pairs on a fiducial mark plate FM arranged on measurement stage MST and the corresponding reticle alignment marks on the reticle at the same time using reticle alignment systems RAa and RAb previously described, and detects the positional relation between the first fiducial mark in pairs and the corresponding reticle alignment marks. And, at the same time, by also detecting second fiducial marks on fiducial mark plate FM with the alignment system ALG, main controller 20 detects the positional relation between the detection center of alignment system ALG and the second fiducial mark. Then, based on the positional relation between the first fiducial mark in pairs and the corresponding reticle alignment marks and the positional relation between the detection center of alignment system ALG and the second fiducial marks obtained above, and the known positional relation between the first fiducial mark in pairs and the second fiducial marks, main controller 20 obtains the distance between the projection center (projection position) of the reticle pattern by projection optical system PL and the detection center (detection position) of alignment system ALG, that is, obtains the baseline of alignment system ALG. FIG. 18B shows this state.

Reticle alignment marks in a plurality of pairs have been formed on the reticle and also the first fiducial mark in a plurality of pairs have been formed on fiducial mark plate FM corresponding to the retile alignment marks, and along with measuring the baseline of alignment system ALG described above, by measuring the relative position of at least two pairs of the first fiducial marks and the corresponding reticle alignment marks using reticle alignment systems RAa and RAb while moving reticle stage RST and measurement stage MST, the so-called reticle alignment is performed.

In this case, mark detection using reticle alignment systems RAa and RAb is performed via projection optical system PL and the water.

Then, at the point where the operations described above on both stages WST and MST have been completed, main controller 20 moves measurement stage MST and wafer stage WST, for example, within the XY plane while maintaining the state in which measurement stage MST and wafer stage WST are in contact via the elastic seal member, and then as is previously described, main controller 20 performs wafer alignment on wafer W that has been exchanged, or in other words, performs detection of the alignment marks on wafer W that has been exchanged with alignment system ALG and computes the position coordinates of a plurality of shot areas on wafer W.

Then, opposite to the operation above, main controller 20 simultaneously drives wafer stage WST and measurement stage MST in the −X direction while maintaining the positional relation of both stages in the X-axis direction, and then withdraws measurement stage MST to a predetermined position after wafer stage WST (wafer W) moves to the position under projection optical system PL, that is, after the immersion area has moved from the surface of measurement stage MST to the surface of wafer stage WST (or wafer W).

Then, main controller 20 performs the exposure operation by the step-and-scan method on wafer W, and sequentially transfers the reticle pattern onto the plurality of shot areas on wafer W. Moving wafer stage WST to the acceleration starting position for exposing each shot area on wafer W is performed based on the position coordinates of the plurality of shot areas on wafer W obtained by the wafer alignment above and on the baseline measured just before moving wafer stage WST.

In the description above, as the measurement operation, the case has been described where baseline measurement has been performed. The measurement, however, is not limited to this, and measurements such as illuminance measurement, irregular illuminance measurement, aerial image measurement and the like can be performed using measurement stage MST, for example, in parallel with the wafer exchange, and the measurement results can be reflected to the exposure of wafer W that will be performed after the measurement. Further, the sensor installed on measurement stage MST is not limited to the ones described above, and for example, a sensor that performs wavefront measurement can also be arranged.

Further, in the third embodiment described above, the case has been described where wafer stage WST and measurement stage MST are moved while in contact when exposure of one lot of wafer W has been completed, and the water is held between projection optical system PL and measurement stage MST. However, it is a matter of course that the operation above should be performed each time the wafer is exchanged so as to hold the water between projection optical system PL and measurement stage MST. Further, measurement of the baseline or the like can be performed when exposure of one lot has been completed as is previously described, or the measurement can be performed each time the wafer is exchanged or after the exposure of a predetermined number of wafers has been completed.

As is obvious from the description so far, in the third embodiment, a wafer stage drive section (80 to 87) configures at least a part of a stage drive system as in the first embodiment. Further, the stage drives system and wafer stage WST and measurement stage MST configures at least a part of a stage unit.

As is described above, according to the exposure apparatus and the stage unit equipped in the exposure apparatus of the third embodiment, during a transition is performed from a first state where wafer stage WST (or measurement stage MST) positioned at a first area directly under projection unit PU to which the liquid (water) is supplied to a second state where measurement stage MST (or wafer stage WST) is positioned at the first area, the stage drive system described above simultaneously drives wafer stage WST and measurement stage MST in the X-axis direction while maintaining the state where both stages are in contact in the X-axis direction via the elastic seal member. Therefore, it becomes possible to perform the transition from the first state where one of the stages is positioned at the first area to a second state where the other stage is positioned at the first area in a state where the water continues to be supplied to the space between projection optical system PL and the specific stage (this stage switches from one of the stages to the other stage with the movement) directly below projection optical system PL without leaking any water from the gap between both stages. More specifically, the transition from a state where the water is held in the space between wafer stage WST and projection optical system PL to a state where the water is held in the space between measurement stage MST and projection optical system PL can be performed during the period after the exposure operation on the wafer stage WST side via projection optical system PL and the water (liquid) has been completed until the measurement on the measurement stage MST side directly under projection optical system PL is started, without going through the process of fully recovering the water and then supplying the water again. Further, the same applies to after the measurement with measurement stage MST has been completed until the exposure by wafer stage WST begins.

Accordingly, it becomes possible to improve the throughput by reducing (that is, to maintain the time around the same level as a typical exposure apparatus (a non-immersion type exposure apparatus) that does not perform immersion exposure) the time after the exposure operation on the wafer stage WST side has been completed until the measurement on the measurement stage MST side is started, and the time after the measurement with measurement stage MST has been completed until the exposure by wafer stage WST begins. Further, because the water (liquid) constantly exists on the image plane side of projection optical system PL, generation of water stains (water marks) previously described can be effectively prevented.

Further, by performing exposure with high resolution and a larger depth of focus than in the air by the immersion exposure, the pattern of reticle R can be transferred with good precision on the wafer, and for example, transfer of a fine pattern that has a device rule of around 70 to 100 nm can be achieved.

Further, because the various measurements can be performed using the measurement members installed on measurement stage MST each time the wafer has been exchanged, and the measurement results can be reflected on the exposure operation, the exposure of the wafer can be performed constantly in a state adjusted with high precision.

In the case illumination light IL is not used in the measurement operation performed using measurement stage MST, it is also possible to perform the measurement operation on the measurement stage side in parallel with the exposure operation on the wafer stage WST side.

Further, in the third embodiment above, wafer alignment is performed in a state where measurement stage MST and wafer stage WST are in contact via the elastic seal member. However, wafer alignment can also be performed by moving wafer stage WST under projection optical system PL (and alignment system ALG) in a state where the two stages are in contact before wafer alignment is performed, and then performing wafer alignment after the withdrawal of measurement stage MST.

Further, in the third embodiment described above, the first fiducial marks and the second fiducial marks on fiducial mark plate FM can be measured at the same time. However, after measuring one of the first fiducial marks or the second fiducial marks, measurement stage MST can be moved in a state where the water is held on measurement stage MST so as to measure the other mark.

Figure 19A:
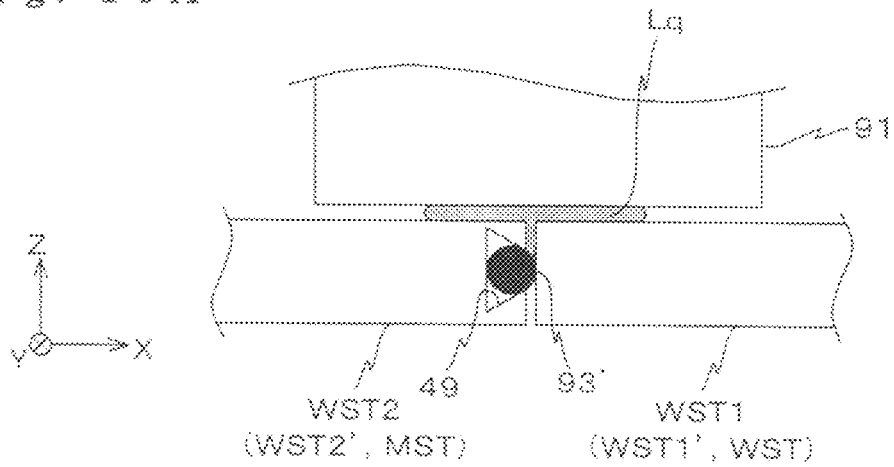
FIG. 19A is a view for describing a modified example of a suppressing member.

As the elastic seal member used in the first to third embodiments described above, as is shown in FIG. 19A, an elastic seal member 93' can be used, which is attached in an embedded state to a groove 49 whose sectional shape is a rough trapezoid and is formed on the +X side surface of one of the stages (in this case, stage WST2 (WST2', MST)). This arrangement also allows the same effect to be obtained as in each of the embodiments above. The arrangement shown in FIG. 19A can be employed not only in one of the stages but also in both stages.

Figure 19B:
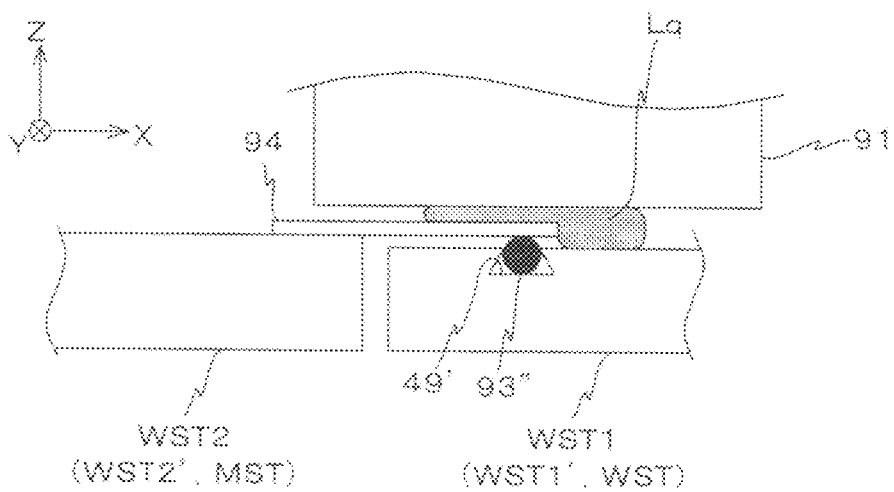
FIG. 19B is a view for describing a modified example of a suppressing member.

Further, as is show in FIG. 19B, a groove 49' whose sectional shape is a rough trapezoid can be formed on the +X side surface of one of the stages (in this case, stage WST1 (WST1', WST)) and an elastic seal member 93" can be attached in an embedded state to groove 49', and a flat plate 94 can be arranged on the edge of the upper surface of the other stage (in this case, stage WST2 (WST2', MST)) on the +X side. In this case, in a state where both stages are close together, the water can be kept from leaking from between the stages by flat plate 94 coming into contact with elastic seal member 93", as is shown in FIG. 19B.

Figure 19C:
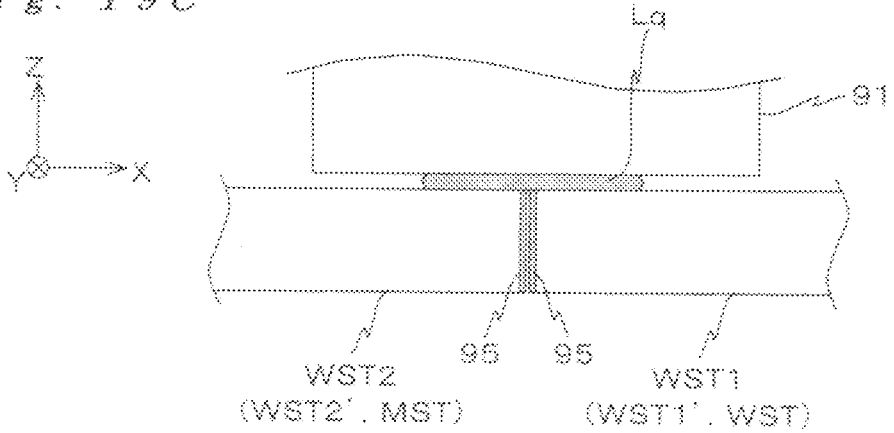
FIG. 19C is a view for describing a modified example of a suppressing member.

Further, as is shown in FIG. 19C, the entering and the leakage of the water into and from the gap between both stages can be prevented, for example, by applying a water-repellent coating 95 by Teflon (trademark) or the like on the side surface of both of the stages facing each other. By this operation, because a non-contact state is maintained between both stages, there is no risk of stage deformation, decrease in position control accuracy or the like, due to the contact of both stages.

In the first to third embodiments described above, the elastic seal member is arranged, however, the elastic seal member or other suppression members for suppressing leakage does not necessarily have to be arranged. In such a case, both stages can be in contact directly while the transition is made from a state where one of the stages is located directly under projection unit PU to a state where the other stage is located directly under projection unit PU. Further, although it depends on the material of both stages, the surface state and/or the surface shape of the stages, the type of liquid and the like, in the case the liquid does not leak due to the surface tension of the liquid during the transition in a state where both stages are close together (e.g. the distance between the stages is 2 mm or under), the water-repellent coating does not have to be applied. The point is that the transition of both stages should be made while maintaining the positional relation, which keeps the liquid from leaking from between the stages.

Further, the leakage of the water (liquid) into the gap between the stages during the transition may be permissible if the leakage is only a small amount. Therefore, the distance between both stages during the transition can be decided taking into consideration the permissible amount of leakage, as well as the material of both stages, the surface state and/or the surface shape of the stages, the type of liquid and the like Further, in the first to third embodiments described above, reflection surfaces of the movable mirrors are not formed on the contact surfaces of the two stages. However, this is not an indispensable matter, and as long as the leakage of the water from the gap in the two stages can be prevented, a reflection surface of the movable mirrors can be formed on the contact surface of at least one of the stages. As such an embodiment, for example, a fourth embodiment in the description below can be considered.

A Fourth Embodiment

Next, a fourth embodiment of the present invention will be described, referring to FIGS. 20 to 23B. For components or assemblies that have the same or similar arrangement as the third embodiment previously described, the same reference numerals will be used, and the description thereabout will be brief, or entirely omitted. In the exposure apparatus of the fourth embodiment, only the configuration or the like of the wafer stage unit differ from the third embodiment previously described, and the configuration or the like of other parts are similar to the third embodiment previously described. Accordingly, from the viewpoint of avoiding repetition in the following description, the differences will mainly be described.

Figure 20:
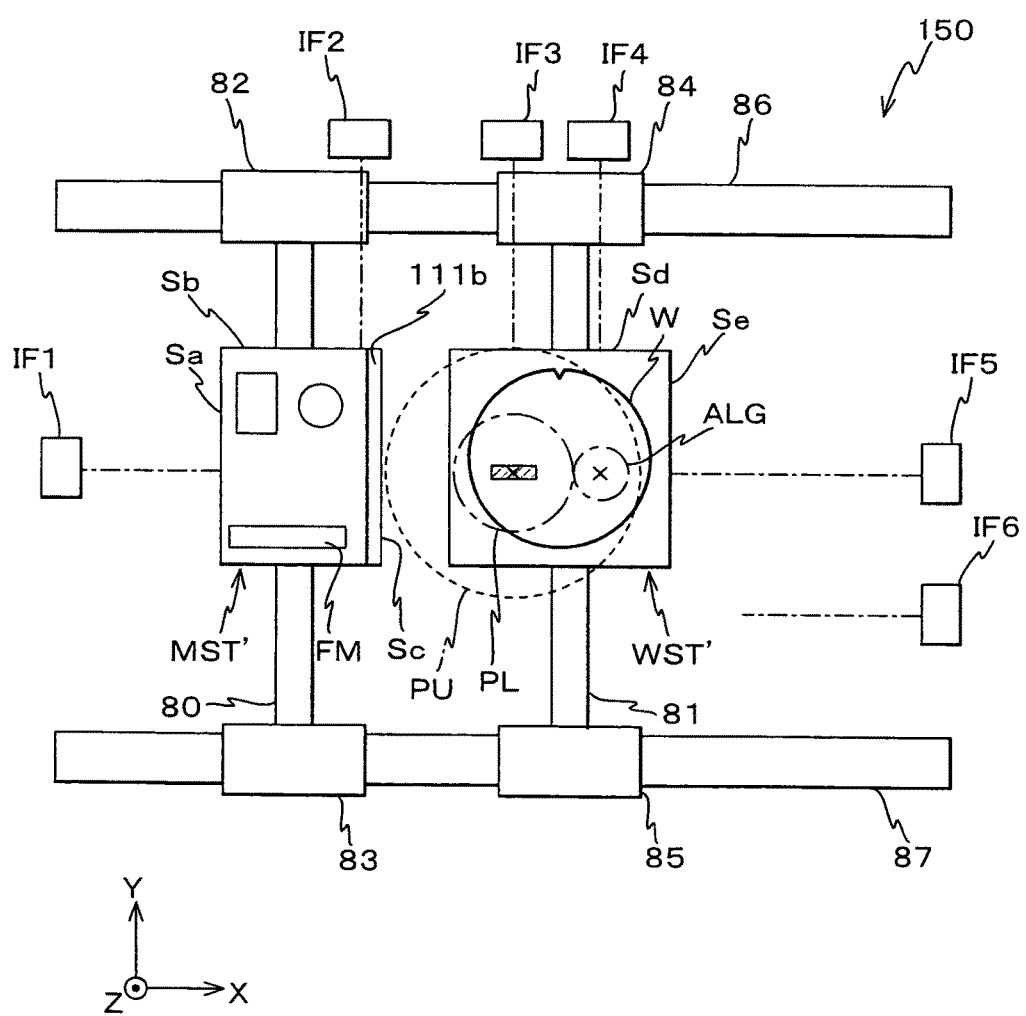
FIG. 20 is a planar view showing a wafer stage unit related to a fourth embodiment.

As is shown in FIG. 20, a wafer stage unit 150 of the fourth embodiment is equipped with a wafer stage WST' on which a wafer can be mounted, a measurement stage MST' used only for measurement, and an interferometer system including six laser interferometers (hereinafter simply referred to as 'interferometers') IF1 to IF6.

Figure 21:
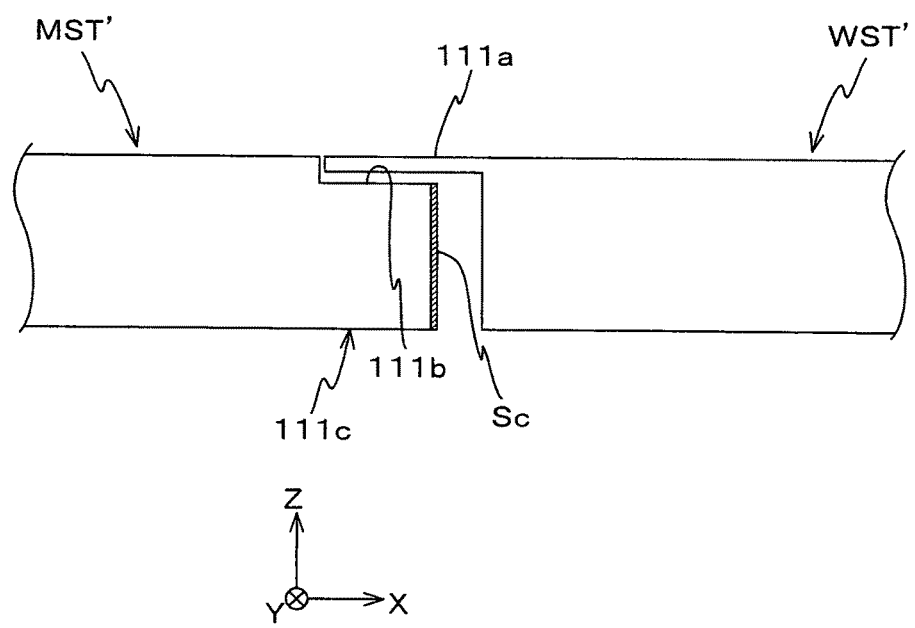
FIG. 21 is a view showing a state where a wafer stage and a measurement stage are close together.

As is shown in FIG. 21, the point where wafer stage WST' has a plate shaped canopy section 111a, which is a part of the upper end section of wafer stage WST' on the −X side (the side facing measurement stage MST') that projects out, and the point where reflection surfaces formed on an edge surface Se on the +X side and an edge surface Sd on the +Y side are arranged instead of the movable mirrors are different from wafer stage WST related to the third embodiment described above, however, other sections are configured in the same manner as wafer stage WST. Further, on the upper surface of wafer stage WST' in a state where wafer W is mounted, the entire surface is to be flush (in-plane) including the surface of wafer W and canopy or overhang section 111a.

As is shown in FIG. 21, the point where measurement stage MST' has a projected section 111c arranged on the +X side (the side facing wafer stage WST'), which has a step section 111b on the upper edge section that can be engaged to the tip of canopy section 111a via a predetermined clearance, and the point where reflection surfaces formed on an edge surface Sa on the −X side, an edge surface Sb on the +Y side, and an edge surface Sc (the edge surface of projected section 111c on the +X side) on the +X side are arranged instead of the movable mirrors are different from measurement stage MST related to the third embodiment described above, however, other sections are configured in the same manner as measurement stage MST. In this case, in a state where canopy section 111a of wafer stage WST' and step section 111b are engaged as is shown in FIG. 21, a completely flat surface can be formed as a whole, by the upper surface of wafer stage WST' and the upper surface of measurement stage MST'.

Wafer stage WST' and measurement stage MST' in the embodiment are driven within a two-dimensional plane by a wafer stage drive section (80 to 87), similar to wafer stage WST and measurement stage MST in the third embodiment previously described.

As is shown in FIG. 20, the interferometer system has three Y-axis interferometers, IF3, IF4, and IF2 whose measurement axes are each parallel to the Y-axis. The measurement axes respectively pass through the projection center (optical axis AX) of projection optical system PL, the detection center of alignment system ALG, and the position a predetermined distance away from the projection center of optical system PL in the −X direction. The interferometer system also has two X-axis interferometers, IF1 and IF5 whose measurement axes are each parallel to the X-axis. These measurement axes also respectively join the detection center of projection optical system PL (optical axis AX) and the detection center of alignment system ALG. The interferometer system also has another X-axis interferometer, IF6 whose measurement axis is also parallel to the X-axis and passes the position a predetermined distance away from the projection center of projection optical system PL in the −Y direction.

When wafer stage WST' is located in an area in the vicinity of the position directly under the optical axis of projection optical system PL (a first area), and exposure of the wafer on wafer stage WST' is to be performed, the position of wafer stage WST' is controlled by X-axis interferometer IF5 and Y-axis interferometer IF3. In the description below, the coordinate system set by the respective measurement axes X-axis interferometer IF5 and Y-axis interferometer IF3 will be referred to as the exposure coordinate system.

Further, when wafer stage WST' is in an area in the vicinity of the position directly under the detection center of alignment system ALG (a second area), and detection of alignment marks formed on the wafer on wafer stage WST' is to be performed, such as wafer alignment or the like, the position of wafer stage WST' is controlled by X-axis interferometer IF5 and Y-axis interferometer IF4. In the description below, the coordinate system set by the respective measurement axes X-axis interferometer IF5 and Y-axis interferometer IF4 will be referred to as the alignment coordinate system.

Further, when measurement stage MST' is in an area in the vicinity of a waiting position as is shown in FIG. 20, the position of measurement stage MST' is controlled by X-axis interferometer IF1 and Y-axis interferometer IF2. In the description below, the coordinate system set by the respective measurement axes X-axis interferometer IF1 and Y-axis interferometer IF2 will be referred to as the waiting coordinate system.

X interferometer IF6 measures the position of wafer stage WST' in the X-axis direction during wafer exchange or the like, after the exposure of the wafer has been completed.

As is obvious from the description above, in the embodiment, X-axis interferometers IF5 and IF1 are both multi-axis interferometers that have at least three measurement axes that are separate in the Y-axis direction and the Z-axis direction, and the output values of each optical axis can be measured independently. Accordingly, with these X-axis interferometers IF5 and IF1, other than measuring the position of wafer stage WST' and measurement stage MST' in the X-axis direction, the rotation amount around the Y-axis (rolling amount) and the rotation amount around the Z-axis (yawing amount) can also be measured. Further, X-axis interferometer IF6 can be a multi-axis interferometer, or it can be an interferometer with a single optical axis.

Further, Y-axis interferometers, IF3, IF4, and IF2 described above are multi-axis interferometers, for example, that have two measurement axes that are separate in the Z-axis direction, and the output values of each optical axis can be measured independently. Accordingly, with these Y-axis interferometers IF3, IF4, and IF2, other than measuring the position of wafer stage WST' and measurement stage MST' in the Y-axis direction, the rotation amount around the X-axis (pitching amount) can also be measured.

In the description below, details on a parallel processing operation using wafer stage WST' and measurement stage MST' equipped in the exposure apparatus of the fourth embodiment will be described, referring to FIGS. 20 to 23B. During the operation below, main controller 20 performs the open/close operation of each valve in liquid supply unit 5 and liquid recovery unit 6 of liquid supply/drainage system 32 according to the moving direction of the stage positioned at the first area directly under projection unit PU as is previously described, and the space directly under tip lens 91 of projection optical system PL is constantly filled with the water. However, in the description below, for the sake of simplicity, the description related to the control of liquid supply unit 5 and liquid recovery unit 6 will be omitted.

FIG. 20 shows a state where exposure by the step-and-scan method is performed on wafer W on wafer stage WST' in a manner similar to the first embodiment previously described. At this point, measurement stage MST' is waiting at a predetermined waiting position where it does not bump into wafer stage WST'. In this case, main controller 20 controls the position of measurement stage MST' on the waiting coordinate system described above, while controlling the position of wafer stage WST' on the exposure coordinate system described above.

Figure 22A:
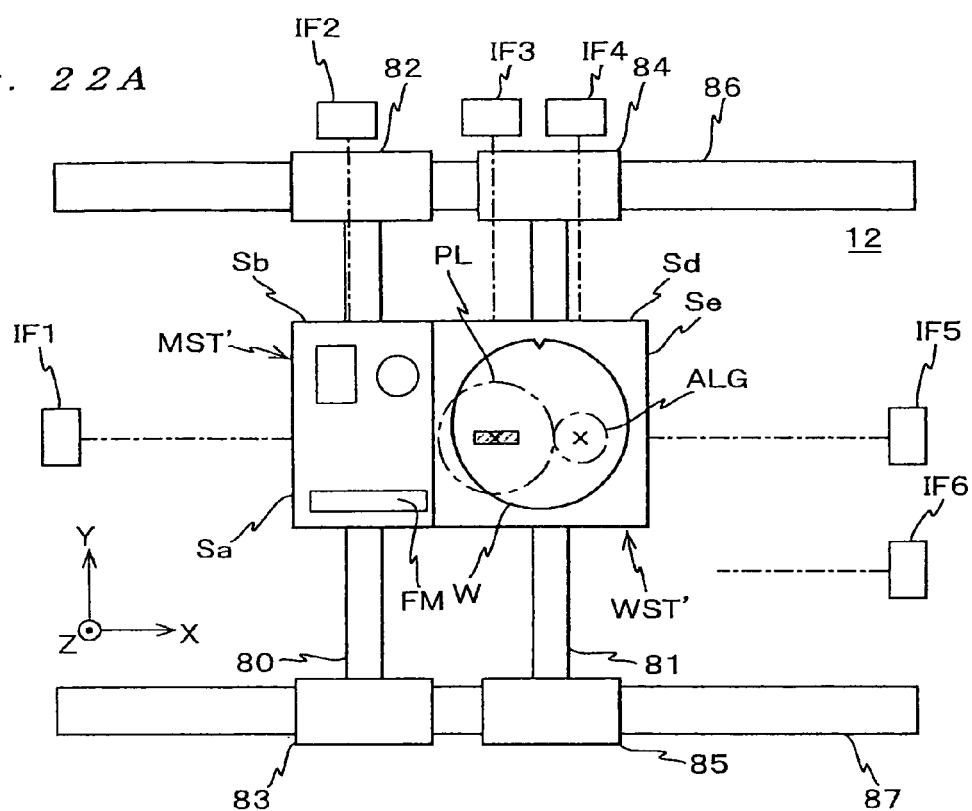
FIG. 22A is a view (No. 1) for describing a drive method of a wafer stage and a measurement stage in a parallel processing operation related to the fourth embodiment.

Then, on the wafer stage WST' side, for example, at the stage where exposure of one lot (25 or 50 wafers in one lot) of wafer W is completed, main controller 20 moves measurement stage MST' to the position shown in FIG. 22A. In the state shown in FIG. 22A, the edge surface of canopy section 111a on the −X side arranged in wafer stage WST' and the surface of step section 111b on the −X side in measurement stage MST' are in a state close together (or in contact), as is shown in FIG. 21.

In this case, because the width of canopy section 111a of wafer stage WST' in the X-axis direction is set wider than the width of step section 111b of measurement stage MST' in the X-axis direction, this can prevent the minor-polished edge surface (reflection surface) Sc of measurement stage MST' from coming into contact with the edge surface of wafer stage WST' on the −X side excluding canopy section 111a (the section of the edge surface on the −X side below canopy section 111a).

Next, main controller 20 starts to simultaneously drive both wafer stage WST' and measurement stage MST' in the +X direction, while maintaining the positional relation between wafer stage WST' and measurement stage MST' in the X-axis direction.

Figure 22B:
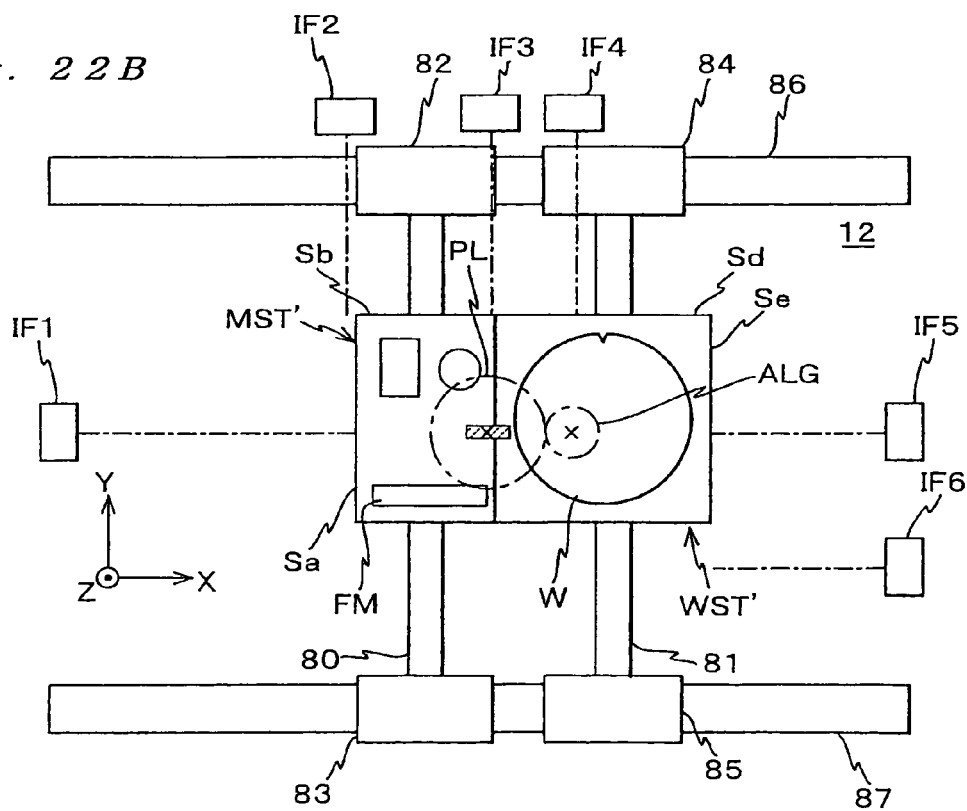
FIG. 22B is a view (No. 1) for describing a drive method of a wafer stage and a measurement stage in a parallel processing operation related to the fourth embodiment.

When main controller 20 simultaneously drives both wafer stage WST' and measurement stage MST' in the manner described above, in the state shown in FIG. 22A, the water that has been held in the space between tip lens 91 of projection unit PU and wafer W sequentially moves over the following areas along with the movement of wafer stage WST' and measurement stage MST' to the +X side: wafer W→wafer stage WST'→measurement stage MST'. During the movement, wafer stage WST' and measurement stage MST' maintain the positional relation shown in FIG. 21. FIG. 22B shows a state where the water (the immersion area) simultaneously exists on both wafer stage WST' and measurement stage MST' during the movement above, that is, the state just before the water is passed over from wafer stage WST' to measurement stage MST'. In this state as well, wafer stage WST' and measurement stage MST' maintain the positional relation shown in FIG. 21. In the state shown in FIG. 21, the gap between the edge of canopy section 111a of wafer stage WST' and the edge of the upper surface of measurement stage MST' facing the edge of the canopy section is maintained at 0.3 mm or under, which makes it possible to keep the water from entering the gap in the case the water moves over the gap. In this case, making the upper surface of canopy section 111a and the upper surface of measurement stage MST' water repellent (contact angle to the liquid should be 80° or over) can prevent the water from entering the gap more securely. During this movement, the interferometer beam from interferometer IF2 will not be incident on edge surface Sb of measurement stage MST' any longer. However, substantially at the same time (immediately before or directly after), the interferometer beam from interferometer IF3 will start to irradiate edge surface Sb of measurement stage MST', and at this point, main controller 20 executes the reset (or preset) of interferometer IF3.

When wafer stage WST' and measurement stage MST' are driven simultaneously further in the +X direction by a predetermined distance from the state shown in FIG. 22B, the water will then be held in the space between measurement stage MST' and tip lens 91, as is shown in FIG. 23A.

Next, in parallel with driving wafer stage WST' in the +X direction and the −Y direction, main controller 20 drives measurement stage MST' in the +X direction and the +Y direction. During the drive, the interferometer beam from interferometer IF5 will not be incident on edge surface Se of wafer stage WST' any longer, and the interferometer beam from interferometer IF6 will begin to irradiate edge surface Se. Therefore, main controller 20 presets interferometer IF6 in a state where both interferometer beams irradiate edge surface Se, using the measurement values of interferometer IF5. Meanwhile, on edge surface Sb of measurement stage MST', the interferometer beams from interferometer IF4 will be incident, therefore, main controller 20 presets interferometer IF4 at some point where both interferometer beams irradiate edge surface Sb, using the measurement values of interferometer IF3. Further, on edge surface Sc of measurement stage MST', the interferometer beams from interferometer IF5 will be incident; therefore, main controller 20 executes the reset (or preset, taking into consideration the measurement values of interferometer IF1) of interferometer IF5.

Then, in the manner described above, wafer stage WST' and measurement stage MST' are arranged as is shown in FIG. 23B where wafer stage WST' is located at a predetermined wafer exchange position and measurement stage MST' is positioned directly under projection optical system PL. As for wafer stage WST', when the interferometer beams of interferometer IF4 stops irradiating wafer stage WST', the position of wafer stage WST' in the Y-axis direction cannot be measured by the interferometer system. However, the Y position of wafer stage WST' can be controlled by a linear encoder or the like (not shown). Or an interferometer can be added that can measure the position of wafer stage WST' in the Y-axis direction when wafer stage WST' is at the wafer exchange position. In the state shown in FIG. 23B, wafer exchange is performed on the wafer stage WST' side while in parallel with the exchange, a predetermined measurement is executed on the measurement stage MST' side when necessary. As such measurement, for example, baseline measurement of alignment system ALG performed after the reticle has been exchange on reticle stage RST will be performed, as in the third embodiment described above. In this case, the position of measurement stage MST' in the X-axis direction is preferably measured using interferometer IF5, instead of using interferometer IF1. By performing baseline measurement while measuring the position of measurement stage MST' using interferometer IF5, which measures the position of wafer stage WST' in the X-axis direction during exposure of wafer W, alignment (position setting) of wafer W based on the baseline (amount) can be performed with high precision.

Incidentally, the reticle alignment previously described is also performed with the baseline measurement of alignment system ALG, as in the third embodiment described above.

Then, at the stage where the operations described above on both stages WST' and MST' have been completed, main controller 20, for example, makes measurement stage MST' and wafer stage WST' return to the state shown in FIG. 23A, drives measurement stage MST' and wafer stage WST' within the XY plane while maintaining the state in which wafer state WST' and measurement stage MST' are close together (or in contact), performs wafer alignment by alignment system ALG on wafer W that has been exchanged, that is, performs detection of alignment marks by alignment system ALG on wafer W that has been exchanged, and computes the position coordinates of a plurality of shot areas on wafer W. During this wafer alignment, the position of wafer stage WST' is controlled on the alignment coordinate system previously described.

Then, main controller 20 simultaneously drives wafer stage WST' and measurement stage MST' in the −X direction, which is opposite to the description earlier, while maintaining the positional relation between both stages, and after moving wafer stage WST' (wafer W) to the position below projection optical system PL, main controller 20 withdraws measurement stage MST' to a predetermined position. Also during this operation, the interferometer system performs preset or the like of the interferometers in a reversed order of the description above.

Then, as in each of the embodiments described above, main controller 20 performs the exposure operation by the step-and-scan method on wafer W, and sequentially transfers the reticle pattern onto the plurality of shot areas on wafer W.

In the description above, the case has been described where baseline measurement is performed as the measurement operation. However, the present invention is not limited to this, and illuminance measurement, uneven illuminance measurement, aerial image measurement and the like can be performed as in the third embodiment above. Further, as in the third embodiment, various measurements can be performed when necessary each time a predetermined number of wafers (e.g. one) have been exchanged, without limiting the measurement until after exposure of one lot has been completed. Further, measurement stage MST' can have a wavefront aberration measuring unit installed, and the wavefront aberration of projection optical system PL can be measured by the measuring operation. Or, an observation camera can be arranged on measurement stage MST' so as to check the state of the immersion area formed on the image plane side of projection optical system PL.

Further, the detection of the alignment marks of wafer W that has been exchanged by alignment system ALG does not necessarily have to be performed while maintaining the predetermined neighboring state of wafer stage WST' and measurement stage MST', and the detection of the alignment marks can be started after the stages move away from each other, or the detection of a part of the alignment marks can be performed in a state where both stages are close together and the detection of the remaining alignment marks can be performed in a state where both stages are separated.

As is described above, according to the exposure apparatus of the fourth embodiment, when a transition is performed from a first state where wafer stage WST' (or measurement stage MST') positioned at a first area directly under projection unit PU to which the liquid (water) is supplied to a second state where measurement stage MST' (or wafer stage WST') is positioned at the first area, a stage drive system (configured including wafer stage drive section (80 to 87)) drives wafer stage WST' and measurement stage MST' so that canopy section 111*a* on the wafer stage WST' side and step section 111*b* on the measurement stage MST' side move into an engaged state, and a completely flat surface is achieved by the upper surface of wafer stage WST' and measurement stage MST'. Therefore, it becomes possible to perform the transition from the first state where one of the stages is positioned at the first area to the second state where the other stage is positioned at the first area, in a state where the water is held in the space between projection optical system PL and at least one of the stages (this stage switches from one of the stages to the other stage with the movement) directly below projection optical system PL, without leaking any water from the gap between both stages. More specifically, the transition from a state where the water is held in the space between wafer stage WST' and projection optical system PL to a state where the water is held in the space between measurement stage MST' and projection optical system PL can be performed during the period after the exposure operation on the wafer stage WST' side via projection optical system PL and the water (liquid) has been completed until the measurement on the measurement stage MST' side directly under projection optical system PL is started, without going through the process of fully recovering the water and then supplying the water again. Further, the same applies to after the measurement with measurement stage MST' has been completed until the exposure by wafer stage WST' begins.

Accordingly, it becomes possible to improve the throughput by reducing (that is, to maintain the time around the same level as a typical exposure apparatus (a non-immersion type exposure apparatus) that does not perform immersion exposure) the time after the exposure operation on the wafer stage WST' side has been completed until the measurement on the measurement stage MST' side is started, and the time after the measurement with measurement stage MST' has been completed until the exposure by wafer stage WST' begins. Further, because the water (liquid) constantly exists on the image plane side of projection optical system PL, generation of water stains (water marks) previously described can be effectively prevented.

Further, in the fourth embodiment, because canopy section 111*a* is arranged in wafer stage WST' and step section 111*b* that engages with canopy section 111*a* is arranged in measurement stage MST', even if a reflection surface is arranged on edge surface Sc of measurement stage MST' on the side where the two stages face each other, the transition from a state where the water is held in the space between wafer stage WST' and projection optical system PL to a state where the water is held in the space between measurement stage MST' and projection optical system PL (or vice versa) can be performed without any serious problems.

Further, by performing exposure with high resolution and a larger depth of focus than in the air by the immersion exposure, the pattern of reticle R can be transferred with good precision on the wafer, and for example, transfer of a fine pattern that has a device rule of around 70 to 100 nm can be achieved.

In the fourth embodiment above, the case has been described where canopy section 111*a* is arranged on the wafer stage WST' side and projected section 111*c* having step section 111*b* is arranged on the measurement stage MST' side. The present invention, however, is not limited to this, and the projected section having the step section can be arranged on the wafer stage WST' side and the canopy section can be arranged on the measurement stage MST' side. Further, in the fourth embodiment above, the case has been described where the edge section of measurement stage MST' on the +X side is made of projected section 111*c*, which is a single part that has step section 111*b* formed on its upper edge section. This is because edge surface Sc on the +X side of projected section 111*c* had to be a reflection surface, but this arrangement does not necessarily have to be employed. For example, if the reflection surface does not have to be formed, the section corresponding to 111*c* only has to have a step section on the upper edge section that can engage with canopy section 111*a* via predetermined clearance, and the remaining section can take any shape. Similarly, as long as canopy section 111*a* is arranged on the upper edge section on the wafer stage WST' side, the remaining section can take any shape.

Further, in the fourth embodiment above, canopy section 111*a* is integrally formed with wafer stage WST', however, canopy section 111*a* can be made from a plate member detachable from the main body of wafer stage WST'.

Further, an arrangement may be employed where an elastic seal member is arranged at a position where the elastic seal member comes between canopy section 111*a* and step section 111*b* in a state where canopy section 111*a* and step section 111*b* are engaged. More specifically, for example, by arranging an elastic seal member on the edge section of canopy section 111*a* on the −X side, the water leakage between wafer stage WST' and measurement stage MST' can be completely prevented. Further, by arranging the elastic seal member, in the case wafer stage WST' and measurement stage MST' come into contact with each other, the shock can be reduced. As a matter of course, the elastic seal member can be arranged on the measurement stage side, or instead of the seal member, a water-repellent coating can be applied to at least either the wafer stage or the measurement stage, at a position where both stages face each other.

The concept of arranging the canopy section in one of the stages and arranging a step section in the other stage in the fourth embodiment described above can be employed not only when the two stages are a measurement stage and a wafer stage, but also when the two stages are both wafer stages.

Figure 24:
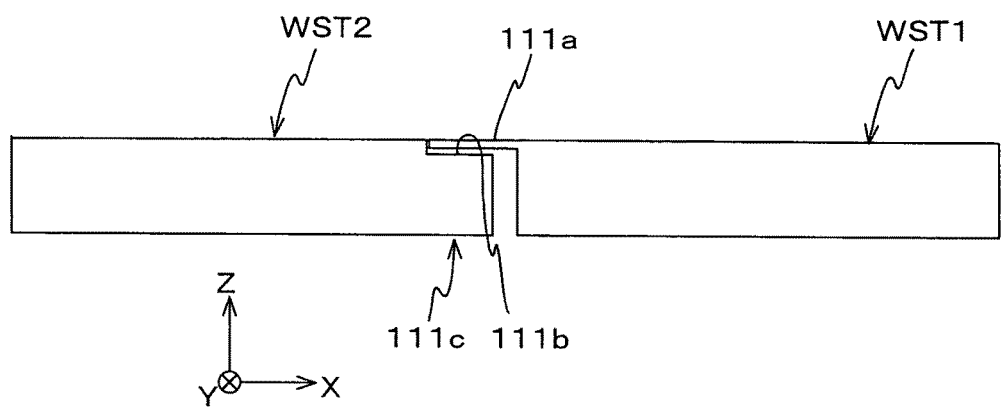
FIG. 24 is a view (No. 1) for describing a modified example of the fourth embodiment.

More specifically, for example, in the case of employing the stage unit configuration described in the first embodiment (refer to FIG. 2) or the second embodiment (refer to FIG. 12) above, because the positional relation of wafer stage WST1 and wafer stage WST2 in the X-axis direction does not change, the configuration can be employed in which canopy section 111*a* is formed in one of the wafer stages on one side in the X-axis direction and projected section 111*c* having a step section 111*b* made on its upper edge section is formed in the other wafer stage on the other side in the X-axis direction, as is shown in FIG. 24.

Figure 25A:
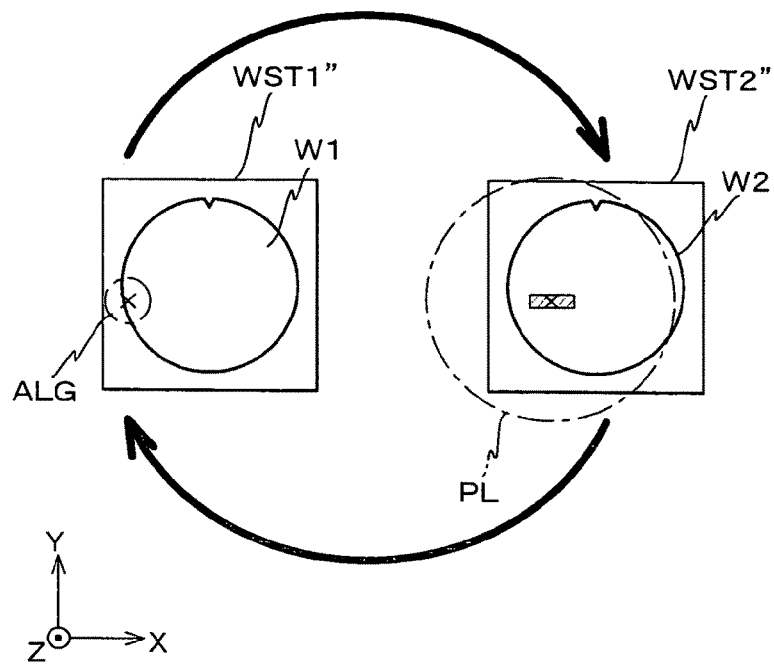
FIG. 25A is a view (No. 2) for describing a modified example of the fourth embodiment.
Figure 25B:
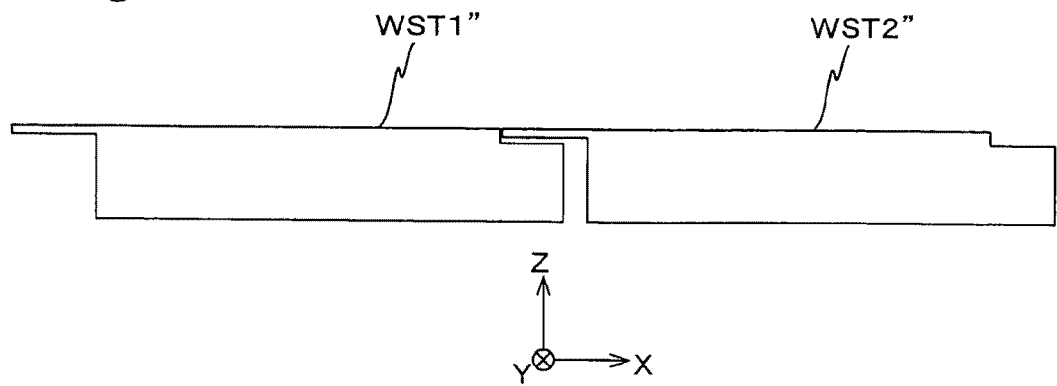
FIG. 25B is a view (No. 2) for describing a modified example of the fourth embodiment.

Further, for example, in the case of employing the stage unit whose positional relation of wafer stages WST1" and WST2" in the X-axis direction changes as is shown in FIG. 25A, the configuration has to be employed where both wafer stages WST1" and WST2" each have a canopy section and a projected section as is shown in FIG. 25B. By employing such a configuration, even in the case when wafer stage WST1" is at the −X side and wafer stage WST2" is at the +X side or the case when wafer stage WST1" is at the +X side and wafer stage WST2" is at the −X side, the transition from a state where the water is in contact with one of the wafer stages to a state where the wafer is in contact with the other stage in a state where the water leakage is suppressed can be performed, as in the fourth embodiment previously described.

In each of the embodiments described above, when the water held under tip lens 91 is moved from above one stage to above the other stage, the water supply and recovery can be stopped while the water is held under tip lens 91. Especially in the case when the water pressure increases due to the supply of water, it makes the water leak more easily from the gap of the two stages. Therefore, the water supply and recovery are preferably stopped.

In each of the embodiments described above, pure water (water) is used as the liquid, however, as a matter of course, the present invention is not limited to this. As the liquid, a liquid that is chemically stable, having high transmittance to illumination light IL and safe to use, such as a fluorine containing inert liquid may be used. As such as a fluorine-containing inert liquid, for example, Fluorinert (the brand name of 3M United States) can be used. The fluorine-containing inert liquid is also excellent from the point of cooling effect. Further, as the liquid, a liquid which has high transmittance to illumination light IL and a refractive index as high as possible, and furthermore, a liquid which is stable against the projection optical system and the photoresist coated on the surface of the wafer (for example, cedarwood oil or the like) can also be used. Further, in the case the $F_2$ laser is used as the light source, fombrin oil may be used as the fluorine containing liquid.

Further, in each of the embodiments above, the liquid that has been recovered may be reused. In this case, it is desirable to arrange a filter in the liquid recovery unit, in the recovery pipes, or the like for removing impurities from the liquid that has been recovered.

In each of the embodiments above, the optical element of projection optical system PL closest to the image plane side is tip lens 91. The optical element, however, is not limited to a lens, and it can be an optical plate (parallel plane plate) used for adjusting the optical properties of projection optical system PL such as aberration (such as spherical aberration, coma, or the like), or it can also simply be a cover glass. The surface of the optical element of projection optical system PL closest to the image plane side (tip lens 91 in the embodiments above) can be contaminated by coming into contact with the liquid (water, in the embodiments above) due to scattered particles generated from the resist by the irradiation of illumination light IL or adherence of impurities in the liquid. Therefore, the optical element is to be fixed freely detachable (exchangeable) to the lowest section of barrel 40, and can be exchanged periodically.

In such a case, when the optical element that comes into contact with the liquid is a lens, the cost for replacement parts is high, and the time required for exchange becomes long, which leads to an increase in the maintenance cost (running cost) as well as a decrease in throughput. Therefore, for example, the optical element that comes into contact with the liquid can be a parallel plane plate, which is less costly than lens 91.

Further, in each of the embodiments above, the range of the liquid (water) flow only has to be set so that it covers the entire projection area (the irradiation area of illumination light IL) of the pattern image of the reticle. Therefore, the size may be of any size; however, on controlling the flow speed, the flow amount and the like, it is preferable to keep the range slightly larger than the irradiation area but as small as possible.

Further, in each of the embodiments above, the case has been described where the present invention is applied to a scanning exposure apparatus by the step-and-scan method or the like. It is a matter of course, that the present invention is not limited to this, and more specifically, the present invention can also be applied to a projection exposure apparatus by the step-and-repeat method The usage of the exposure apparatus to which the present invention is applied is not limited to the exposure apparatus used for manufacturing semiconductor devices. For example, the present invention can be widely applied to an exposure apparatus for manufacturing liquid crystal displays which transfers a liquid crystal display device pattern onto a square shaped glass plate, and to an exposure apparatus for manufacturing organic EL, thin-film magnetic heads, imaging devices (such as CCDs), micromachines, DNA chips or the like. Further, the present invention can also be suitably applied to an exposure apparatus that transfers a circuit pattern onto a glass substrate or a silicon wafer not only when producing microdevices such as semiconductors, but also when producing a reticle or a mask used in exposure apparatus such as an optical exposure apparatus, an EUV exposure apparatus, an X-ray exposure apparatus, or an electron beam exposure apparatus.

Further, the light source of the exposure apparatus in the embodiment above is not limited to the ArF excimer laser, and a pulsed laser light source such as a KrF excimer laser or an $F_2$ laser, or an ultra high-pressure mercury lamp that generates a bright line such as the g-line (wavelength 436 nm) or the i-line (wavelength 365 nm) can also be used as the light source.

Further, a harmonic wave may also be used that is obtained by amplifying a single-wavelength laser beam in the infrared or visible range emitted by a DFB semiconductor laser or fiber laser, with a fiber amplifier doped with, for example, erbium (or both erbium and ytterbium), and by converting the wavelength into ultraviolet light using a nonlinear optical crystal. Further, the projection optical system is not limited to a reduction system, and the system may be either an equal magnifying system or a magnifying system.

Device Manufacturing Method

Next, an embodiment will be described of a device manufacturing method that uses the exposure apparatus described in each of the embodiments above in the lithography step.

Figure 26:
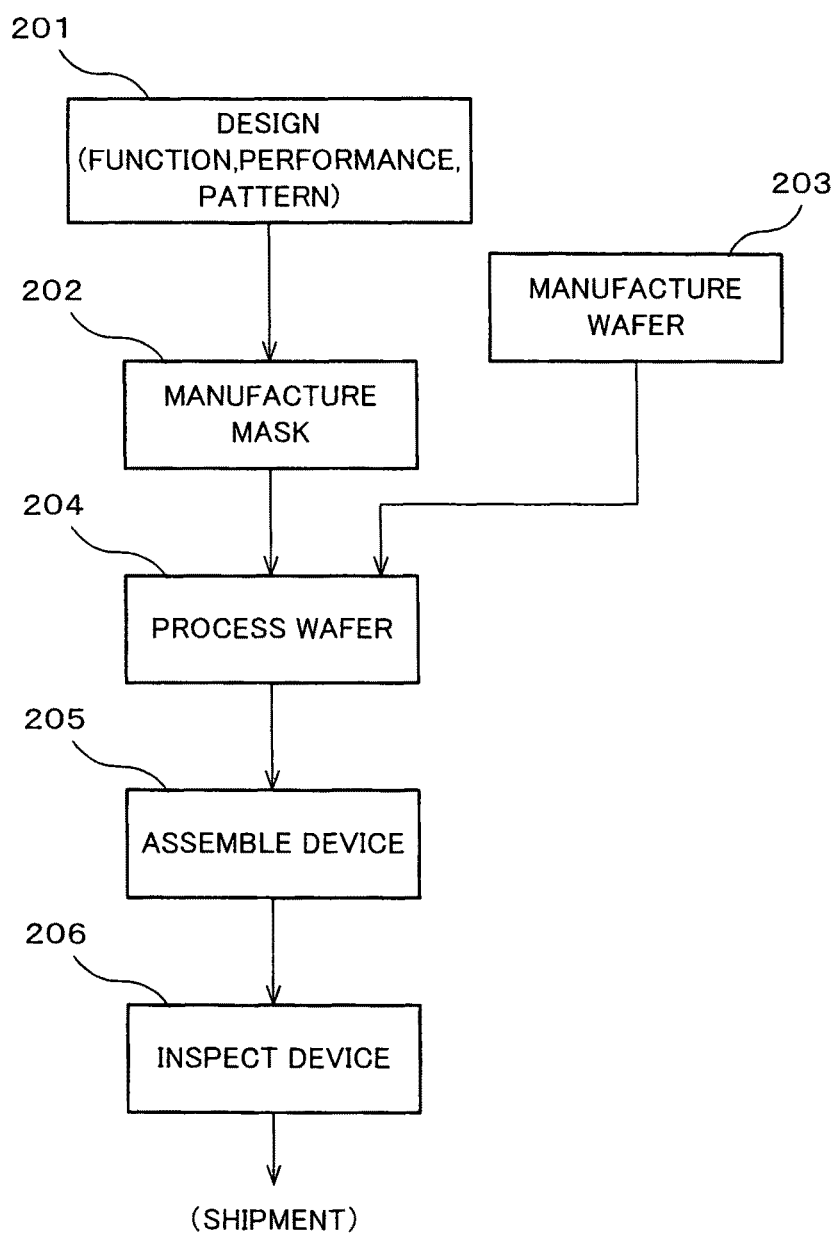
FIG. 26 is a flowchart used to explain a device manufacturing method related to the present invention.

FIG. 26 shows the flowchart of an example when manufacturing a device (a semiconductor chip such as an IC or an LSI, a liquid crystal panel, a CCD, a thin-film magnetic head, a micromachine, and the like). As shown in FIG. 26, in step 201 (design step), function and performance design of device (circuit design of semiconductor device, for example) is performed first, and pattern design to realize the function is performed. Then, in step 202 (mask manufacturing step), a mask on which the designed circuit pattern is formed is manufactured. Meanwhile, in step 203 (wafer manufacturing step), a wafer is manufactured using materials such as silicon.

Next, in step 204 (wafer processing step), the actual circuit and the like are formed on the wafer by lithography or the like in a manner that will be described later, using the mask and the wafer prepared in steps 201 to 203. Then, in step 205 (device assembly step), device assembly is performed using the wafer processed in step 204. Step 205 includes processes such as the dicing process, the bonding process, and the packaging process (chip encapsulation), and the like when necessary.

Finally, in step 206 (inspection step), tests on operation, durability, and the like are performed on the devices made in step 205. After these steps, the devices are completed and shipped out.

Figure 27:
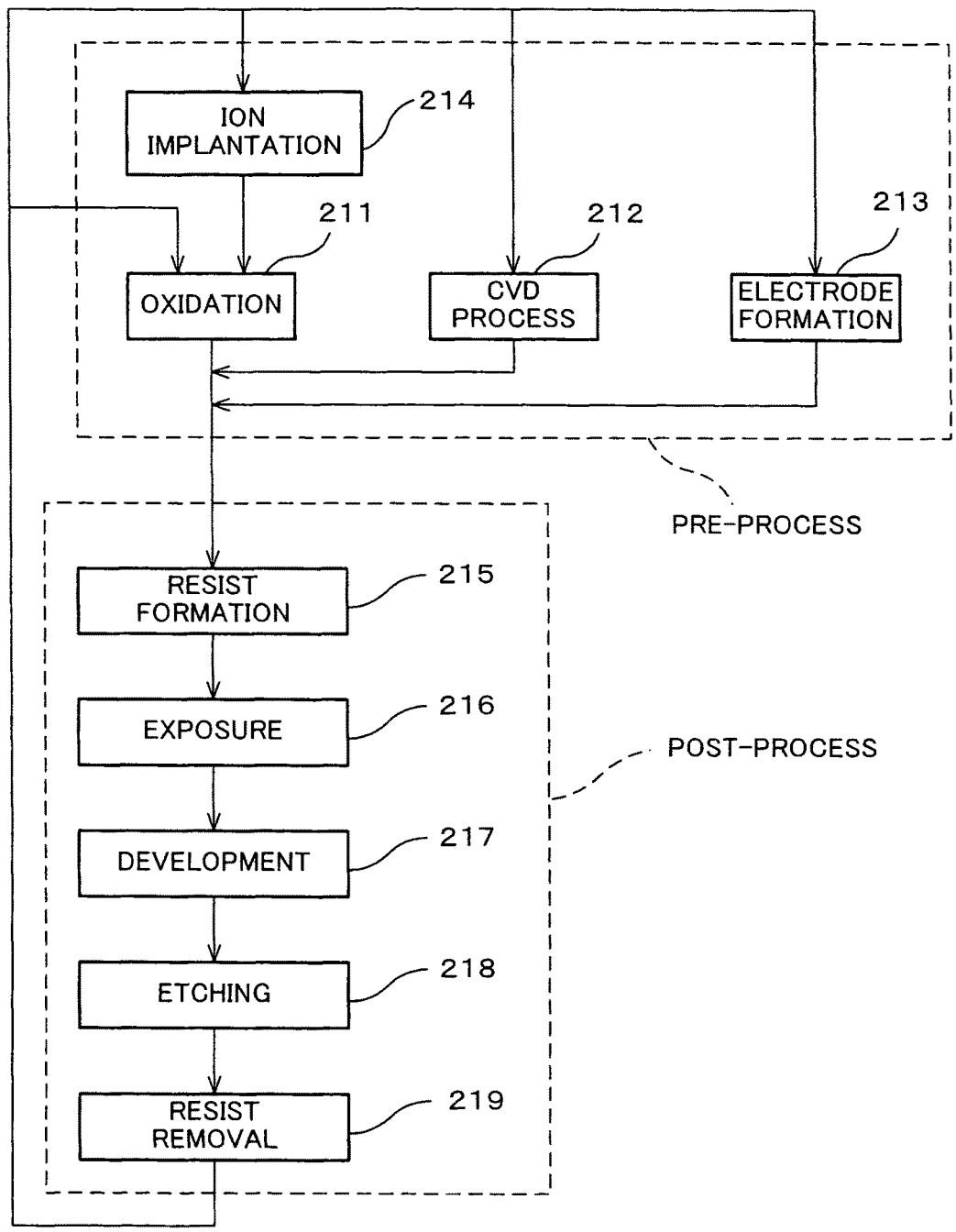
FIG. 27 is a flowchart showing a concrete example related to step 204 in FIG. 26.

FIG. 27 is a flow chart showing a detailed example of step 204 described above. Referring to FIG. 27, in step 211 (oxidation step), the surface of wafer is oxidized. In step 212 (CDV step), an insulating film is formed on the wafer surface. In step 213 (electrode formation step), an electrode is formed on the wafer by deposition. In step 214 (ion implantation step), ions are implanted into the wafer. Each of the above steps 211 to 214 constitutes the pre-process in each step of wafer processing, and the necessary processing is chosen and is executed at each stage.

When the above-described pre-process ends in each stage of wafer processing, post-process is executed as follows. In the post-process, first in step 215 (resist formation step), a photosensitive agent is coated on the wafer. Then, in step 216 (exposure step), the circuit pattern of the mask is transferred onto the wafer by the lithography system (exposure apparatus) and the exposure method of the embodiment above. Next, in step 217 (development step), the exposed wafer is developed, and in step 218 (etching step), an exposed member of an area other than the area where resist remains is removed by etching. Then, in step 219 (resist removing step), when etching is completed, the resist that is no longer necessary is removed.

By repeatedly performing the pre-process and the post-process, multiple circuit patterns are formed on the wafer.

When the device manufacturing method of the embodiment described so far is used, because a device pattern is formed on a wafer by exposing the wafer (substrate) with an energy beam (illumination light IL) using the exposure apparatus in each of the embodiments above in the exposure step (step 216), exposure with high throughput and high precision can be achieved for a long period of time. Accordingly, the productivity of high integration microdevices on which fine patterns are formed can be improved.

INDUSTRIAL APPLICABILITY

As is described above, the stage drive method of the present invention is suitable for driving the first stage and the second stage. Further, the exposure apparatus of the present invention is suitable for supplying liquid in the space between the projection optical system and the substrate and exposing the substrate with the energy beam via the projection optical system and the liquid. Further, the device manufacturing method of the present invention is suitable for producing microdevices.

What is claimed is:

1. An exposure apparatus that exposes a substrate with an energy beam via a projection optical system and a liquid, the apparatus comprising:
   a first stage that is capable of moving while the substrate is mounted thereon;
   a second stage that is capable of moving independently from the first stage, the second stage having a measuring member configured to detect the energy beam via the projection optical system and the liquid;
   a liquid immersion system configured to supply the liquid to form an immersion area below the projection optical system; and
   a drive system configured to replace one of the first stage and the second stage arranged opposite to the projection optical system with another of the first stage and the second stage by moving the first stage and the second stage relative to the immersion area below the projection optical system so as to transit from one of a first state and a second state to another of the first state and the second state, the first state being a state in which the immersion area is maintained between the projection optical system and the first stage, the second state being a state in which the immersion area is maintained between the projection optical system and the second stage,
   wherein the apparatus is configured such that, in a transition from the one of the first state and the second state to the other of the first state and the second state, the immersion area is maintained below the projection optical system, and
   wherein the apparatus is configured such that, in the exposure, the substrate is moved relative to the immersion area by the first stage.

2. The exposure apparatus according to claim 1, wherein the apparatus is configured to move the second stage in the second state so that the energy beam is irradiated onto the measuring member via the projection optical system and the immersion area for the detection.

3. The exposure apparatus according to claim 1, wherein the apparatus is configured to move the second stage such that, after the transition from the first state to the second state, the detection of the energy beam is performed.

4. The exposure apparatus according to claim 1, wherein the measuring member has a sensor at least a part of which is provided on the second stage and configured to allow the energy beam to enter.

5. The exposure apparatus according to claim 1, wherein the measuring member has a sensor of which a surface is arranged on an upper surface of the second stage.

6. The exposure apparatus according to claim 1, wherein the measuring member has a plurality of sensors which are arranged at different positions from each other on an upper surface of the second stage.

7. The exposure apparatus according to claim 1, wherein the measuring member is usable for at least one of a wavefront measurement, an illuminance measurement, an aerial image measurement, and an illuminance distribution measurement.

8. The exposure apparatus according to claim 1, wherein the second stage has a reference mark member different from the measuring member, onto which the energy beam is irradiated via the projection optical system and the immersion area.

9. The exposure apparatus according to claim 8, wherein the reference mark member is provided on the second stage so that a surface of the reference mark member is substantially flush with an upper surface of the second stage.

10. The exposure apparatus according to claim 1, wherein the second stage has no holder for holding the substrate.

11. The exposure apparatus according to claim 1, further comprising a detection system configured to detect a mark of a mask,
   wherein the first stage has a reference mark member onto which the energy beam is irradiated via the projection optical system and the immersion area, and of which a surface is substantially flush with an upper surface of the first stage, and
   the detection system is configured to detect the mark of the mask using the reference mark member.

12. The exposure apparatus according to claim 11,
wherein the apparatus is configured to move the first stage such that, after the transition from the second state to the first state and prior to start of the exposure for the substrate, the reference mark member of the first stage passes through a position below the projection optical system.

13. The exposure apparatus according to claim 11, further comprising a mark detecting system configured to detect a mark on the substrate,
wherein the apparatus is configured such that, prior to the transition from the second state to the first state, the mark detecting system detects the reference mark member of the first stage.

14. The exposure apparatus according to claim 1, further comprising a mark detecting system configured to detect a mark on the substrate,
wherein the apparatus is configured such that, prior to the transition from the second state to the first state, the mark detecting system detects the mark on the substrate via no liquid, and, after the transition, the substrate is exposed via the projection optical system and the liquid of the immersion area.

15. The exposure apparatus according to claim 13,
wherein the apparatus is configured such that, in the second state, an exchange of the substrate on the first stage after the exposure is performed and the mark on the substrate on the first stage after the exchange is detected by the mark detecting system.

16. The exposure apparatus according to claim 15,
wherein the apparatus is configured such that, in the second state, the detection of the energy beam by the measuring member is performed in parallel with the exchange of the substrate on the first stage.

17. The exposure apparatus according to claim 13,
wherein the apparatus is configured such that, in the transition from the first state to the second state, the substrate after exposure is mounted on the first stage, and
in the transition from the second state to the first state, the substrate after the detection of the mark by the mark detecting system is mounted on the first stage.

18. The exposure apparatus according to claim 1,
wherein the apparatus is configured such that, in the transition from the one of the first state and the second state to the other of the first state and the second state, the immersion area is maintained below the projection optical system by one of the first stage and the second stage or both the first and second stages.

19. The exposure apparatus according to claim 1,
wherein the first stage and the second stage have side surfaces respectively, the side surfaces being arranged to face each other in the movement of the first stage and the second stage in both operations of the transition from the first state to the second state and of the transition from the second state to the first state.

20. The exposure apparatus according to claim 1,
wherein the first stage has a mount area of a substrate, a peripheral area around the mount area, and a reference mark member, the peripheral area having a surface that is substantially flush with a surface of the substrate mounted on the mount area, the reference mark member having a surface that is substantially flush with the surface of the peripheral area.

21. The exposure apparatus according to claim 1,
wherein the first stage has a mount area of a substrate, a reference mark member, and an auxiliary member configured to define an upper surface of the first stage that has a first opening in which the mount area is arranged and a second opening in which the reference mark member is arranged.

22. The exposure apparatus according to claim 1,
wherein the apparatus is configured such that, prior to the transition, the one of the first stage and the second stage is arranged opposite to the projection optical system and the first stage and the second stage are relatively moved so that the other of the first stage and the second stage comes close to the one of the first stage and the second stage, and, in the transition, the first stage and the second stage are moved relative to the immersion area.

23. The exposure apparatus according to claim 1,
wherein the apparatus is configured such that, in the transition, the first stage and the second stage are in a close or contact state with respect to a predetermined direction while moving in the predetermined direction.

24. The exposure apparatus according to claim 23,
wherein the apparatus is configured such that the first stage and the second stage are moved while a positional relation between the first stage and the second stage in the predetermined direction is substantially maintained.

25. The exposure apparatus according to claim 1,
wherein the apparatus is configured such that, prior to the transition, the one of the first stage and the second stage is arranged opposite to the projection optical system and the first stage and the second stage are relatively moved so that adjustment of a positional relation between the first stage and the second stage in a direction orthogonal to a predetermined direction in which the first stage and the second stage are moved relative to the immersion area in the transition is performed.

26. The exposure apparatus according to claim 1,
wherein the apparatus is configured such that the first stage and the second stage are moved relative to the immersion area in a close or contact state so as to maintain the immersion area below the projection optical system or to prevent or suppress the liquid from spilling.

27. The exposure apparatus according to claim 1,
wherein the apparatus is configured such that scanning exposure is performed on the substrate and the first stage and the second stage are moved relative to the immersion area in a predetermined direction orthogonal to a direction in which the first stage is moved in the scanning exposure.

28. The exposure apparatus according to claim 1, further comprising a
mark detecting system configured to detect a mark on the substrate which is placed apart from the projection optical system in a predetermined direction in which the first stage and the second stage are moved relative to the immersion area in the transition.

29. The exposure apparatus according to claim 1,
wherein the apparatus is configured such that an exchange operation of the substrate on the first stage is performed at a position apart from the projection optical system in a predetermined direction in which the first stage and the second stage are moved relative to the immersion area in the transition.

30. The exposure apparatus according to claim 1,
wherein the apparatus is configured such that the first stage is moved between a first area in which the projection optical system is located and a second area of which a position is different from that of the first area in a predetermined direction in which the first stage and the second stage are moved relative to the immersion area in the transition.

31. The exposure apparatus according to claim 1, further comprising a suppressive member, at least a part of which is positionable in, or so as to overhang, a gap between the first stage and the second stage in the transition to suppress the liquid from leaking via the gap.

32. The exposure apparatus according to claim 31, wherein the suppressive member is disposed between the first stage and the second stage in the transition.

33. The exposure apparatus according to claim 31, wherein the apparatus is configured such that the suppressive member is provided on at least one of the first stage and the second stage in the transition.

34. The exposure apparatus according to claim 31, wherein the suppressive member is attachable and detachable with respect to at least one of the first stage and the second stage.

35. The exposure apparatus according to claim 31, wherein the suppressive member has a surface at least a part of which is arranged between the first stage and the second stage and faces the projection optical system in the transition so that the immersion area is moved from the one of the first stage and the second stage to the other of the first stage and the second stage via the suppressive member.

36. The exposure apparatus according to claim 31, wherein the suppressive member has a surface that is substantially flush with a surface of each of the first stage and the second stage in the transition.

37. The exposure apparatus according to claim 31, wherein the suppressive member has a bridge member that is configured to cover the gap between the first stage and the second stage, and
wherein the apparatus is configured such that the immersion area is moved from the one of the first stage and the second stage to the other of the first stage and the second stage via the suppressive member while being maintained below the projection optical system in the transition from the one of the first stage and the second state to the other of the first state and the second state.

38. The exposure apparatus according to claim 31, wherein the suppressive member has a protruding portion that is disposed adjacent to a surface of at least one of the first stage and the second stage and that protrudes outward from a side surface of the at least one of the first stage and the second stage.

39. The exposure apparatus according to claim 31, wherein the suppressive member has at least one of a sealing member and a liquid repellent coating.

40. A device manufacturing method including a lithography process, wherein in the lithography process, a device pattern is transferred onto a substrate using the exposure apparatus according to claim 1.

41. An exposure method of exposing a substrate with an energy beam via a projection optical system and a liquid, the method comprising:
providing a first stage and a second stage, the first stage being capable of moving while the substrate is mounted thereon, the second stage being capable of moving independently from the first stage, the second stage having a measuring member configured to detect the energy beam via the projection optical system and the liquid;
exposing the substrate via the projection optical system and the liquid, the liquid being supplied to form an immersion area below the projection optical system, the substrate being mounted on the first stage;
replacing one of the first stage and the second stage arranged opposite to the projection optical system with another of the first stage and the second stage by moving the first stage and the second stage relative to the immersion area below the projection optical system so as to transit from one of a first state and a second state to another of the first state and the second state, the first state being a state in which the immersion area is maintained between the projection optical system and the first stage, the second state being a state in which the immersion area is maintained between the projection optical system and the second stage,
wherein, in a transition from the one of the first state and the second state to the other of the first state and the second state, the immersion area is maintained below the projection optical system, and
wherein, in the exposure, the substrate is moved relative to the immersion area by the first stage.

42. The exposure method according to claim 41, wherein the second stage is moved in the second state so that the energy beam is irradiated onto the measuring member via the projection optical system and the immersion area for the detection.

43. The exposure method according to claim 41, wherein the second stage is moved such that, after the transition from the first state to the second state, the detection of the energy beam is performed.

44. The exposure method according to claim 41, wherein the measuring member has a sensor at least a part of which is provided on the second stage and into which the energy beam enters.

45. The exposure method according to claim 41, wherein the measuring member has a sensor of which a surface is arranged on an upper surface of the second stage.

46. The exposure method according to claim 41, wherein the measuring member has a plurality of sensors which are arranged at different positions from each other on an upper surface of the second stage.

47. The exposure method according to claim 41, wherein the measuring member is usable for at least one of a wavefront measurement, an illuminance measurement, an aerial image measurement, and an illuminance distribution measurement.

48. The exposure method according to claim 41, wherein the second stage has a reference mark member different from the measuring member, onto which the energy beam is irradiated via the projection optical system and the immersion area.

49. The exposure method according to claim 48, wherein the reference mark member is provided on the second stage so that a surface of the reference mark member is substantially flush with an upper surface of the second stage.

50. The exposure method according to claim 41, wherein the second stage has no holder for holding the substrate.

51. The exposure method according to claim 41, wherein the first stage has a reference mark member onto which the energy beam is irradiated via the projection optical system and the immersion area, and of which a surface is substantially flush with an upper surface of the first stage, and
wherein a mark of a mask is detected by using the reference mark member.

52. The exposure method according to claim 41, wherein the first stage is moved such that, after the transition from the second state to the first state and prior to start of the exposure for the substrate, the reference mark member of the first stage passes through a position below the projection optical system.

53. The exposure method according to claim 41,
wherein, prior to the transition from the second state to the first state, the reference mark member of the first stage is detected by a mark detecting system.

54. The exposure method according to claim 41,
wherein, prior to the transition from the second state to the first state, the mark on the substrate is detected via no liquid, and after the transition, the substrate is exposed via the liquid.

55. The exposure method according to claim 53,
wherein, in the second state, an exchange of the substrate on the first stage after the exposure is performed and the mark on the substrate on the first stage after the exchange is detected by a mark detecting system.

56. The exposure method according to claim 55,
wherein, in the second state, the detection of the energy beam by the measuring member is performed in parallel with the exchange of the substrate on the first stage.

57. The exposure method according to claim 53,
wherein, in the transition from the first state to the second state, the substrate after exposure is mounted on the first stage, and in the transition from the second state to the first state, the substrate after the detection of the mark by the mark detecting system is mounted on the first stage.

58. The exposure method according to claim 41,
wherein, in the transition from the one of the first state and the second state to the other of the first state and the second state, the immersion area is maintained just the projection optical system by one of the first stage and the second stage or both the first stage and the second stage.

59. The exposure method according to claim 41,
wherein the first stage and the second stage have side surfaces respectively, the side surfaces facing each other in the movement of the first stage and the second stage in both operations of the transition from the first state to the second state and of the transition from the second state to the first state.

60. The exposure method according to claim 41,
wherein the first stage has a mount area of a substrate, a peripheral area around the mount area, and a reference mark member, the peripheral area having a surface that is substantially flush with a surface of the substrate mounted on the mount area, the reference mark member having a surface that is substantially flush with the surface of the peripheral area.

61. The exposure method according to claim 41,
wherein the first stage has a mount area of a substrate, a reference mark member, and an auxiliary member configured to define an upper surface of the first stage that has a first opening in which the mount area is arranged and a second opening in which the reference mark member is arranged.

62. The exposure method according to claim 41,
wherein, prior to the transition, the one of the first stage and the second stage is arranged opposite to the projection optical system and the first stage and the second stage are relatively moved so that the other of the first stage and the second stage comes close to the one of the first state and the second stage, and, in the transition, the first stage and the second stage are moved relative to the immersion area.

63. The exposure method according to claim 41,
wherein, in the transition, the first stage and the second stage are in a close or contact state with respect to a predetermined direction while moving in the predetermined direction.

64. The exposure method according to claim 63,
wherein the first stage and the second stage are moved while a positional relation between the first stage and the second stage in the predetermined direction is substantially maintained.

65. The exposure method according to claim 41,
wherein, prior to the transition, the one of the first stage and the second stage is arranged opposite to the projection optical system and the first stage and the second stage are relatively moved so that adjustment of a positional relation between the first stage and the second stage in a direction orthogonal to a predetermined direction in which the first stage and the second stage are moved relative to the immersion area in the transition is performed.

66. The exposure method according to claim 41,
wherein the first stage and the second stage are moved relative to the immersion area in a close or contact state so as to maintain the immersion area below the projection optical system or to prevent or suppress the liquid from spilling.

67. The exposure method according to claim 41,
wherein scanning exposure is performed on the substrate, and the first stage and the second stage are moved relative to the immersion area in a predetermined direction orthogonal to a direction in which the first stage is moved in the scanning exposure.

68. The exposure method according to claim 41,
wherein, prior to the transition from the second state to the first state, a mark on the substrate that is to be mounted on the first stage is detected by a mark detecting system that is placed apart from the projection optical system in the predetermined direction in which the first stage and the second stage are moved relative to the immersion area in the transition.

69. The exposure method according to claim 41,
wherein an exchange operation of the substrate on the first stage is performed at a position apart from the projection optical system in a predetermined direction in which the first stage and the second stage are moved relative to the immersion area in the transition.

70. The exposure method according to claim 41,
wherein the first stage is moved between a first area in which the projection optical system is located and a second area of which a position is different from that of the first area in a predetermined direction in which the first stage and the second stage are moved relative to the immersion area in the transition.

71. The exposure method according to claim 41,
wherein a gap is formed between the first stage and the second stage in the transition, the gap being dimensioned such that the liquid is suppressed from leaking.

72. The exposure method according to claim 41,
wherein a suppressive member is disposed substantially between the first stage and the second stage in the transition such that the liquid is suppressed from leaking.

73. The exposure method according to claim 41,
wherein a suppressive member is provided on at least one of the first stage and the second stage in the transition such that the liquid is suppressed from leaking.

74. The exposure method according to claim 41,
wherein a suppressive member is attachable and detachable with respect to at least one of the first stage and the second stage such that the liquid is suppressed from leaking.

75. The exposure method according to claim 41,
wherein a suppressive member is provided, the suppressive member having a surface at least a part of which is arranged between the first stage and the second stage and faces the projection optical system in the transition so that the immersion area is moved from the one of the first stage and the second stage to the other of the first stage and the second stage via the suppressive member.

76. The exposure method according to claim 41,
wherein a suppressive member is provided such that the liquid is suppressed from leaking, the suppressive member having a surface that is substantially flush with a surface of each of the first stage and the second stage in the transition.

77. The exposure method according to claim 41,
wherein the immersion area is moved from the one of the first stage and the second stage to the other of the first stage and the second stage via a bridge member as a suppressive member while being maintained below the projection optical system in the transition from the one of the first state and the second state to the other of the first state and the second state, the bridge member covering a gap between the first stage and the second stage.

78. The exposure method according to claim 41,
wherein a suppressive member is disposed adjacent to a surface of at least one of the first stage and the second stage and protrudes outward from a side surface of the at least one of the first stage and the second stage such that the liquid is suppressed from leaking.

79. The exposure method according to claim 41,
wherein a suppressive member is provided such that the liquid is suppressed from leaking, the suppressive member having at least one of a sealing member and a liquid repellent coating.

80. The exposure method according to claim 41,
wherein, in the transition, the liquid is suppressed from leaking via a gap between the first stage and the second stage by a suppressive member, at least a part of which is positionable in, or so as to overhang, the gap.

81. A device manufacturing method including a lithography process, wherein
in the lithography process, a device pattern is transferred onto a substrate using the exposure method according to claim 41.

\* \* \* \* \*